US012777672B2

(12) United States Patent
Hsiung et al.

(10) Patent No.: US 12,777,672 B2
**(45) Date of Patent: *Oct. 27, 2026**

(54) ETCH PROFILE CONTROL OF VIA OPENING

(71) Applicant: TAIWAN SEMICONDUCTOR MANUFACTURING COMPANY, LTD., Hsinchu (TW)

(72) Inventors: Te-Chih Hsiung, Taipei City (TW); Yi-Chun Chang, Hsinchu City (TW); Yi-Chen Wang, Hsinchu County (TW); Yuan-Tien Tu, Chiayi County (TW); Huan-Just Lin, Hsinchu City (TW); Jyun-De Wu, New Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 364 days.

This patent is subject to a terminal disclaimer.

(21) Appl. No.: 18/352,640

(22) Filed: Jul. 14, 2023

(65) Prior Publication Data

US 2023/0361185 A1 Nov. 9, 2023

Related U.S. Application Data

(62) Division of application No. 17/169,458, filed on Feb. 6, 2021, now Pat. No. 11,749,732.

(Continued)

(51) Int. Cl.

*H10D 30/62* (2025.01)
*H10D 30/01* (2025.01)

(Continued)

(52) U.S. Cl.

CPC ....... *H10D 30/6219* (2025.01); *H10D 30/024* (2025.01); *H10D 30/62* (2025.01);

(Continued)

(58) Field of Classification Search

CPC ............. H10D 84/0135; H10D 64/015; H10D 64/021; H10D 30/6219; H10D 84/0186;

(Continued)

(56) References Cited

U.S. PATENT DOCUMENTS

| | | | |
|---|---|---|---|
| 9,105,490 | B2 | 8/2015 | Wang et al. |
| 9,236,267 | B2 | 1/2016 | De et al. |

(Continued)

FOREIGN PATENT DOCUMENTS

| | | | |
|---|---|---|---|
| CN | 104658962 | A | 5/2015 |
| CN | 105390441 | A | 3/2016 |

(Continued)

*Primary Examiner* — Tuan A Hoang

(74) *Attorney, Agent, or Firm* — Maschoff Brennan

(57) ABSTRACT

A device comprises a source/drain contact over a source/drain region of a transistor, an etch stop layer above the source/drain contact, an interlayer dielectric (ILD) layer above the etch stop layer, and a source/drain via extending through the ILD layer and the etch stop layer to the source/drain contact. The etch stop layer has an oxidized region in contact with the source/drain via and separated from the source/drain contact.

20 Claims, 63 Drawing Sheets

100

Related U.S. Application Data

(60) Provisional application No. 63/084,968, filed on Sep. 29, 2020.

(51) Int. Cl.

| | |
|---|---|
| ***H10D 30/67*** | (2025.01) |
| ***H10D 84/01*** | (2025.01) |
| ***H10D 84/03*** | (2025.01) |
| ***H10W 20/00*** | (2026.01) |
| ***H10W 20/42*** | (2026.01) |

(52) U.S. Cl.

CPC ..... *H10D 30/6735* (2025.01); *H10D 30/6757* (2025.01); *H10D 84/0149* (2025.01); *H10D 84/038* (2025.01); *H10W 20/056* (2026.01); *H10W 20/081* (2026.01); *H10W 20/096* (2026.01); *H10W 20/42* (2026.01)

(58) Field of Classification Search

CPC . H10W 20/056; H10W 20/081; H10W 20/42; H10W 20/077

See application file for complete search history.

(56) References Cited

U.S. PATENT DOCUMENTS

| | | | | |
|---|---|---|---|---|
| 9,236,300 | B2 | 1/2016 | Liaw | |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,831,183 | B2 | 11/2017 | Lin et al. | |
| 9,859,386 | B2 | 1/2018 | Ho et al. | |
| 10,083,863 | B1 * | 9/2018 | Hsieh | H10D 30/024 |
| 2005/0153538 | A1 | 7/2005 | Tsai et al. | |
| 2006/0084275 | A1 * | 4/2006 | You | H10D 1/042 257/E21.252 |
| 2007/0117312 | A1 | 5/2007 | Nam | |
| 2007/0269721 | A1 | 11/2007 | Kim et al. | |
| 2009/0075480 | A1 | 3/2009 | Matz et al. | |
| 2009/0137127 | A1 | 5/2009 | Hoshi et al. | |
| 2013/0320544 | A1 | 12/2013 | Lin et al. | |
| 2016/0049336 | A1 | 2/2016 | Han et al. | |
| 2016/0111325 | A1 * | 4/2016 | JangJian | H10W 20/056 257/774 |
| 2019/0011529 | A1 | 1/2019 | Choi et al. | |
| 2019/0131430 | A1 * | 5/2019 | Xie | H10D 30/024 |
| 2022/0102202 | A1 | 3/2022 | Hsiung et al. | |
| 2025/0366018 | A1 * | 11/2025 | Hsiung | H10D 30/6219 |

FOREIGN PATENT DOCUMENTS

| | | | |
|---|---|---|---|
| CN | 108573999 | A | 9/2018 |
| JP | 2010087233 | A | 4/2010 |
| KR | 101776387 | B1 | 9/2017 |
| TW | 201616568 | A | 5/2016 |

* cited by examiner

100

100a

200

200a

ETCH PROFILE CONTROL OF VIA OPENING

PRIORITY CLAIM AND CROSS-REFERENCE

This application is a Divisional Application of the U.S. application Ser. No. 17/169,458, filed Feb. 6, 2021, which claims priority to U.S. Provisional Application Ser. No. 63/084,968, filed Sep. 29, 2020, all of which are herein incorporated by reference in their entirety.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
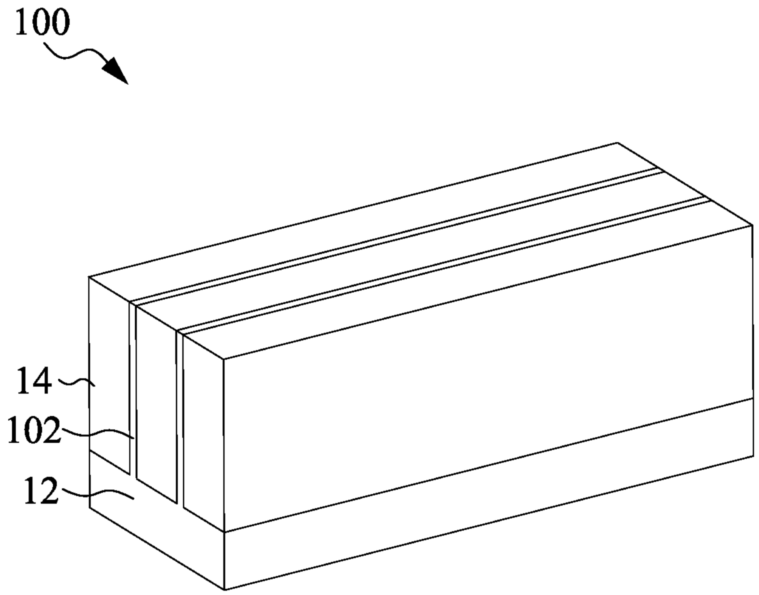
FIGS. 1-20B illustrate perspective views and cross-sectional views of intermediate stages in the formation of an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit structures and methods of forming the same, and more particularly to fabricating transistors (e.g., fin field-effect transistors (FinFETs), gate-all-around (GAA) transistors) and source/drain vias over source/drain contacts of the transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFETs, on account of their fin-like structure. A FinFET has a gate structure formed on three sides of a channel region (e.g., wrapping around an upper portion of a channel region in a semiconductor fin). Also presented herein are embodiments of a type of multi-gate transistor referred to as a GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration.

After a front-end-of-line (FEOL) processing for fabricating transistors is completed, source/drain contacts are formed over source/drain regions of the transistors. Source/drain vias are then formed over the source/drain contacts to electrically connecting the source/drain contacts to subsequently formed interconnect metal lines. Formation of the source/drain vias generally includes depositing an interlayer dielectric (ILD) layer over the source/rain contacts, forming via openings extending through the ILD layer by using anisotropic etching, and then depositing one or more metal layers in the via openings to serve as the source/drain vias. In order to prevent over-etching the source/drain contacts during the anisotropic etching process, an additional etch stop layer (also called middle contact etch stop layer (MCESL)) is formed over the source/drain contacts prior to formation of the ILD layer. The MCESL has a different etch selectivity than the ILD layer, and thus the MCESL can slow down the etching process of forming via openings, which in turn prevents over-etching the source/drain contacts.

After the via openings are etched through the ILD layer, another etching process (sometimes called liner removal (LRM) etching because the MCESL may serve as a liner lining top surfaces of source/drain contacts) is performed to break through the MCESL. However, the LRM etching may result in lateral etching in the MCESL. This is because the etching duration time of LRM etching is controlled to allow sufficient etching amount that can break through the MCESL in every targeted location throughout the wafer. However, the lateral etching expands lateral dimensions of the via openings in the MCESL, resulting in bowing profile in the via openings in the MCESL, which in turn may lead to increased risk of resulting in a leakage current (e.g., leakage current from source/drain via to gate contact and/or gate structure). Therefore, the present disclosure in various embodiments provides an additional plasma treatment for MCESL sidewall oxidation. Because the MCESL sidewall oxidation creates an oxidized region in the MCESL with a different material composition and hence a different etch selectivity than the un-oxidized region in the MCESL, the oxidized region in the MCESL allows for inhibiting or slowing down the lateral etching during breaking through the MCESL, which in turn reduces the risk of leakage current.

FIGS. 1 through 20B illustrate perspective views and cross-sectional views of intermediate stages in the formation of an integrated circuit structure 100 in accordance with some embodiments of the present disclosure. The formed transistors may include a p-type transistor (such as a p-type FinFET) and an n-type transistor (such as an n-type FinFET) in accordance with some exemplary embodiments. Throughout the various views and illustrative embodiments, like reference numbers are used to designate like elements. It is understood that additional operations can be provided before, during, and after the processes shown by FIGS. 1-20B, and some of the operations described below can be replaced or eliminated, for additional embodiments of the method. The order of the operations/processes may be interchangeable.

FIG. 1 illustrates a perspective view of an initial structure. The initial structure includes a substrate 12. The substrate 12 may be a semiconductor substrate (also called wafer in some embodiments), which may be a silicon substrate, a silicon germanium substrate, or a substrate formed of other semiconductor materials. In accordance with some embodiments of the present disclosure, the substrate 12 includes a bulk silicon substrate and an epitaxy silicon germanium (SiGe) layer or a germanium layer (without silicon therein) over the bulk silicon substrate. The substrate 12 may be doped with a p-type or an n-type impurity. Isolation regions 14 such as shallow trench isolation (STI) regions may be formed to extend into the substrate 12. The portions of substrate 12 between neighboring STI regions 14 are referred to as semiconductor strips 102.

STI regions 14 may include a liner oxide (not shown). The liner oxide may be formed of a thermal oxide formed through a thermal oxidation of a surface layer of substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 14 may also include a dielectric material over the liner oxide, and the dielectric material may be formed using flowable chemical vapor deposition (FCVD), spin-on coating, or the like.

Figure 2:
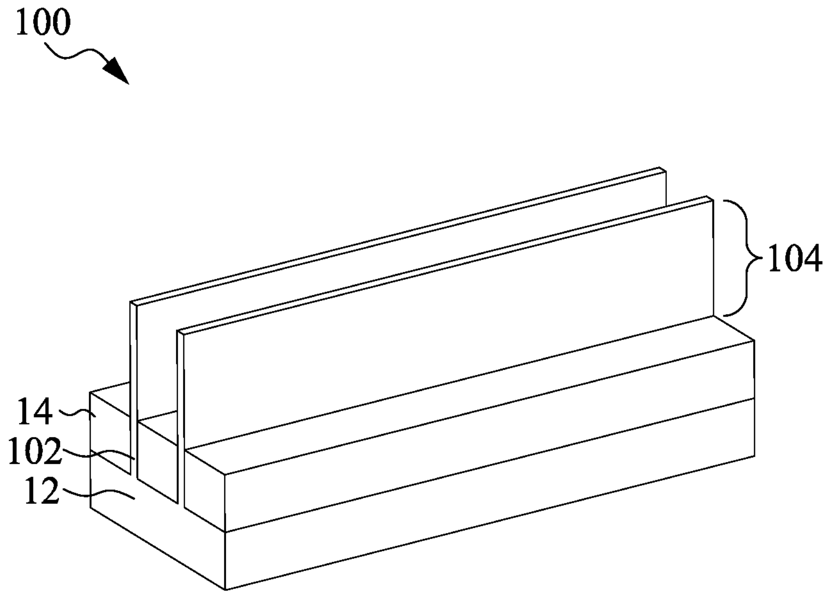

Referring to FIG. 2, the STI regions 14 are recessed, so that the top portions of semiconductor strips 102 protrude higher than the top surfaces of the neighboring STI regions 14 to form protruding fins 104. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the STI regions 14 is performed using a wet etch process. The etching chemical may include diluted HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 104 may also be replaced with materials different from that of substrate 12. For example, if the protruding fins 104 serve for n-type transistors, protruding fins 104 may be formed of Si, SiP, SiC, SiPC, or a III-V compound semiconductor such as InP, GaAs, AlAs, InAs, InAlAs, InGaAs, or the like. On the other hand, if the protruding fins 104 serve for p-type transistors, the protruding fins 104 may be formed of Si, SiGe, SiGeB, Ge, or a III-V compound semiconductor such as InSb, GaSb, InGaSb, or the like.

Figure 3A:
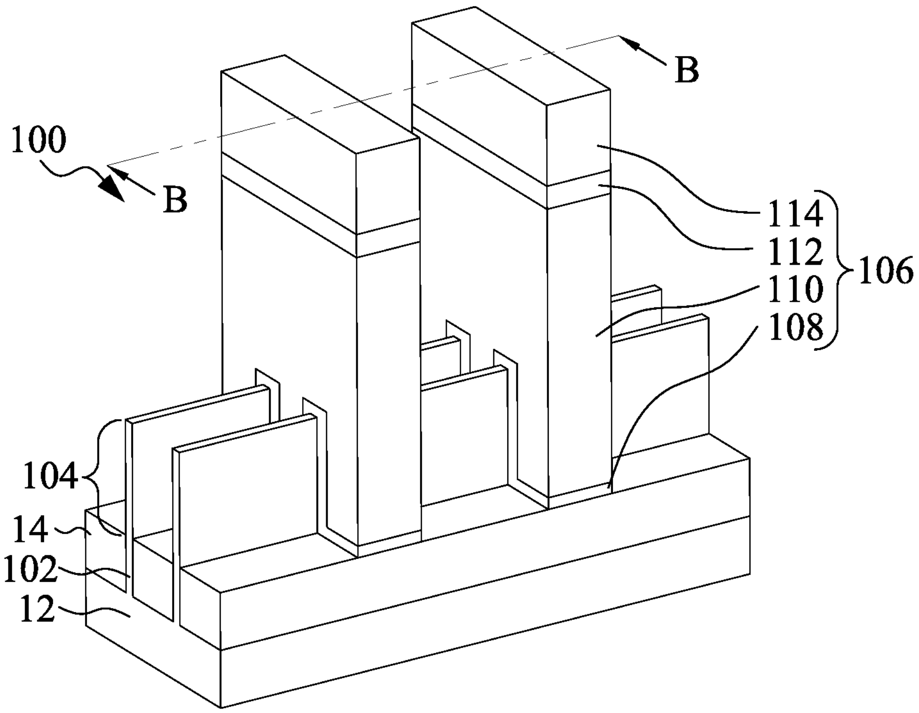
Figure 3B:
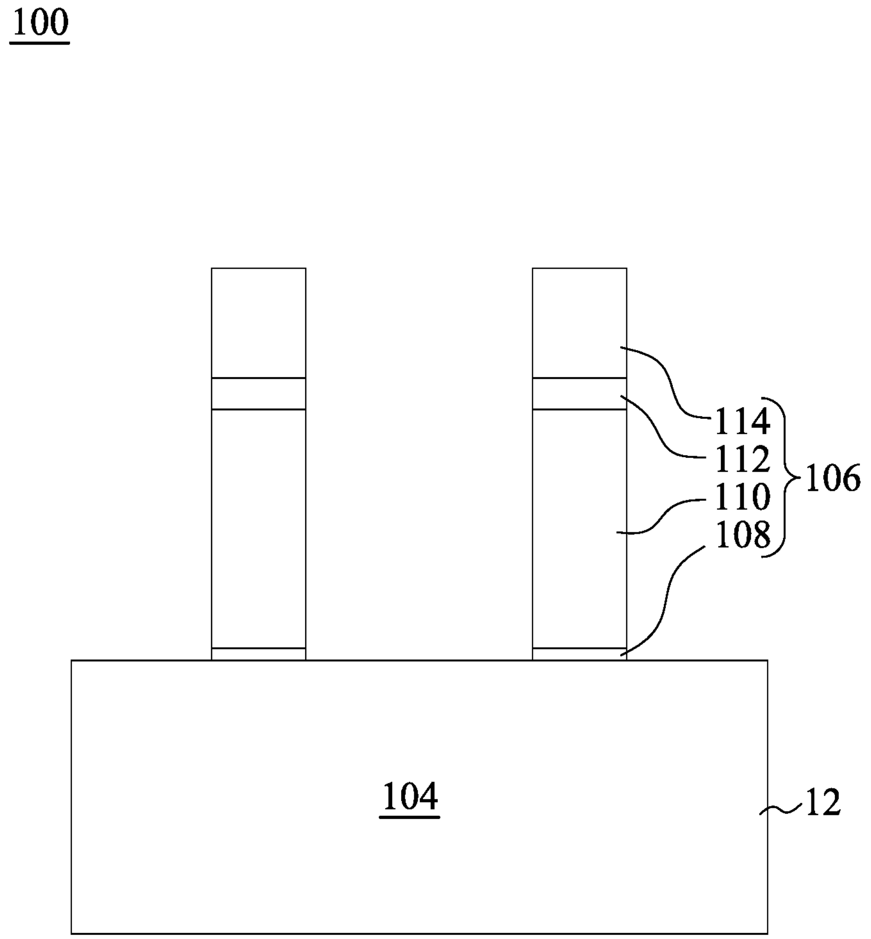

Referring to FIGS. 3A and 3B, dummy gate structures 106 are formed on the top surfaces and the sidewalls of protruding fins 104. FIG. 3B illustrates a cross-sectional view obtained from a vertical plane containing line B-B in FIG. 3A. Formation of the dummy gate structures 106 includes depositing in sequence a gate dielectric layer and a dummy gate electrode layer across the fins 104, followed by patterning the gate dielectric layer and the dummy gate electrode layer. As a result of the patterning, the dummy gate structure 106 includes a gate dielectric layer 108 and a dummy gate electrode 110 over the gate dielectric layer 108. The gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 110 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 106 crosses over a single one or a plurality of protruding fins 104. Dummy gate structures 106 may have lengthwise directions perpendicular to the lengthwise directions of the respective protruding fins 104.

A mask pattern may be formed over the dummy gate electrode layer to aid in the patterning. In some embodiments, a hard mask pattern including bottom masks 112 over a blanket layer of polysilicon and top masks 114 over the bottom masks 112. The hard mask pattern is made of one or more layers of $SiO_2$, SiCN, SiON, $Al_2O_3$, SiN, or other suitable materials. In certain embodiments, the bottom masks 112 include silicon nitride, and the top masks 114 include silicon oxide. By using the mask pattern as an etching mask, the dummy electrode layer is patterned into the dummy gate electrodes 110, and the blanket gate dielectric layer is patterned into the gate dielectric layers 108.

Figure 4:
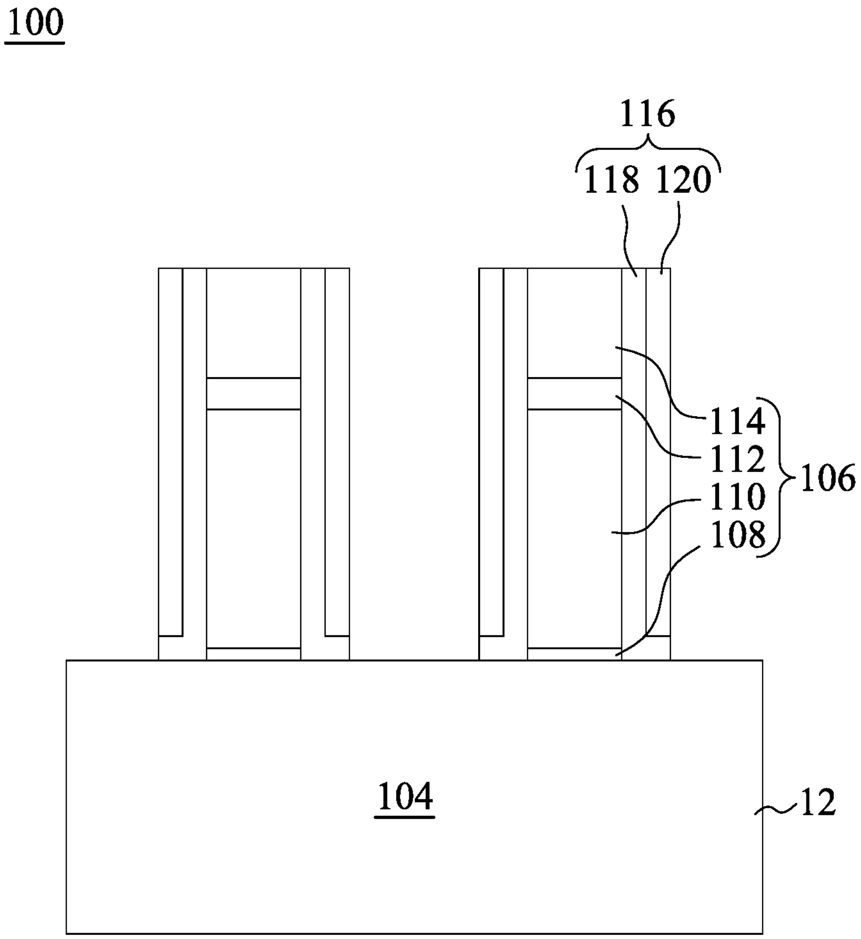

Next, as illustrated in FIG. 4, gate spacers 116 formed on sidewalls of the dummy gate structures 106. In some embodiments of the gate spacer formation step, a spacer material layer is deposited on the substrate 12. The spacer material layer may be a conformal layer that is subsequently etched back to form gate sidewall spacers 116. In some embodiments, the spacer material layer includes multiple layers, such as a first spacer layer 118 and a second spacer layer 120 formed over the first spacer layer 118. The first and second spacer layers 118 and 120 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 118 and 120 may be formed by depositing in sequence two different dielectric materials over the dummy gate structures 106 using processes such as, CVD process, a subatmospheric CVD (SACVD) process, a flowable CVD process, an ALD process, a PVD process, or other suitable process. An anisotropic etching process is then performed on the deposited spacer layers 118 and 120 to expose portions of the fins 104 not covered by the dummy gate structures 106 (e.g., in source/drain regions of the fins 104). Portions of the spacer layers 118 and 120 directly above the dummy gate structures 106 may be completely removed by this anisotropic etching process. Portions of the spacer layer 118 and 120 on sidewalls of the dummy gate structures 106 may remain, forming gate sidewall spacers, which are denoted as the gate spacers 116, for the sake of simplicity. In some embodiments, the first spacer layer 118 is formed of silicon oxide that has a lower dielectric constant than silicon nitride, and the second spacer layer 120 is formed of silicon nitride that has a higher etch resistance against subsequent etching processing (e.g., etching source/drain recesses in the fin 104) than silicon oxide. In some embodiments, the gate sidewall spacers 116 may be used to offset subsequently formed doped regions, such as source/drain regions. The gate spacers 116 may further be used for designing or modifying the source/drain region profile.

Figure 5:
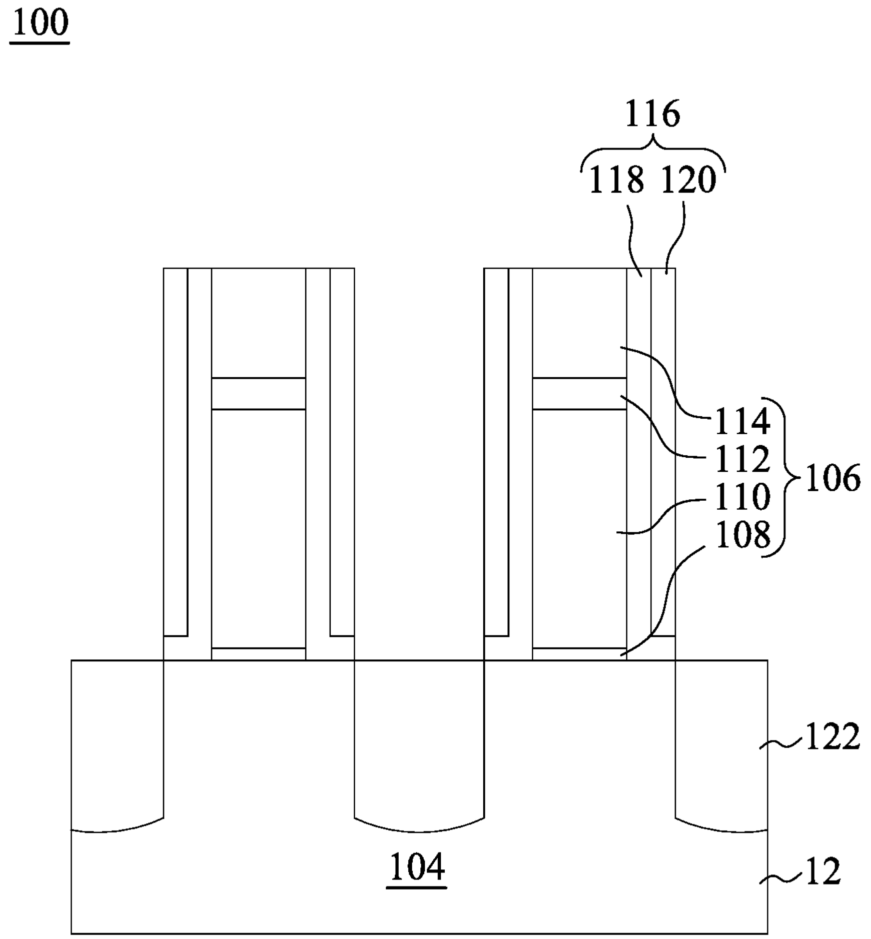

After formation of the gate sidewall spacers 116 is completed, source/drain structures 122 are formed on source/drain regions of the fin 104 that are not covered by the dummy gate structures 106 and the gate sidewall spacers 116. The resulting structure is illustrated in FIG. 5. In some embodiments, formation of the source/drain structures 122 includes recessing source/drain regions of the fin 104, followed by epitaxially growing semiconductor materials in the recessed source/drain regions of the fin 104.

The source/drain regions of the fin 104 can be recessed using suitable selective etching processing that attacks the semiconductor fin 104, but hardly attacks the gate spacers 116 and the top masks 114 of the dummy gate structures 106. For example, recessing the semiconductor fin 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a wet chemical etch, using etchant such as ammonium peroxide mixture (APM), $NH_4OH$, tetramethylammonium hydroxide (TMAH), combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the semiconductor fin 104. During the epitaxial growth process, the gate spacers 116 limit the one or more epitaxial materials to source/drain regions in the fin 104. In some embodiments, the lattice constants of the epitaxy structures 122 are different from the lattice constant of the semiconductor fin 104, so that the channel region in the fin 104 and between the epitaxy structures 122 can be strained or stressed by the epitaxy structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 104.

In some embodiments, the source/drain epitaxial structures 122 may include Ge, Si, GaAs, AlGaAs, SiGe, GaAsP, SiP, or other suitable material. The source/drain epitaxial structures 122 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 6:
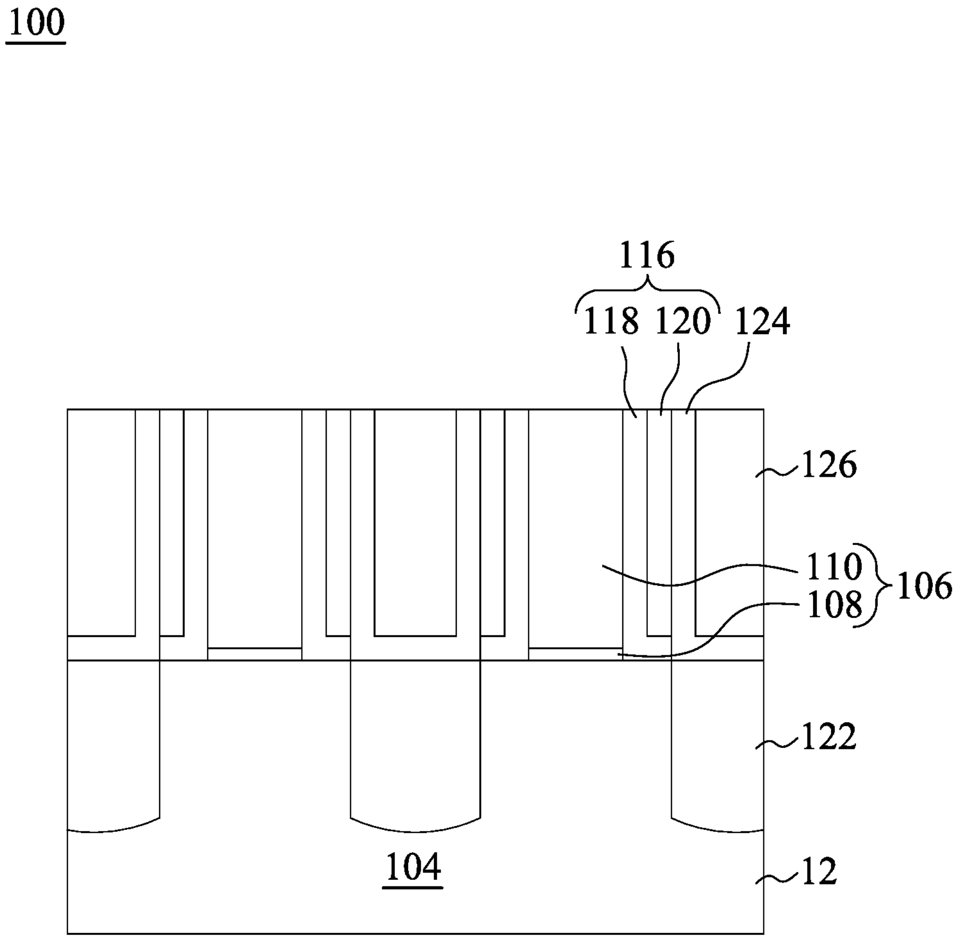

Next, in FIG. 6, an interlayer dielectric (ILD) layer 126 is formed on the substrate 12. In some embodiments, a contact etch stop layer (CESL) 124 is also formed prior to forming the ILD layer 126. In some examples, the CESL 124 includes a silicon nitride layer, silicon oxide layer, a silicon oxynitride layer, and/or other suitable materials having a different etch selectivity than the ILD layer 126. The CESL 124 may be formed by plasma-enhanced chemical vapor deposition (PECVD) process and/or other suitable deposition or oxidation processes. In some embodiments, the ILD layer 126 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 124. The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126. For example, a planarization process includes a chemical mechanical planarization (CMP) process which removes portions of the ILD layer 126 (and CESL layer, if present) overlying the dummy gate structures 106. In some embodiments, the CMP process also removes hard mask layers 112, 114 (as shown in FIG. 5) and exposes the dummy gate electrodes 110.

Figure 7:
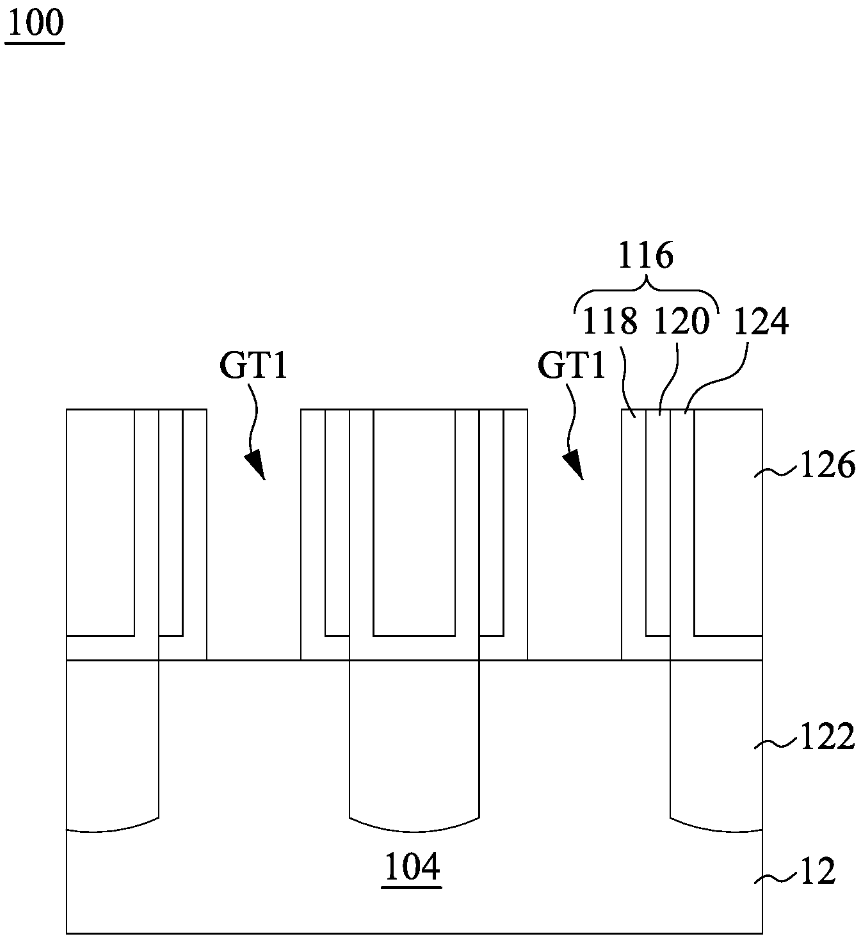

Next, as illustrates in FIG. 7, the remaining dummy gate structures 106 are removed, resulting in gate trenches GT1 between corresponding gate sidewall spacers 116. The dummy gate structures 106 are removed using a selective etching process (e.g., selective dry etching, selective wet etching, or a combination thereof) that etches materials in the dummy gate structures 106 at a faster etch rate than it etches other materials (e.g., gate sidewall spacers 116, CESL 124, and/or the ILD layer 126).

Figure 8:
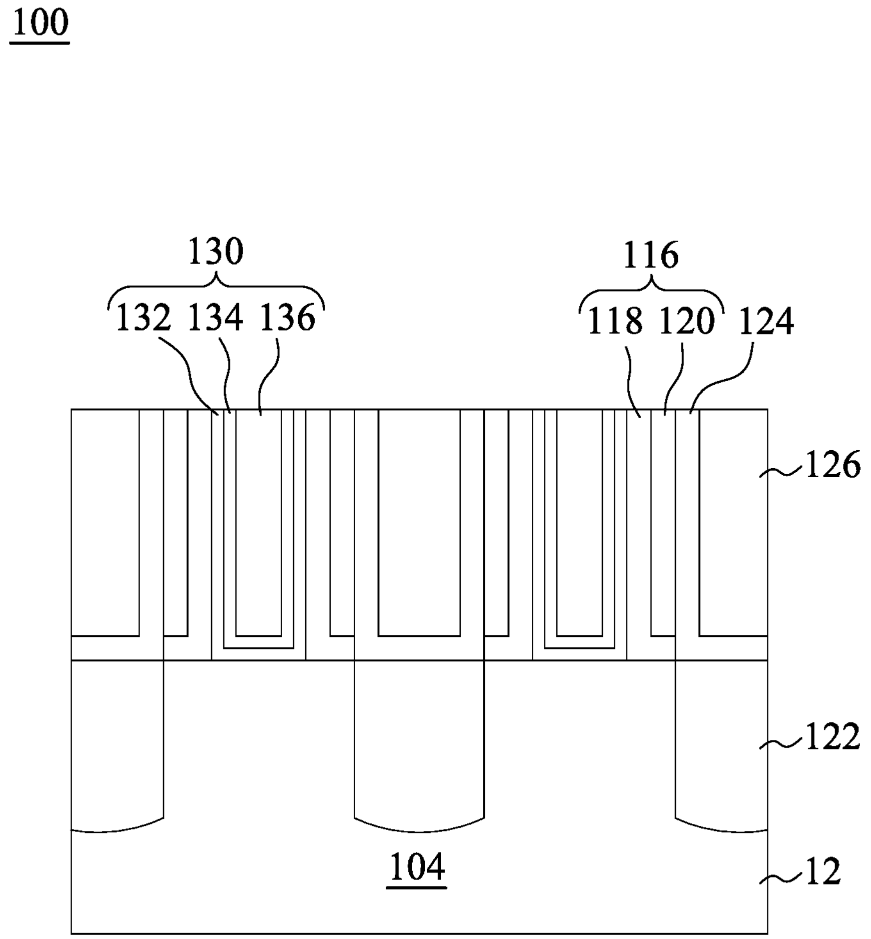

Thereafter, replacement gate structures 130 are respectively formed in the gate trenches GT1, as illustrated in FIG. 8. The gate structures 130 may be the final gates of FinFETs. The final gate structures each may be a high-k/metal gate stack, however other compositions are possible. In some embodiments, each of the gate structures 130 forms the gate associated with the three-sides of the channel region provided by the fin 104. Stated another way, each of the gate structures 130 wraps around the fin 104 on three sides. In various embodiments, the high-k/metal gate structure 130 includes a gate dielectric layer 132 lining the gate trench GT1, a work function metal layer 134 formed over the gate dielectric layer 132, and a fill metal 136 formed over the work function metal layer 134 and filling a remainder of gate trenches GT1. The gate dielectric layer 132 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 134 and/or fill metal layer 136 used within high-k/metal gate structures 130 may include a metal, metal alloy, or metal silicide. Formation of the high-k/metal gate structures 130 may include multiple deposition processes to form various gate materials, one or more liner layers, and one or more CMP processes to remove excessive gate materials.

In some embodiments, the interfacial layer of the gate dielectric layer 132 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 132 may include hafnium oxide ($HfO_2$). Alternatively, the gate dielectric layer 132 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), silicon oxynitrides (SiON), and combinations thereof.

The work function metal layer 134 may include work function metals to provide a suitable work function for the high-k/metal gate structures 130. For an n-type FinFET, the work function metal layer 134 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 134 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 136 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 9:
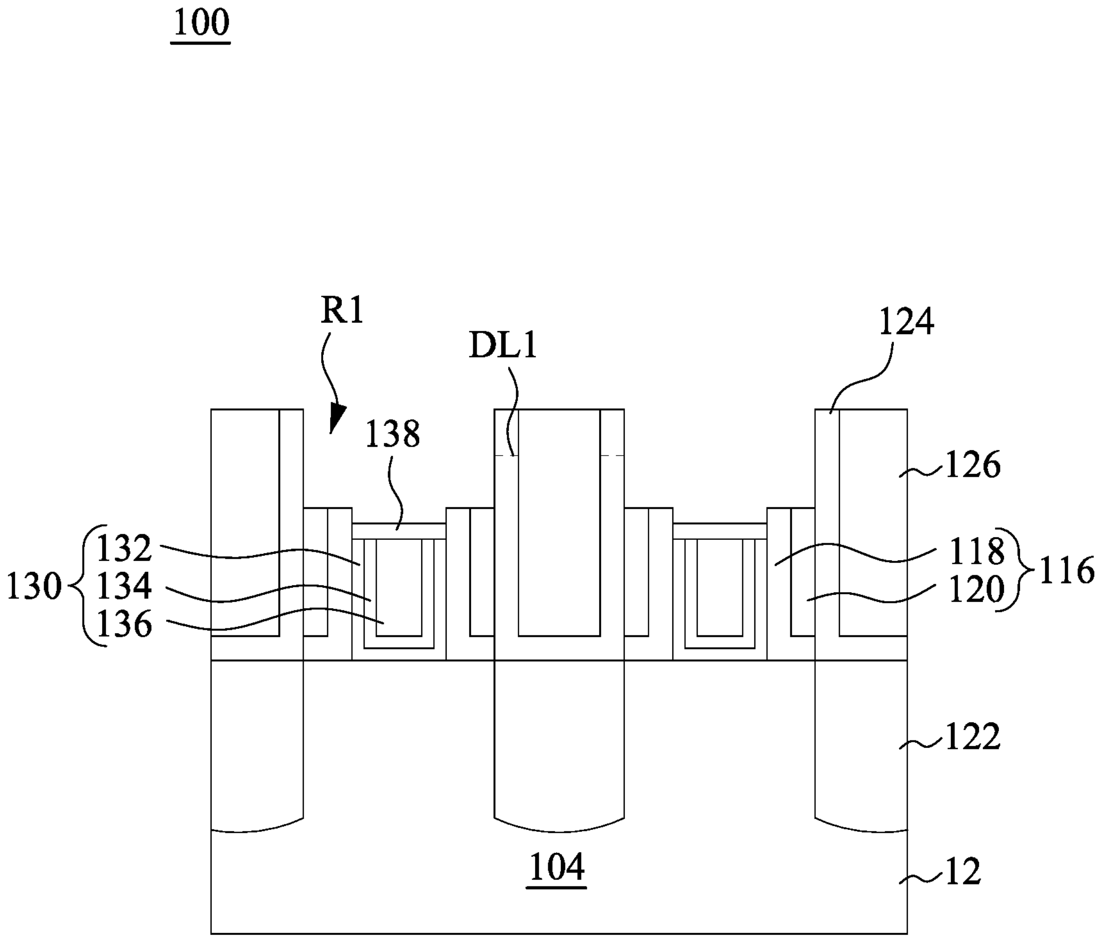

Reference is then made to FIG. 9. An etching back process is performed to etch back the replacement gate structures 130 and the gate spacers 116, resulting in recesses R1 over the etched-back gate structures 130 and the etched-back gate spacers 116. In some embodiments, because the materials of the replacement gate structures 130 have a different etch selectivity than the gate spacers 116, a first selective etching process may be initially performed to etch back the replacement gate structures 130 to lower the replacement gate structures 130 to fall below top ends of the gate spacers 116. Then, a second selective etching process is performed to lower the gate spacers 116. As a result, the top surfaces of the replacement gate structures 130 may be at a different level than the top surfaces of the gate spacers 116. For example, in the depicted embodiment as illustrated in FIG. 9, the replacement gate structures 130's top surfaces are lower than the top surfaces of the gate spacers 116. However, in some other embodiments, the top surfaces of the replacement gate structures 130 may be level with or higher than the top surfaces of the gate spacers 116. Moreover, in some embodiments, the CESL 124 may be etched back during etching back the replacement gate structures 130 and/or the gate spacers 116. In that case, the CESL 124 has a lower top end (as indicated in dash line DL1) than a top surface of the ILD layer 126.

Then, metal caps 138 are formed respectively atop the replacement gate structures 130 by suitable process, such as CVD or ALD. In some embodiments, the metal caps 138 are formed on the replacement gate structures 130 using a bottom-up approach. For example, the metal caps 138 are selectively grown on the metal surface, such as the work function metal layer 134 and the fill metal 136, and thus the sidewalls of the gate spacers 116 and the CESL 124 are substantially free from the growth of the metal caps 138. The metal caps 138 may be, by way of example and not limitation, substantially fluorine-free tungsten (FFW) films having an amount of fluorine contaminants less than 5 atomic percent and an amount of chlorine contaminants greater than 3 atomic percent. The FFW films or the FFW-comprising films may be formed by ALD or CVD using one or more non-fluorine based tungsten precursors such as, but not limited to, tungsten pentachloride ($WCl_5$), tungsten hexachloride ($WCl_6$). In some embodiments, portions of the metal caps 138 may extend over the gate dielectric layer 132, such that the metal caps 138 may also cover the exposed surface of the gate dielectric layers 132. Since the metal caps 138 are formed in a bottom-up manner, the formation thereof may be simplified by, for example, reducing repeated etching back processes which are used to remove unwanted metal materials resulting from conformal growth.

In some embodiments where the metal caps 138 are formed using a bottom-up approach, the growth of the metal caps 138 has a different nucleation delay on metal surfaces (i.e., metals in gate structures 130) as compared to dielectric surfaces (i.e., dielectrics in gate spacers 116 and/or CESL 124). The nucleation delay on the metal surface is shorter than on the dielectric surface. The nucleation delay difference thus allows for selective growth on the metal surface. The present disclosure in various embodiments utilizes such selectivity to allow metal growth from gate structures 130 while inhibiting the metal growth from the spacers 116 and/or the CESL 124. As a result, the deposition rate of the metal caps 138 on the gate structures 130 is faster than on the spacers 116 and the CESL 124. In some embodiments, the resulting metal caps 138 have top surfaces lower than top surfaces of the etched-back gate spacers 116. However, in some embodiments, the top surfaces of the metal caps 138 may be level with or higher than the top surfaces of the etched-back gate spacers 116.

Figure 10:
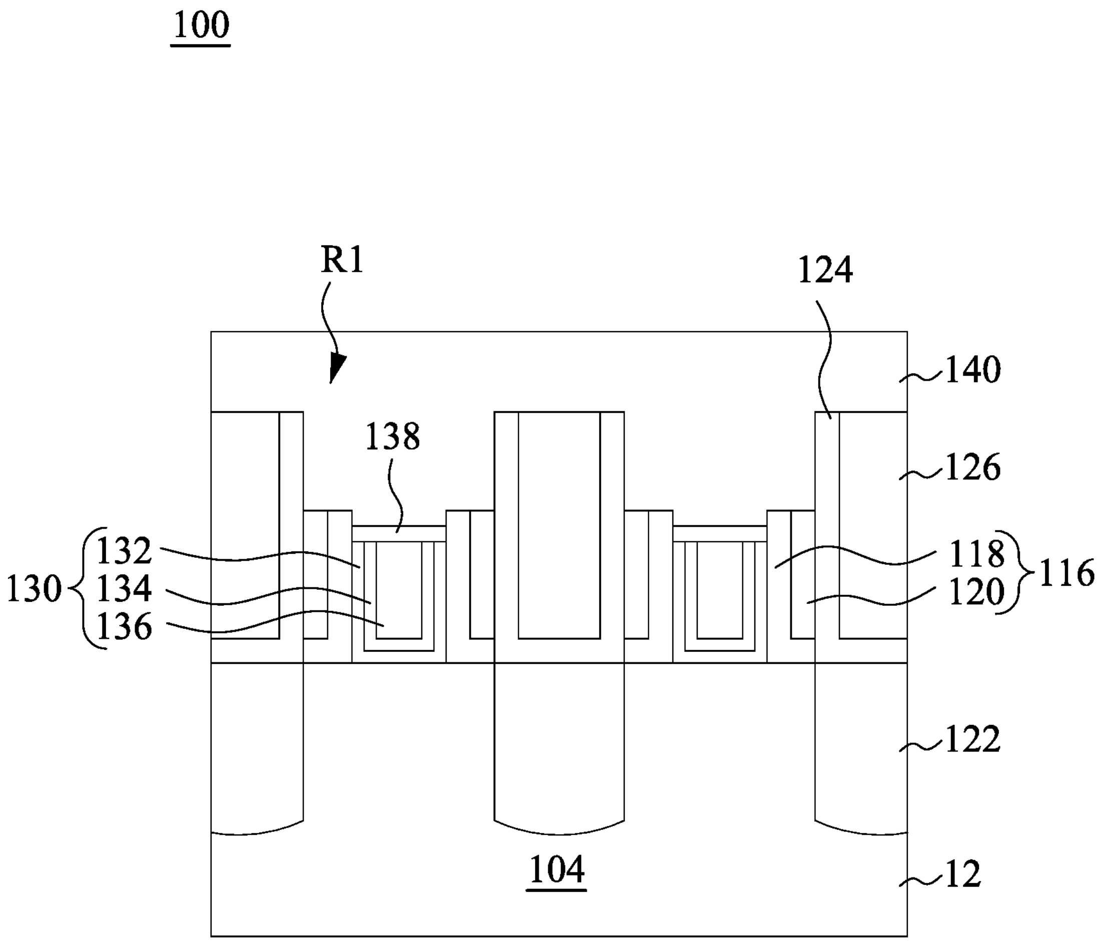
Figure 11:
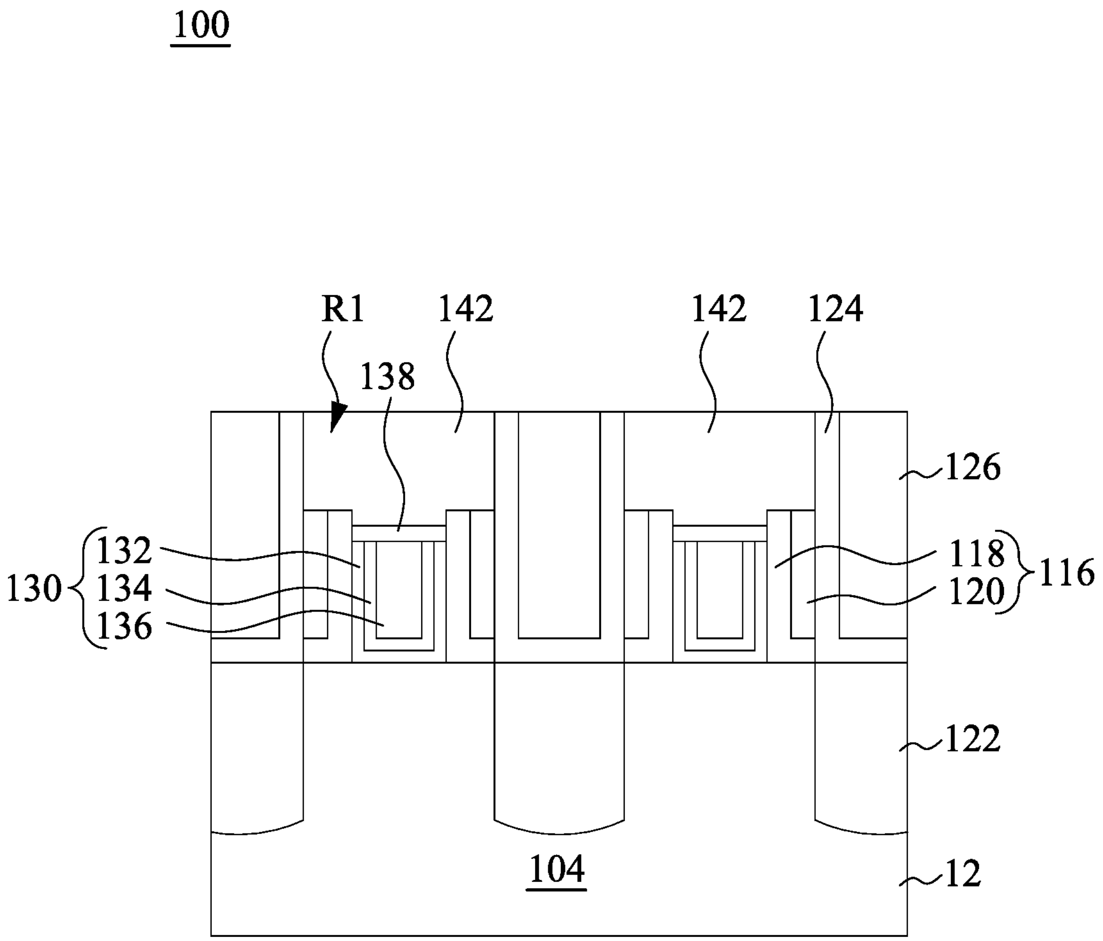

Next, a dielectric cap layer 140 is deposited over the substrate 105 until the recesses R1 are overfilled, as illustrated in FIG. 10. The dielectric cap layer 140 includes SiN, SiC, SiCN, SiON, SiCON, a combination thereof or the like, and is formed by a suitable deposition technique such as CVD, plasma-enhanced CVD (PECVD), ALD, remote plasma ALD (RPALD), plasma-enhanced ALD (PEALD), a combination thereof or the like. A CMP process is then performed to remove the cap layer outside the recesses R1, leaving portions of the dielectric cap layer 140 in the recesses R1 to serve as gate dielectric caps 142. The resulting structure is illustrated in FIG. 11.

Figure 12:
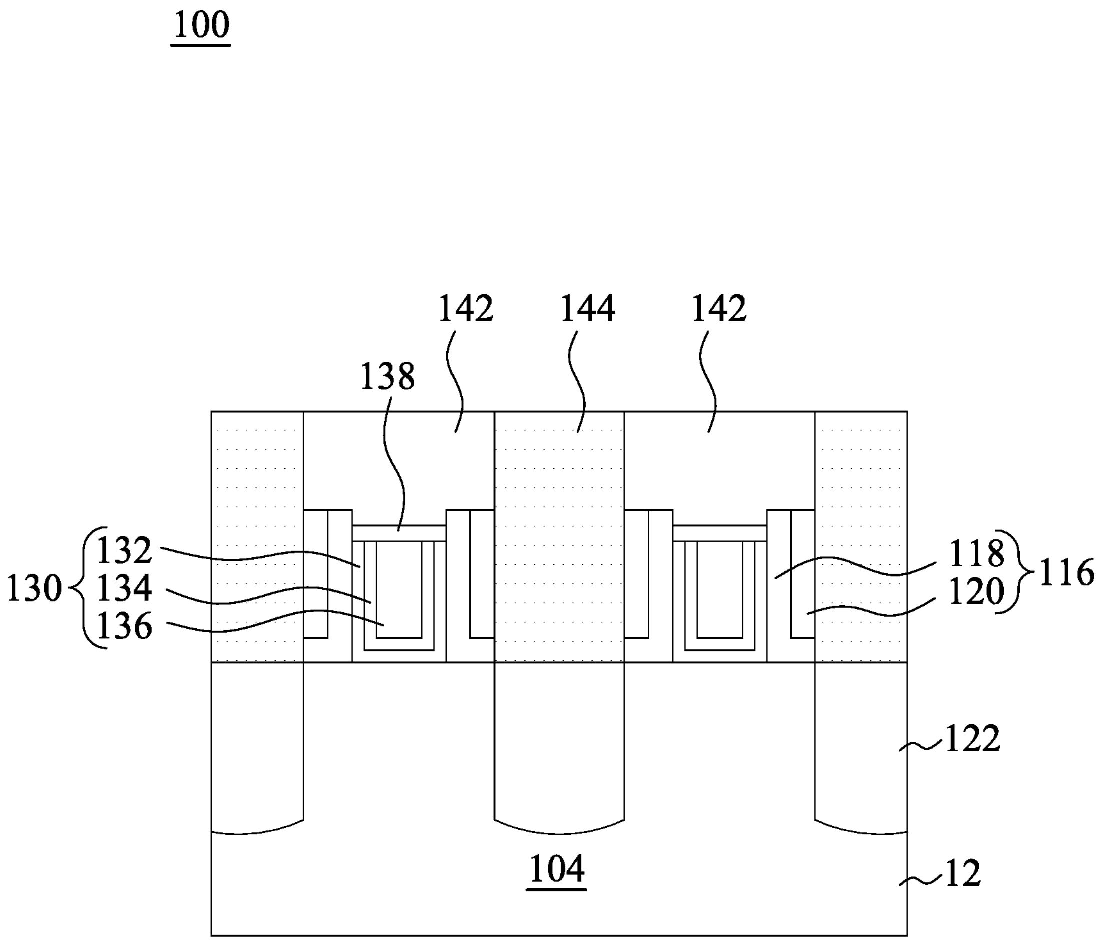

Referring to FIG. 12, source/drain contacts 144 are formed extending through the CESL 124 and the ILD layer 126. Formation of the source/drain contacts 144 includes, by way of example and not limitation, performing one or more etching processes to form contact openings extending through the ILD layer 126 and the CESL 124 to expose the source/drain epitaxy structures 122, depositing one or more metal materials overfilling the contact openings, and then performing a CMP process to remove excessive metal materials outside the contact openings. In some embodiments, the one or more etching processes are selective etching that etches the ILD layer 126 and the CESL 124 at a faster etch rate than etching the dielectric caps 142 and the gate spacers 116. As a result, the selective etching is performed using the dielectric caps 142 and the gate spacers 116 as an etch mask, such that the contact openings and hence source/drain contacts 144 are formed self-aligned to the source/drain epitaxy structures 122 without using an additional photolithography process. In that case, the dielectric caps 142 allowing for forming the source/rain contacts 144 in a self-aligned manner can be called self-aligned-contact (SAC) caps 142.

Figure 13:
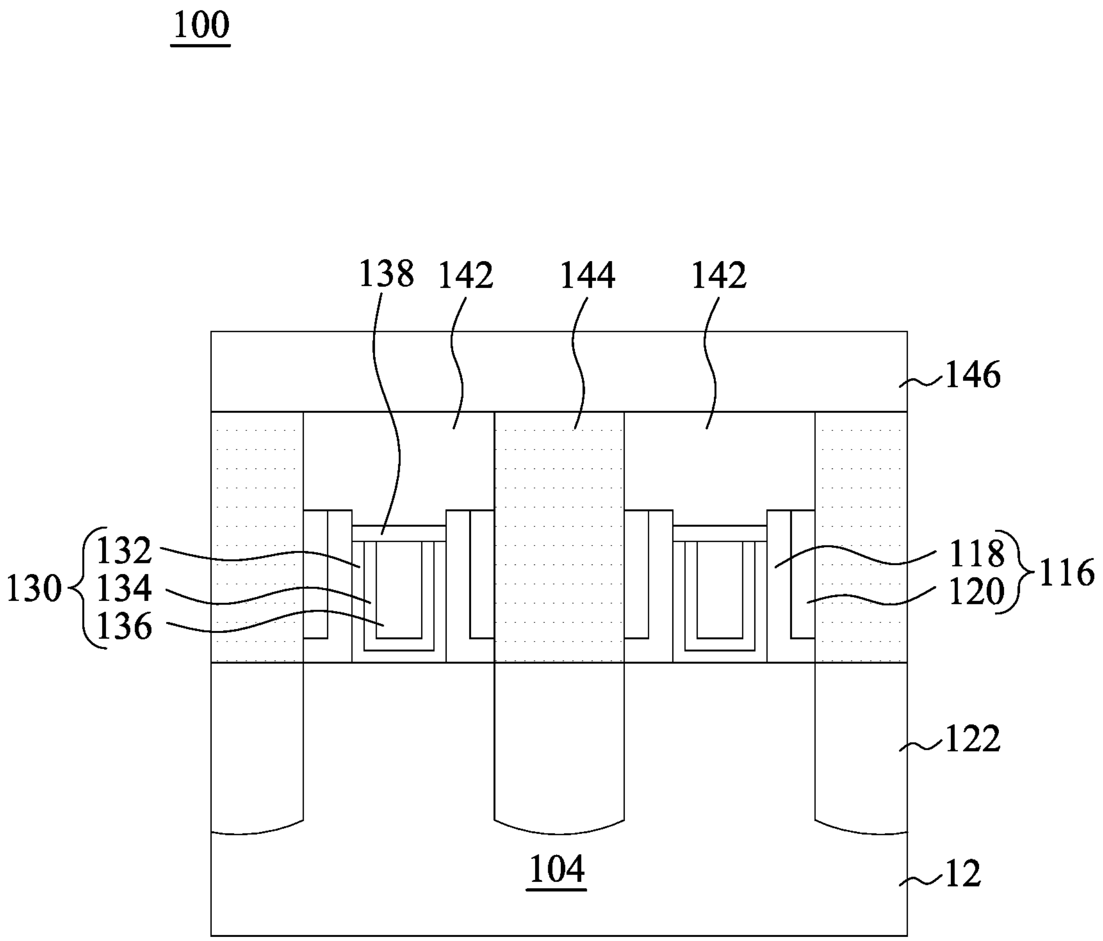

In FIG. 13, once the self-aligned source/drain contacts 144 have been formed, a middle contact etch stop layer (MCESL) 146 is then formed over the source/drain contacts 144 and the SAC caps 142. The MCESL 146 may be formed by a PECVD process and/or other suitable deposition processes. In some embodiments, the MCESL 146 is a silicon nitride layer and/or other suitable materials having a different etch selectivity than a subsequently formed ILD layer (as illustrated in FIG. 14).

Figure 14:
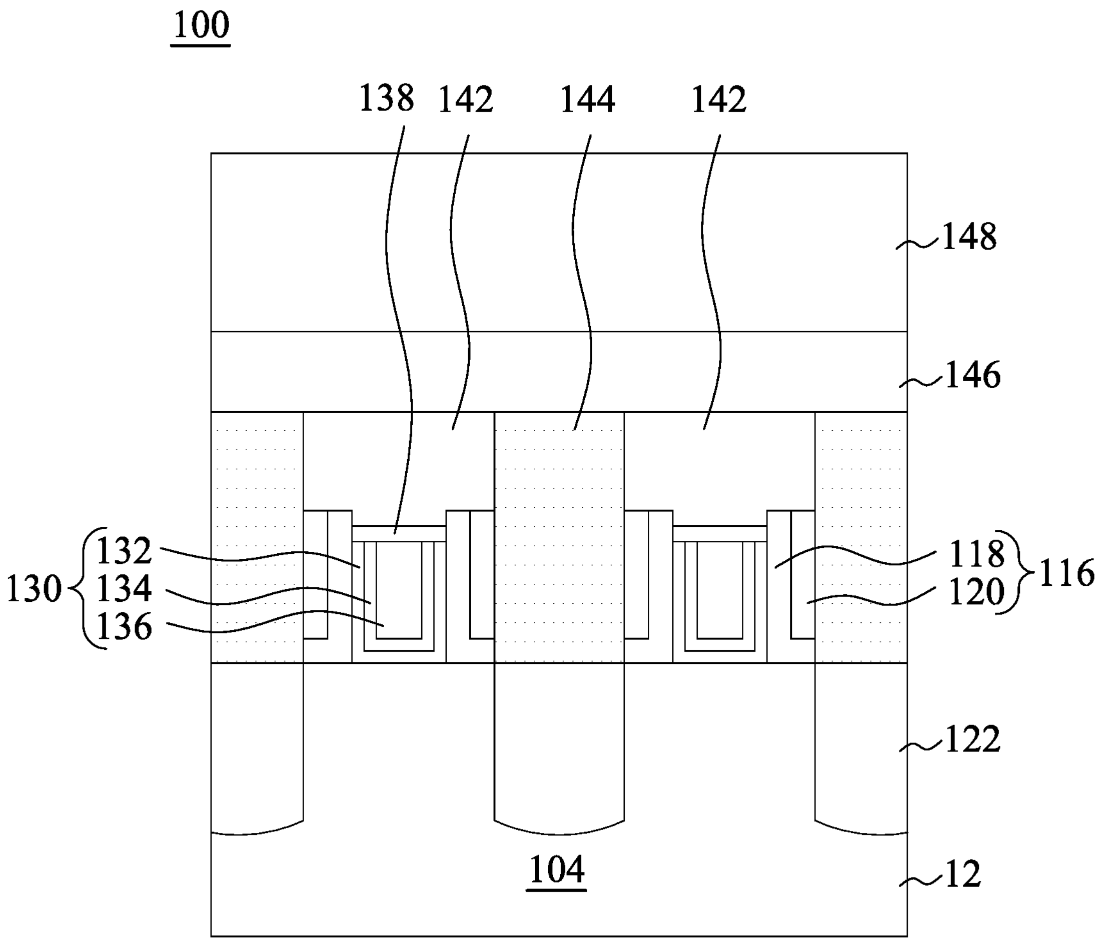

Referring to FIG. 14, another ILD layer 148 is formed over the MCESL 146. In some embodiments, the ILD layer 148 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 124. In certain embodiments, the ILD layer 148 is formed of silicon oxide ($SiO_x$). The ILD layer 148 may be deposited by a PECVD process or other suitable deposition technique.

Figure 15A:
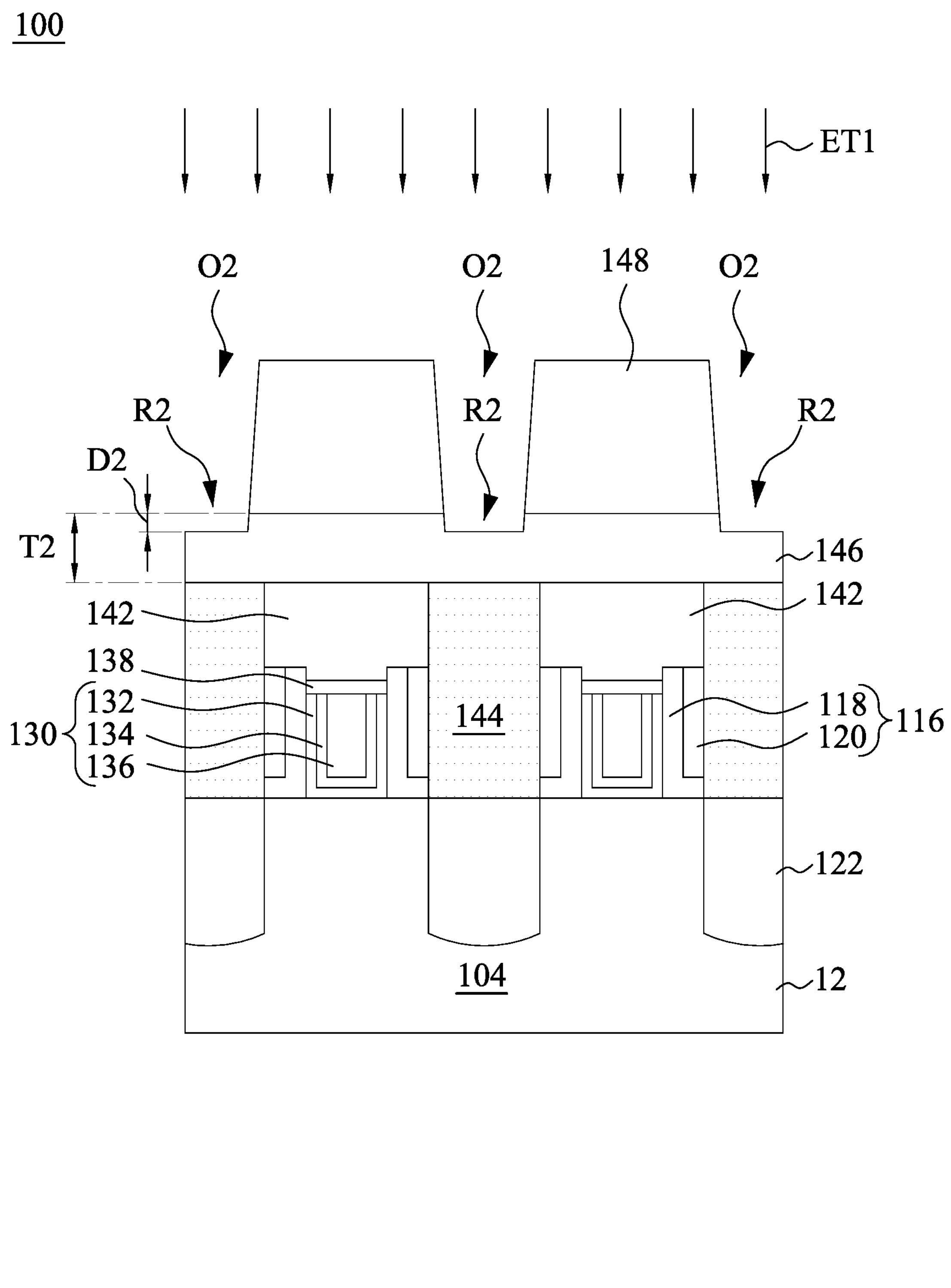

Referring to FIG. 15A, the ILD layer 148 is patterned to form via openings O2 extending through the ILD layer 148 by using a first etching process (also called via etching process) ET1. The etching duration time of the via etching process ET1 is controlled to allow removing portions of the MCESL 146 but not punching through the MCESL 146. As a result of this via etching process ET1, recesses R2 are formed below corresponding via openings O2, extending in the MCESL 146 but not through an entire thickness of the MCESL 146. Formation of recesses R2 allows for oxidizing sidewalls of the MCESL 146 in subsequent processing, which in turn will inhibit or slow down lateral etching in subsequent LRM etching, as will be described in greater detail below. In some embodiments, a ratio of the depth D2 of the recess R2 to the thickness T2 of the MCESL 146 is in a range from about 2:9 to about 7:9, e.g., about 5:9. If the ratio of the recess depth D2 to MCESL thickness T2 is excessively small, oxidized sidewalls formed in subsequent treatment may be too small to inhibit lateral etching in the following LRM etching process. If the ratio of the recess depth D2 to MCESL thickness T2 is excessively large, the MCESL 146 and the underlying source/drain contacts 144 may be over-etched.

In some embodiments, before the via etching process ET1, a photolithography process is performed to define expected top-view patterns of the via openings O2. For example, the photolithography process may include spin-on coating a photoresist layer over ILD layer 148 as illustrated in FIG. 14, performing post-exposure bake processes, and developing the photoresist layer to form a patterned mask with the top-view patterns of the via openings O2. In some embodiments, patterning the photoresist to form the patterned mask may be performed using an electron beam (e-beam) lithography process or an extreme ultraviolet (EUV) lithography process.

In some embodiments, the via etching process ET1 is an anisotropic etching process, such as a plasma etching. Take plasma etching for example, the semiconductor substrate 12 having the structure illustrated in FIG. 14 is loaded into a plasma tool and exposed to a plasma environment generated by RF or microwave power in a gaseous mixture of a fluorine containing gas, such as $C_4F_8$, $C_5F_8$, $C_4F_6$, $CHF_3$ or similar species, an inert gas, such as argon or helium, an optional weak oxidant, such as $O_2$ or CO or similar species, for a duration time sufficient to etch through the ILD layer 148 and recess exposed portions of the MCESL 146 at bottoms of the via openings O2. A plasma generated in a gaseous mixture comprising $C_4F_6$, $CF_4$, $CHF_3$, $O_2$ and argon can be used to etch through the ILD layer 148 and recess exposed portions of the MCESL 146 at bottoms of the via openings O2. The plasma etching environment has a pressure between about 10 mTorr and 100 mTorr and the plasma is generated by RF power between about 50 Watts and 1000 Watts.

In some embodiments, the foregoing etchants and etching conditions of the via etching process ET1 are selected in such a way that MCESL 146 (e.g., SiN) exhibits a slower etch rate than the ILD layer 148 (e.g., $SiO_x$). In this way, the MCESL 146 can act as a detectable etching end point, which in turn prevents over-etching and thus prevents punching or breaking through the MCESL 146. Stated differently, the via etching process ET1 is tuned to etch silicon oxide at a faster etch rate than etching silicon nitride. It has been observed that the etch rate of silicon nitride increases when the etching plasma is generated from a gaseous mixture containing a hydrogen ($H_2$) gas. As a result, the via etching process ET1 is performed using a hydrogen-free gaseous mixture for inhibiting silicon nitride etch rate, in accordance with some embodiments of the present disclosure. Stated differently, the plasma in the via etching process ET1 is generated in a gaseous mixture without hydrogen ($H_2$) gas. In this way, etch rate of silicon nitride keeps low in the via etching process ET1, which in turn allows for etching silicon oxide (i.e., ILD material) at a faster etch rate than etching silicon nitride (i.e., MCESL material).

Figure 15B:
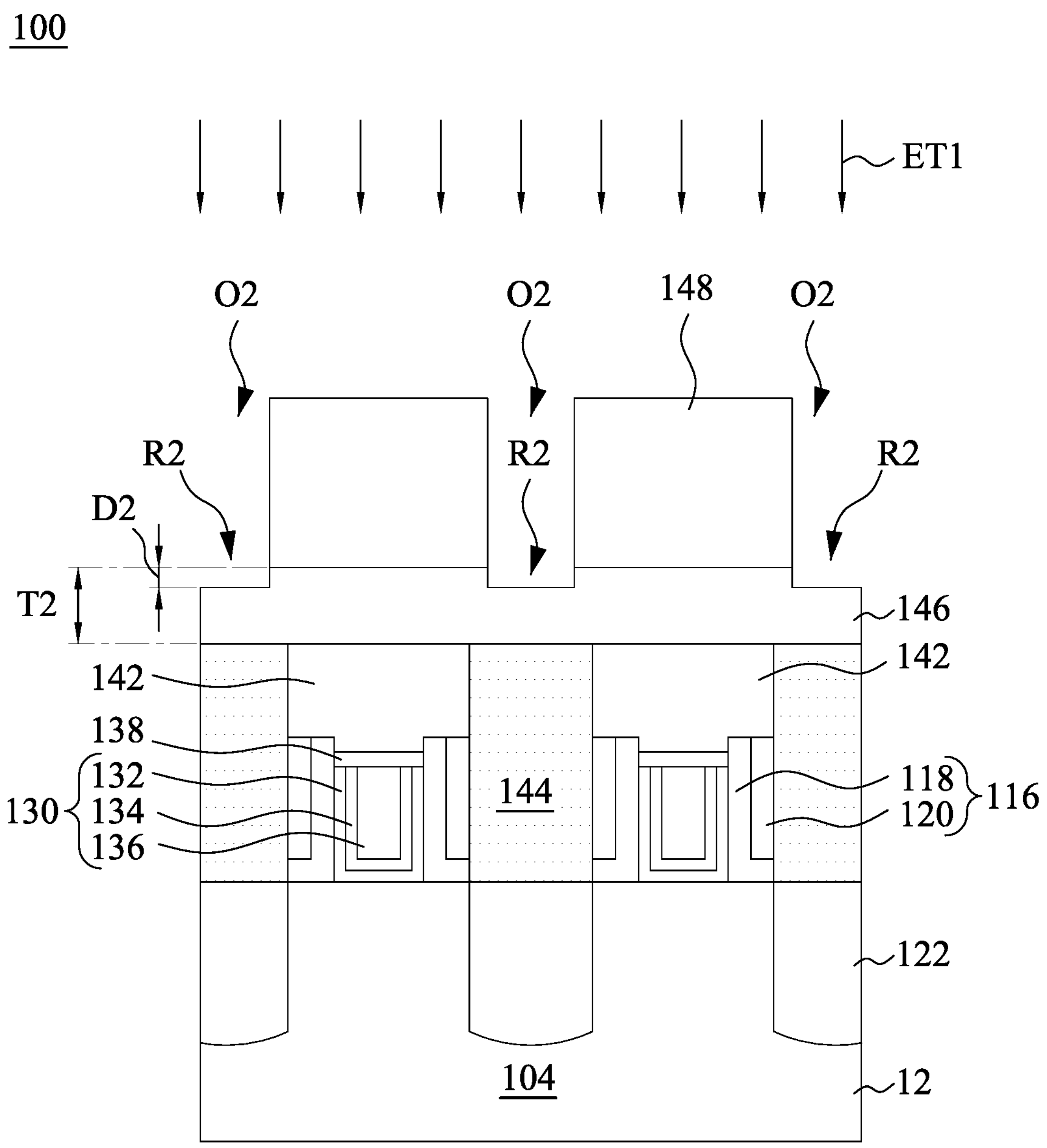

In some embodiments as depicted in FIG. 15A, the via openings O2 have tapered sidewall profile due to the nature of anisotropic etching. However, in some other embodiments, the etching conditions may be fine-tuned to allow the via openings O2 having vertical sidewall profile, as illustrated in FIG. 15B.

Figure 16A:
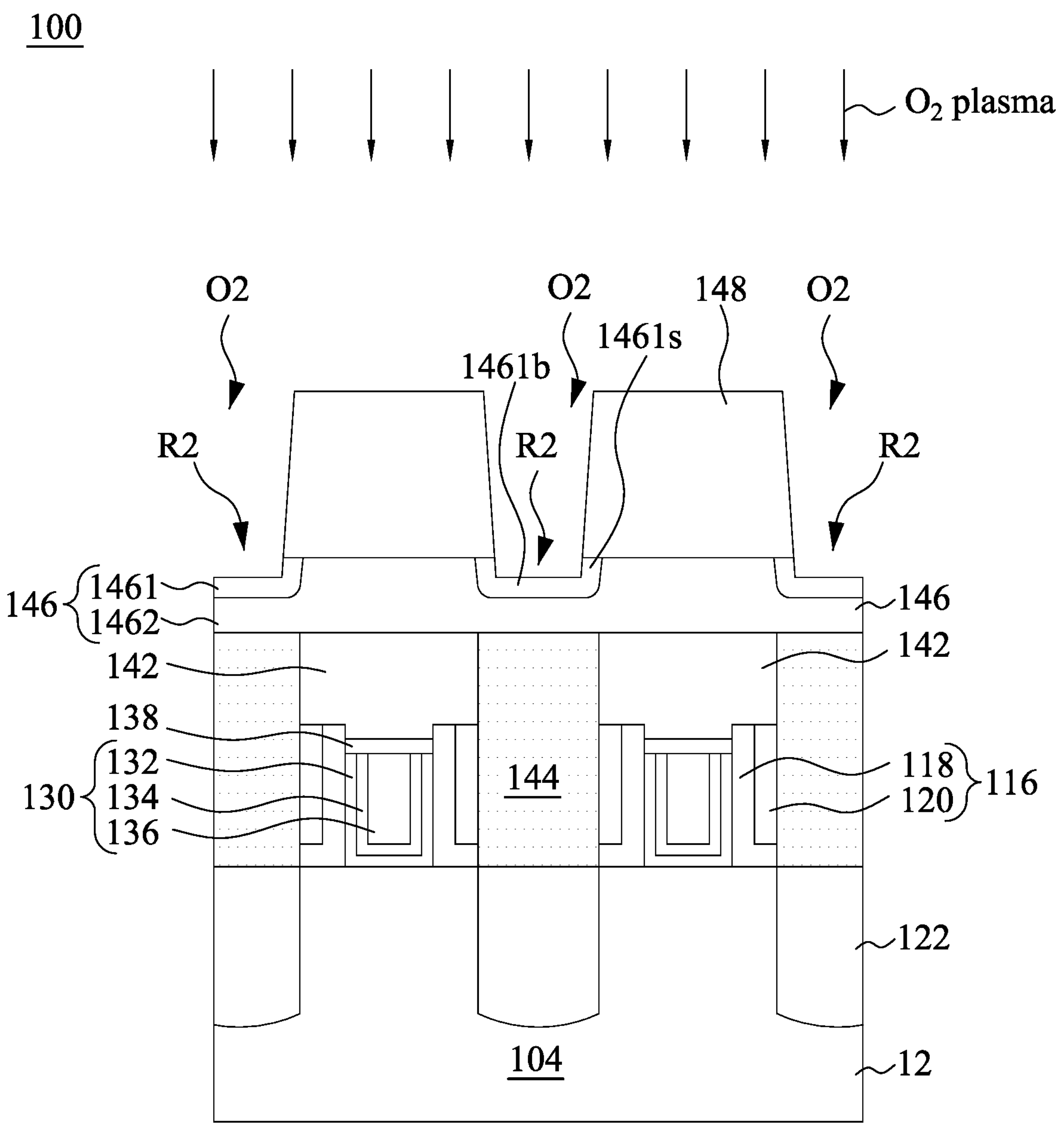
Figure 16B:
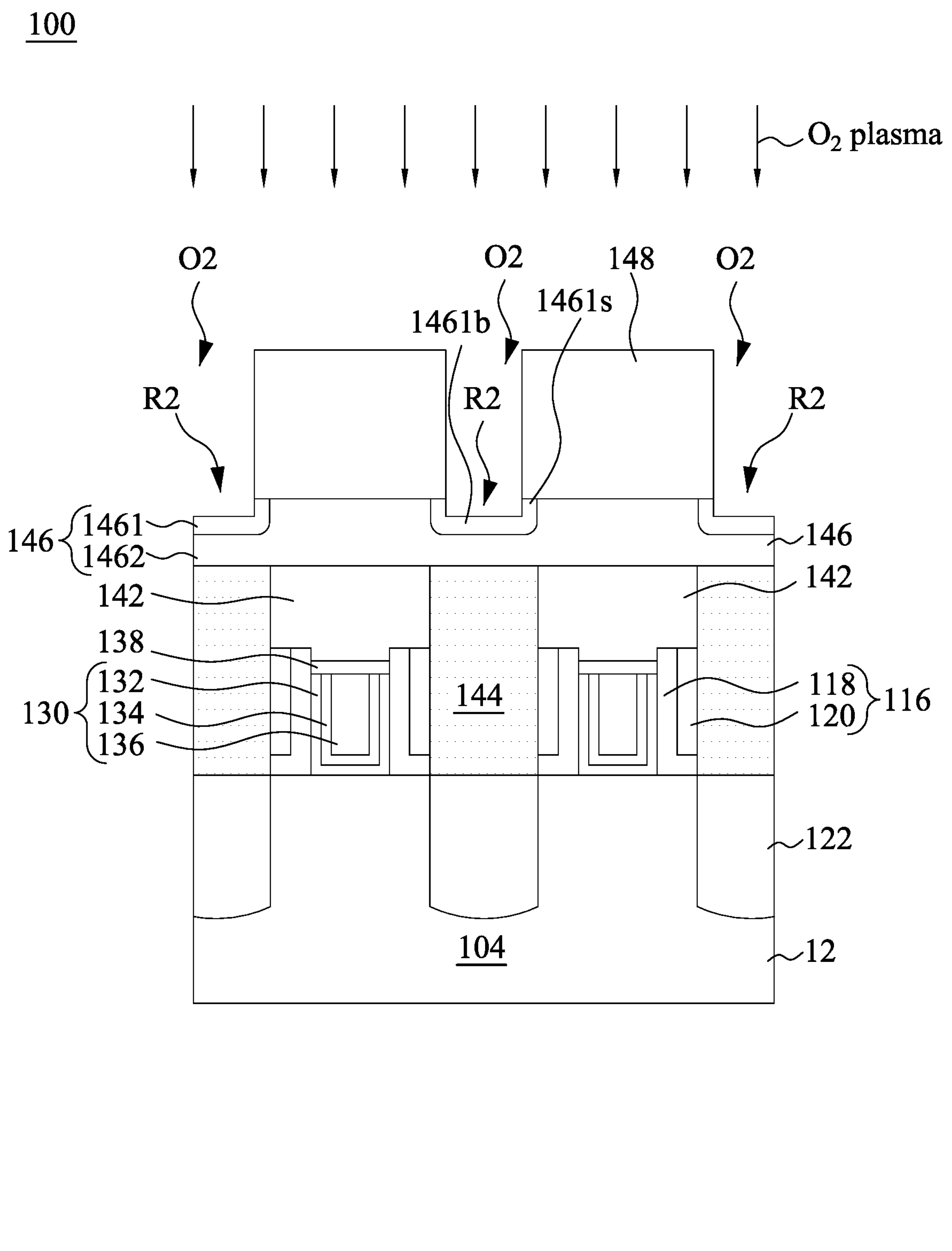

After the via etching process ET1 has been completed, the exposed portions of the MCESL layer 146 is treated in an oxygen-containing environment, so that surface layers of the exposed portions of the MCESL 146 are oxidized to form an oxidized region 1461 in the MCESL layer 146, while leaving a remaining region 1462 of the MCESL layer 146 un-oxidized. The resulting structure is illustrated in FIG. 16A or 16B. The treatment step may include an $O_2$ plasma treatment, wherein the oxygen-containing gas is conducted into a process chamber, in which the plasma is generated from the oxygen-containing gas. By way of example and not limitation, the semiconductor substrate 12 having the structure illustrated in FIG. 15A or 15B is loaded in to a plasma tool and exposed to a plasma environment generated by oxygen ($O_2$) gas or a gaseous mixture of $O_2$ gas and one or more of Ar gas, He gas, Ne gas, Kr gas, $N_2$ gas, CO gas, $CO_2$ gas, $C_xH_yF_z$ (wherein x, y, and z are greater than zero and not greater than nine) gas, $NF_3$ gas, Carbonyl sulfide (COS) gas, $SO_2$ gas. The plasma treatment environment has a pressure between about 10 mTorr and 100 mTorr and the plasma is generated by RF power between about 50 Watts and 1000 Watts.

As a result of the $O_2$ plasma treatment, oxidation occurs in bottom surfaces and sidewalls of recesses R2 in the MCESL 146, thus resulting in the oxidized region 1461 having an oxidized bottom portion 1461*b* and an oxidized sidewall portion 1461*s* extending upwards from the oxidized bottom portion 1461*b* and laterally surrounding the oxidized bottom portion 1461*b*.

In some embodiments, the oxidized bottom portion 1461*b* and the oxidized sidewall portion 1461*s* have same thickness (e.g., in a range from about 1 nm to about 3 nm). In some other embodiments, the oxidized sidewall portion 1461*s* has a thicker thickness than the oxidized bottom portion 1461*b*. For example, a thickness ratio of the oxidized sidewall portion 1461*s* to the oxidized bottom portion 1461*b* can be greater than about 1:1, 2:1, 3:1, 4:1 or 5:1. Thicker oxidized sidewall portion 1461*s* allows for higher etch resistance against the subsequent LRM etching. Thinner oxidized bottom portion 1461*b* allows for shortened LRM etching duration time because the oxidized bottom portion 1461*b* is to be removed in the LRM etching. In some embodiments, the oxidized sidewall portion 1461*s* has a thickness gradient from bottom to top. For example, the oxidized sidewall portion 1461*s* may be thicker in the top and thinner in the bottom. Thicknesses of the oxidized sidewall portion 1461*s* and the oxidized bottom portion 1461*b* can be controlled by using, by way of example and not limitation, RF power and/or bias power of the $O_2$ plasma treatment.

In some embodiments where the via openings O2 are formed with tapered sidewall profile, the oxidized sidewall portion 1461*s* extends at an obtuse angle from the oxidized bottom portion 1461*b*, as illustrated in FIG. 16A. In some embodiments where the via openings O2 are formed with vertical sidewall profile, the oxidized sidewall portion 1461*s* extends at a vertical angle from the oxidized bottom portion 1461*b*, as illustrated in FIG. 16B.

In some embodiments where the MCESL 146 is made of SiN, the $O_2$ plasma treatment results in oxidized nitride regions (silicon oxynitride ($SiO_xN_y$)) 1461 in the MCESL 146 and below the via openings O2 and an un-oxidized nitride region 1462 cupping undersides of the oxidized nitride regions 1461. The oxidized nitride regions 1461 may form distinguishable interfaces with the un-oxidized nitride region 1462, because they have different material compositions (e.g., oxidized nitride regions 1461 having a higher oxygen atomic percentage and/or higher oxygen-to-nitrogen atomic ratio than un-oxidized nitride region 1462).

In some embodiments, the oxidized region 1461 may have an oxygen concentration gradient due to the plasma treatment. For example, the oxygen atomic percentage in the oxidized region 1461 may decrease as a distance from the recess R2's surface increases. In greater detail, the oxidized sidewall portion 1461*s* has an oxygen atomic percentage decreasing as a distance from a sidewall of the recess R2 increases, and the oxidized bottom portion 1461*b* has an oxygen atomic percentage decreasing as a distance from a bottom surface of the recess R2 increases. In some embodiments where the MCESL 146 is silicon nitride, the oxygen-to-nitrogen atomic ratio in the oxidized region may decrease as a distance from the recess R2's surface increases. In greater detail, the oxidized sidewall portion 1461*s* may have an oxygen-to-nitrogen atomic ratio decreasing as a distance from a sidewall of the recess R2 increases, and the oxidized bottom portion 1461*b* has an oxygen-to-nitrogen atomic ratio decreasing as a distance from a bottom surface of the recess R2 increases.

Figure 17:
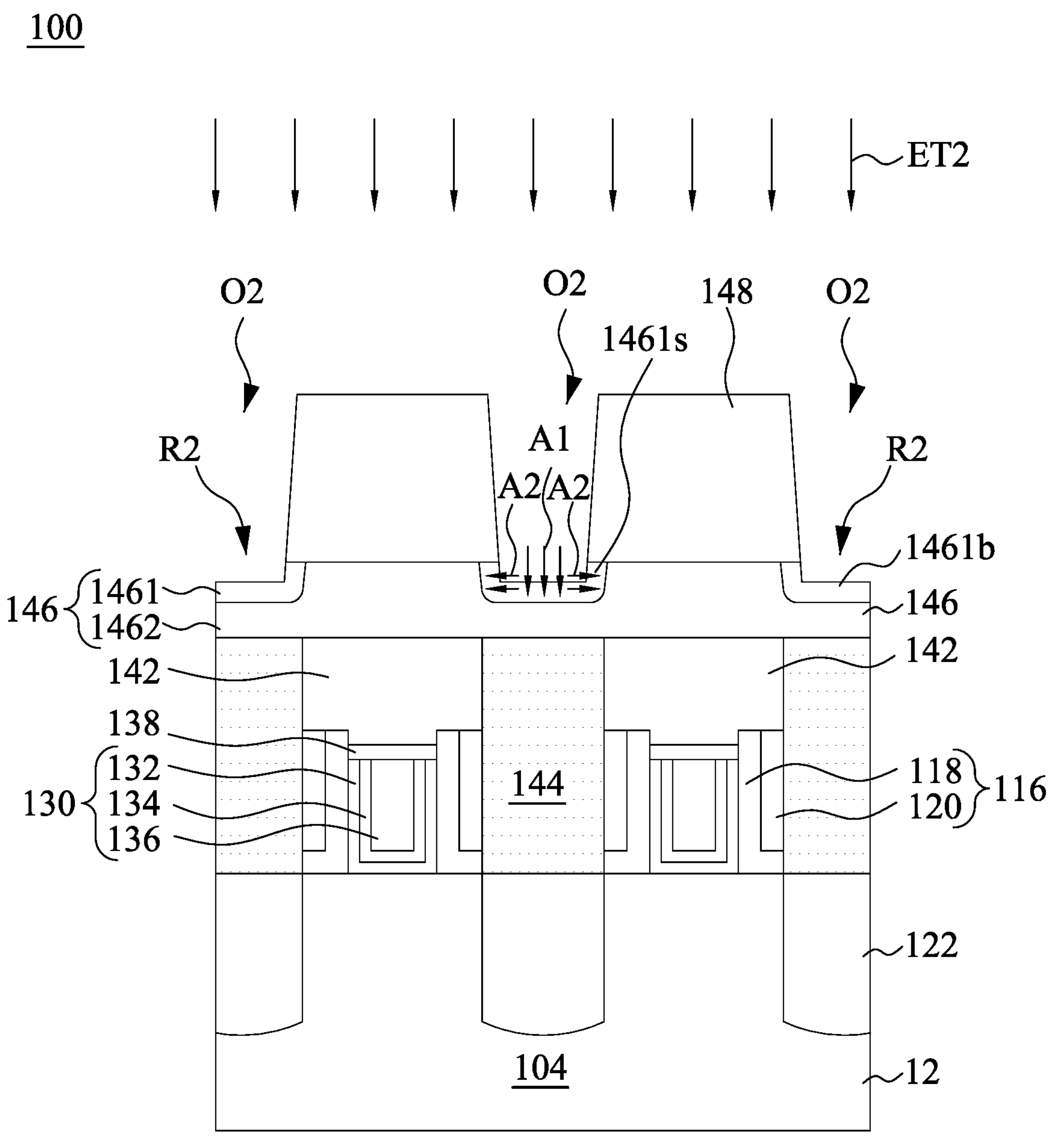
Figure 18:
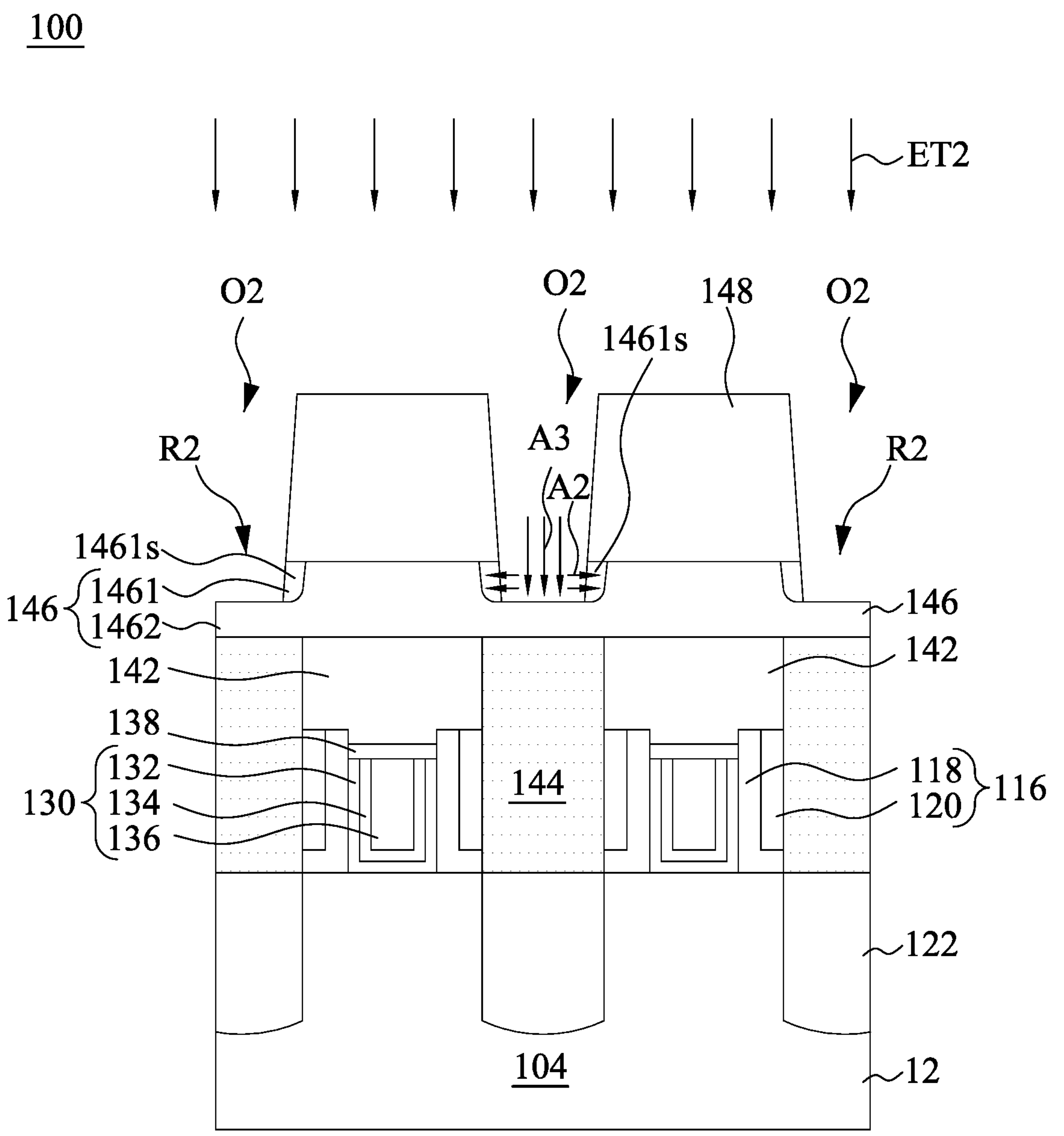
Figure 19A:
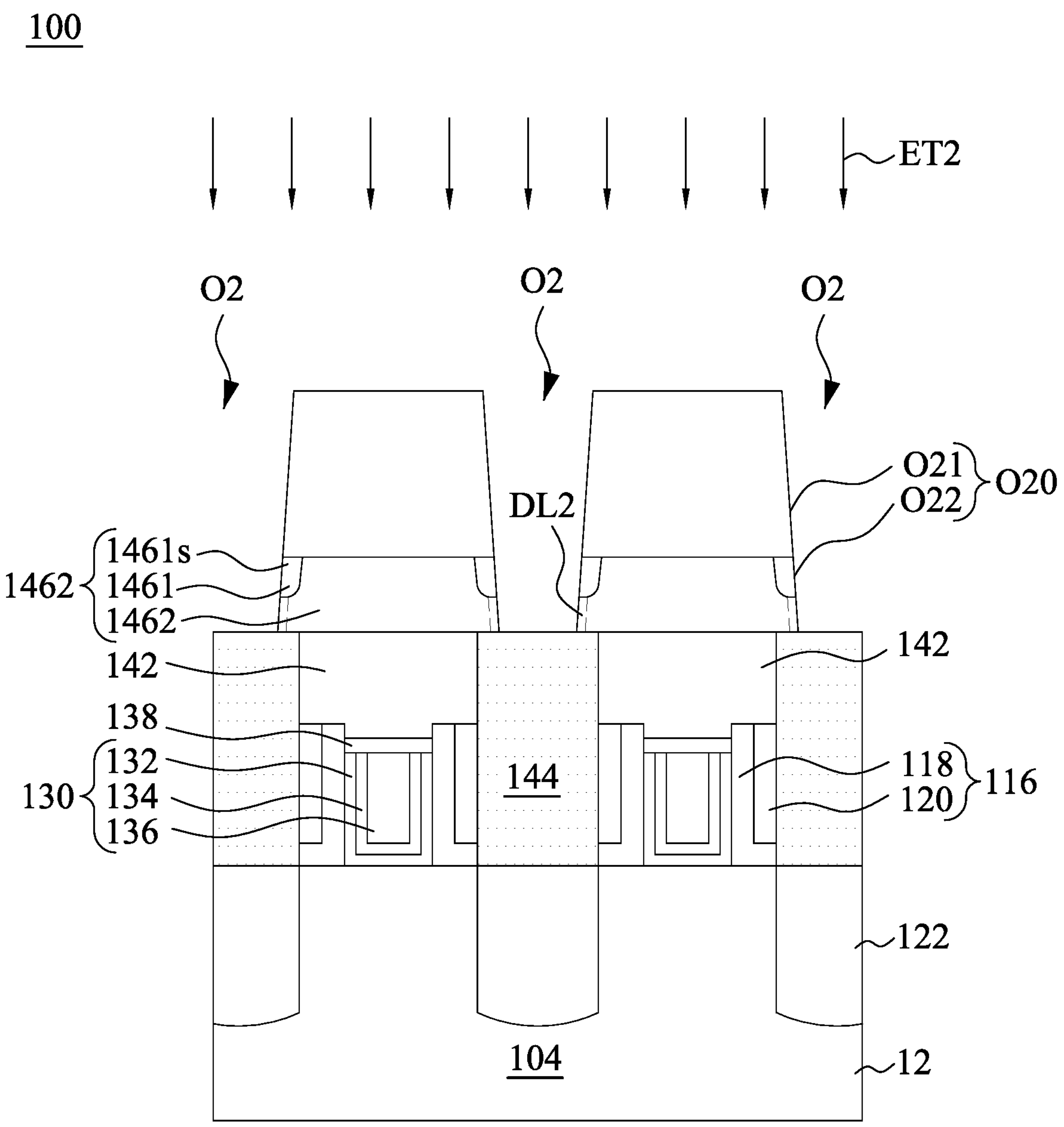

FIG. 17 illustrates a cross-sectional view of an initial stage of a second etching process (also called LRM etching process) ET2 in accordance with some embodiments of the present disclosure, FIG. 18 illustrates a cross-sectional view of a following stage of the LRM etching process ET2 in accordance with some embodiments of the present disclosure, and FIG. 19A illustrates a cross-sectional view of a final stage of the LRM etching process ET2 in accordance with some embodiments of the present disclosure. The etching time duration of the LRM etching process ET2 is controlled to break through (or called punch through) the MCESL 146, thus deepening or extending the via openings O2 down to the source/drain contacts 144. As a result of the LRM etching process ET2, the source/drain contacts 144 get exposed at bottoms of the deepened via openings O2.

In some embodiments, the LRM etching process ET2 is an anisotropic etching process, such as a plasma etching (e.g., inductively coupled plasma (ICP), capacitively coupled plasma (CCP), or the like), using a different etchant and/or etching conditions than the via etching process ET1. The etchant and/or etching conditions of the LRM etching process ET2 are selected in such a way that the oxidized region 1461 exhibits a slower etch rate than the un-oxidized region 1462. Stated differently, the oxidized region 1461 has a higher etch resistance than the un-oxidized region 1462 in the LRM etching process ET2. In this way, the MCESL 146 can inhibit or slow down lateral etching in the MCESL 146 during the LRM etching process ET2. Take plasma etching for example, the semiconductor substrate 12 having the structure illustrated in FIG. 16A is loaded into a plasma tool and exposed to a plasma environment generated by RF or microwave power in a gaseous mixture of a fluorine-containing gas (e.g., $CHF_3$, $CF_4$, $C_2F_2$, $C_4F_6$, $C_xH_yF_z$ (x, y, z are greater than zero and not greater than nine), or similar species), a hydrogen-containing gas (e.g., $H_2$), an inert gas (e.g., argon or helium), for a duration time sufficient to etch through the oxidized bottom portion 1461*b* and an underlying un-oxidized region 1462 of the MCESL 146. The plasma etching environment has a pressure between about 10 mTorr and 100 mTorr and the plasma is generated by RF power between about 50 Watts and 1000 Watts.

Plasma generated from a hydrogen-containing gas mixture can etch silicon nitride at a faster etch rate than etching silicon oxynitride, and thus the LRM etching process ET2 using a hydrogen-containing gas mixture etches oxidized regions 1461 at a slower etch rate than etching the un-oxidized region 1462. In this way, the sidewall oxidized portion 1461*s* can inhibit or slow down lateral etching during the LRM etching process ET2. In some embodiments, the LRM etching process ET2 uses a gas mixture of $CHF_3$ gas and $H_2$ gas with a flow rate ratio of $CHF_3$ gas to $H_2$ gas from about 1:1 to about 1:100. In some embodiments, the LRM etching process ET2 uses a gas mixture of $CF_4$ gas and $H_2$ gas with a flow rate ratio of $CF_4$ gas to $H_2$ gas from about 1:1 to about 1:100. An excessively high $H_2$ gas flow rate may lead to an excessively fast etch rate in etching through the un-oxidized region 1462 of the MCESL 146, which in turn may lead to non-negligible bowing profile in the un-oxidized region 1462. An excessively low $H_2$ gas flow rate may lead to insufficient etch selectivity between the un-oxidized region 1462 and the oxidized sidewall portion 1461*s*.

At initial stage of the LRM etching process ET2, as illustrated in FIG. 17, the plasma etchant etches the oxidized bottom portions 1461*b* at a first vertical etch rate A1 and the oxidized sidewall portions 1461*s* at a lateral etch rate A2. The lateral etch rate A2 of the oxidized sidewall portions 1461*s* is slower than the first vertical etch rate A1 of the oxidized bottom portions 1461*b* because of the anisotropic etch mechanism. At a following stage of the LRM etching process ET2 as illustrated in FIG. 18, once the oxidized bottom portions 1461*b* are etched through by the LRM etching process ET2, the un-oxidized region 1462 of the MCESL 146 gets exposed. Then the plasma etchant etches the un-oxidized region 1462 at a second vertical etch rate A3 faster than the first vertical etch rate A1, but still etches the oxidized sidewall portions 1461*s* at the lateral etch rate A2 that is much slower than the second vertical etch rate A3. As a result, the oxidized sidewall portions 146*b* inhibits or slows down laterally etching the MCESL 146 during breaking through the un-oxidized region 1462, resulting in no or negligible bowing profile in the via openings O2, as illustrated in FIG. 19A.

In FIG. 19A, the sidewalls O20 of the via openings O2 extend linearly through an entire thickness of the ILD layer 148 and an entire thickness of the MCESL 146, and no or negligible bowing occurs. In greater detail, the ILD layer 148 has a linear sidewall O21 defining an upper part of a via opening O2 and the MCESL 146 also has a linear sidewall O22 defining a lower part of the via opening O2, and the linear sidewalls O21 and O22 are aligned with each other. In some embodiments, the linear sidewall O22 of the MCESL 146 has a sidewall of the oxidized sidewall portion 1461*s* extending downwards from the linear sidewall O21 of the ILD layer 148, and a sidewall of the un-oxidized region 1462 extending downwards from the sidewall of the oxidized sidewall portion 1461*s*. In some embodiments as depicted in FIG. 19A, the sidewall of un-oxidized region 1462 is aligned with the sidewall of the oxidized sidewall portion 1461*s*. However, in some other embodiments, the sidewall of the un-oxidized region 1462 may be slightly laterally set back (as indicated in dash line DL2) from the sidewall of the oxidized sidewall portion 1461*s*, because the LRM etching process ET2 may cause more lateral etching in the un-oxidized region 1462 than in the oxidized sidewall portion 1461*s*. Even in this scenario the via openings O2 still have alleviated bowing defect compared with the case where no oxidized sidewall portion 1461*s* is formed, because the bowing profile is localized to the un-oxidized region 1462.

Figure 19B:
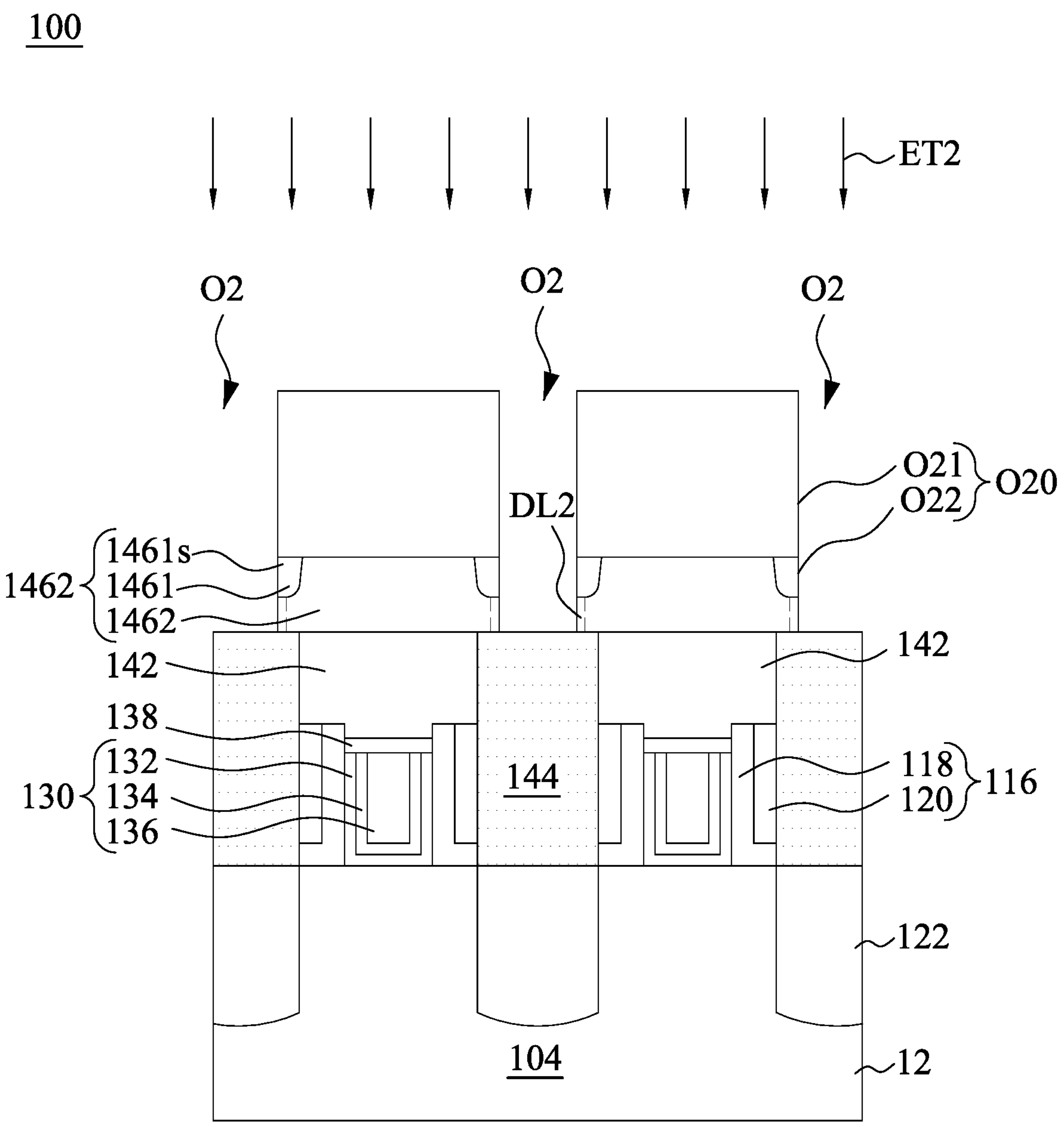

In some embodiments as depicted in FIG. 19A, the via openings O2 have tapered sidewall profile due to the nature of anisotropic etching of the LRM etching process ET2. However, in some other embodiments, the etching conditions of the LRM etching process ET2 and/or the previous via etching process ET1 may be fine-tuned to allow the via openings O2 having vertical sidewall profile, as illustrated in FIG. 19B.

Figure 20A:
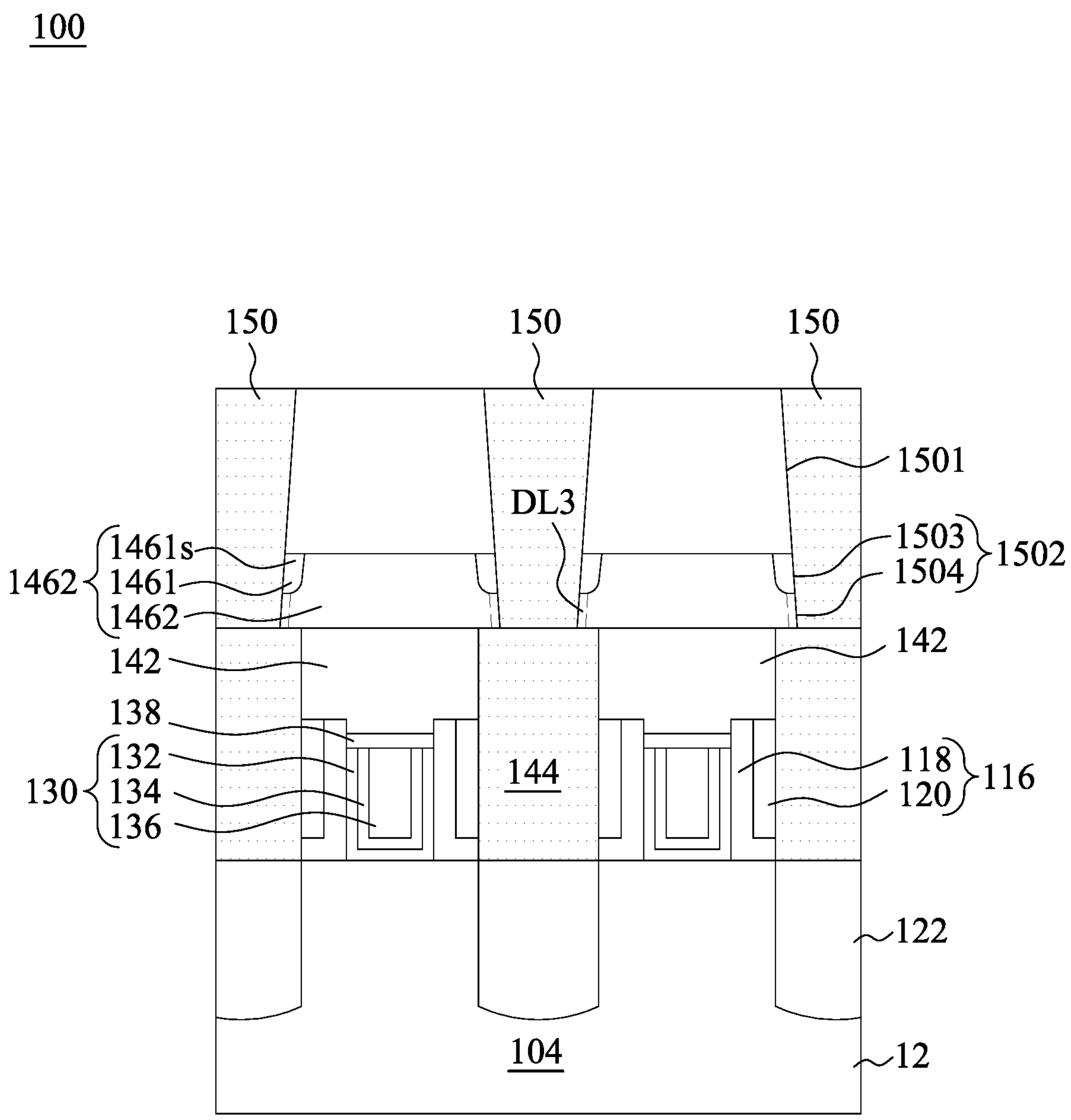

Referring to FIG. 20A, source/drain vias 150 are then formed in the via openings O2 to make physical and electrical connection to the source/drain contacts 144. The source/drain vias 150 are formed using, by way of example and not limitation, depositing one or more metal materials overfilling the via openings O2, followed by a CMP process to remove excessive metal material(s) outside the via openings O2. As a result of the CMP process, the source/drain vias 150 have top surfaces substantially coplanar with the ILD layer 148. The source/drain vias 150 may comprise metal materials such as copper, aluminum, tungsten, combinations thereof, or the like, and may be formed using PVD, CVD, ALD, or the like. In some embodiments, the source/drain vias 150 may further comprise one or more barrier/adhesion layers (not shown) to protect the ILD layer 148 and/or the MCESL 146 from metal diffusion (e.g., copper diffusion). The one or more barrier/adhesion layers may comprise titanium, titanium nitride, tantalum, tantalum nitride, or the like, and may be formed using PVD, CVD, ALD, or the like.

The source/drain vias 150 inherit the geometry of the substantially bowing-free via openings O2, and thus the source/drain vias 150 are also substantially bowing-free. Stated differently, sidewalls of the source/drain vias 150 extend linearly through an entire thickness of the ILD layer 148 and an entire thickness of the MCESL 146, and no or negligible bowing exists. In greater detail, a source/drain via 150 forms a first linear interface 1501 with the ILD layer 148, and a second liner interface 1502 with the MCESL 146. The second linear interface 1502 extends downwards from the first linear interface 1501, and the linear interfaces 1501 and 1502 are aligned with each other in some embodiments as depicted in FIG. 20A. In some embodiments, the second interface 1502 includes an upper interface 1503 formed between the source/drain via 150 and the oxidized sidewall portion 1461*s*, and a lower interface 1504 formed between the source/drain via 150 and the un-oxidized region 1462. The lower interface 1504 extends downwards from the upper interface 1503. In some embodiments as depicted in FIG. 20A, lower interface 1504 is aligned with the upper interface 1503. However, in some other embodiments, lower interface 1504 may be slightly laterally set back (as indicated in dash line DL3) from the upper interface 1503, because in the previous processing the LRM etching process ET2 may cause more lateral etching in the un-oxidized region 1462 than in the oxidized sidewall portion 1461*s*. Even in this scenario the source/drain vias 150 still have alleviated bowing defect compared with the case where no oxidized sidewall portion 1461*s* is formed, because the bowing profile is localized to the lower interface 1504 between the source/drain via 150 and the un-oxidized region 1462.

Figure 20B:
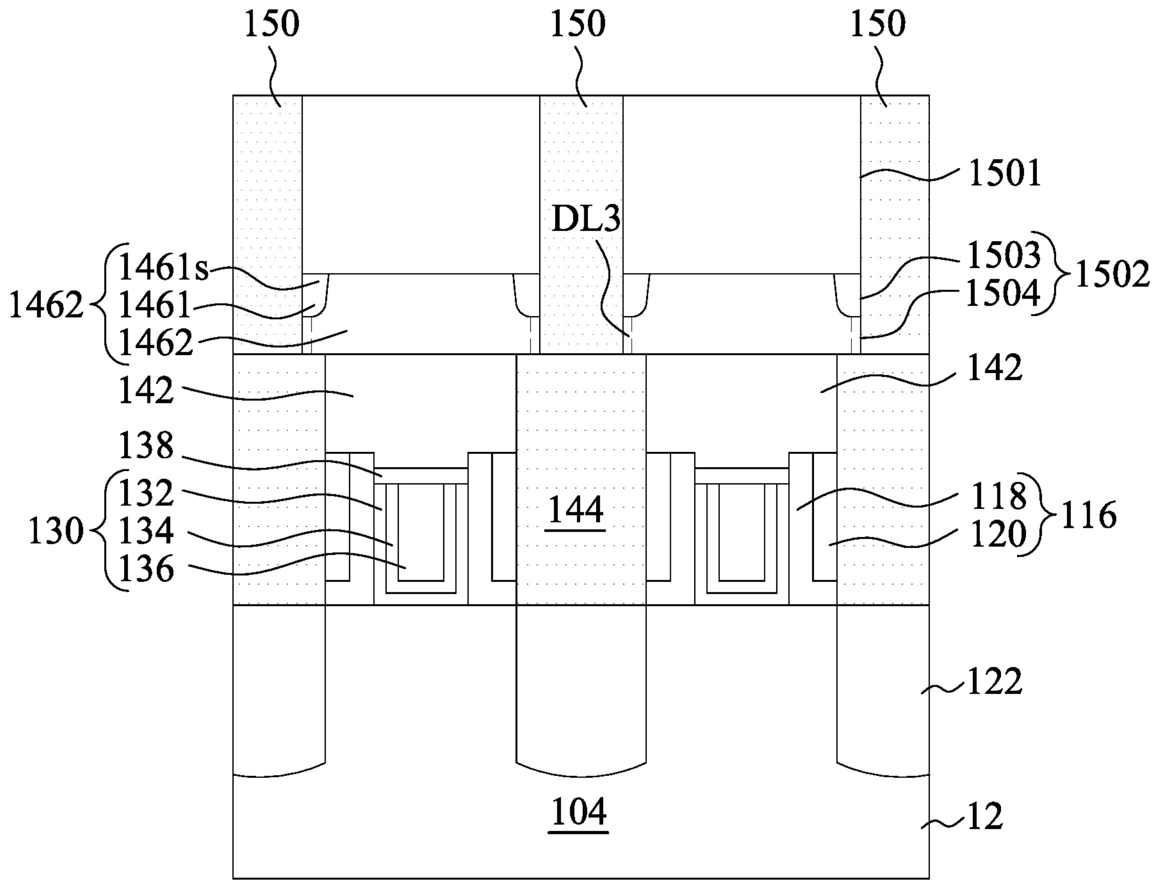

In some embodiments as depicted in FIG. 20A, the source/drain vias 150 have tapered sidewall profile due to the nature of anisotropic etching of the LRM etching process ET2. However, in some other embodiments, the etching conditions of the LRM etching process ET2 may be fine-tuned to allow the via openings O2 and hence the source/drain vias 150 with vertical sidewall profile, as illustrated in FIG. 20B.

FIGS. 21-26 illustrate exemplary cross sectional views of various stages for manufacturing an integrated circuit structure 100*a* according to some other embodiments of the present disclosure. It is understood that additional operations can be provided before, during, and after processes shown by FIGS. 21-26, and some of the operations described below can be replaced or eliminated, for additional embodiments of the method. The order of the operations/processes may be interchangeable. The same or similar configurations, materials, processes and/or operation as described with FIGS. 1-20B may be employed in the following embodiments, and the detailed explanation may be omitted.

Figure 21:
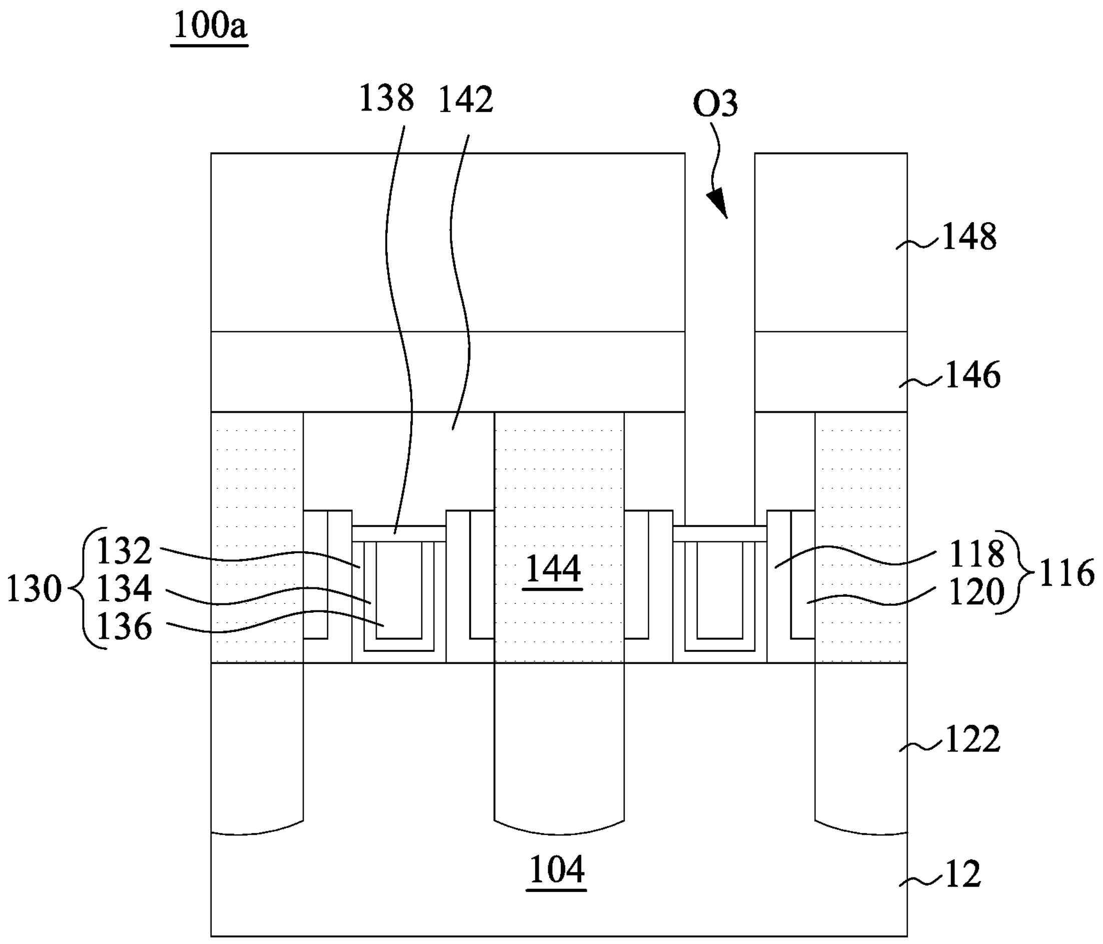
FIGS. 21-26 illustrate exemplary cross sectional views of various stages for manufacturing an integrated circuit structure according to some other embodiments of the present disclosure.

After the structure as shown in FIG. 14 is formed, the ILD layer 148 is patterned to form a gate contact opening O3 extending downward through the ILD layer 148, the MCESL 146 and the dielectric cap 142 to the metal cap 138. The resulting structure is illustrated in FIG. 21. The ILD layer 148 can be patterned by using suitable photolithography and etching techniques.

Figure 22:
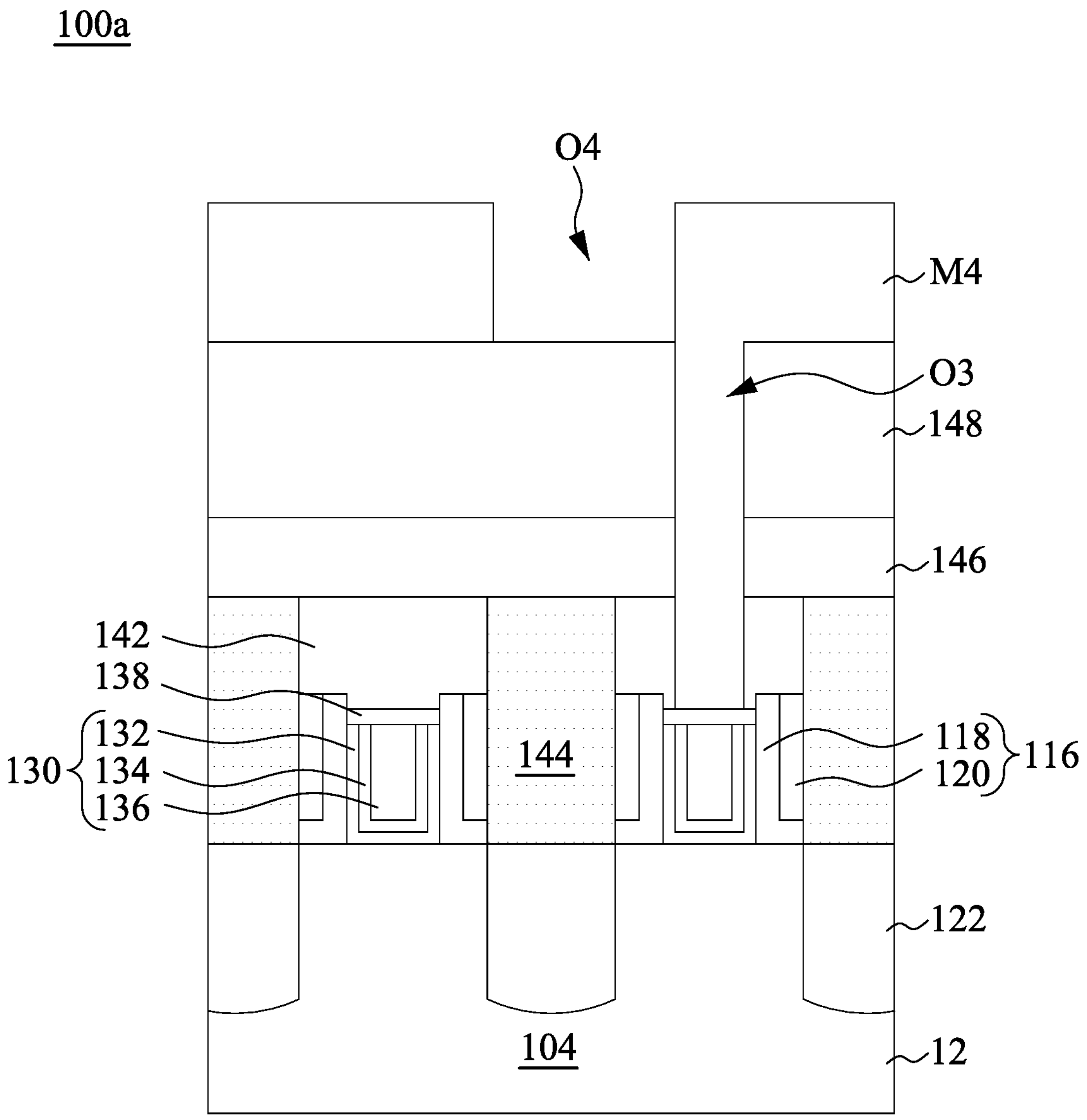

Next, as illustrated in FIG. 22, a patterned mask layer M4 is formed over the substrate 12 to fill the gate contact opening O3. The patterned mask layer M4 has an opening O4 directly above a source/drain contact 144. In some embodiments, the patterned mask layer M4 may be a photoresist mask formed by suitable photolithography process. For example, the photolithography process may include spin-on coating a photoresist layer over the structure as illustrated in FIG. 21, performing post-exposure bake processes, and developing the photoresist layer to form the patterned mask layer M4. In some embodiments, patterning the resist to form the patterned mask element may be performed using an electron beam (e-beam) lithography process or an extreme ultraviolet (EUV) lithography process.

Figure 23:
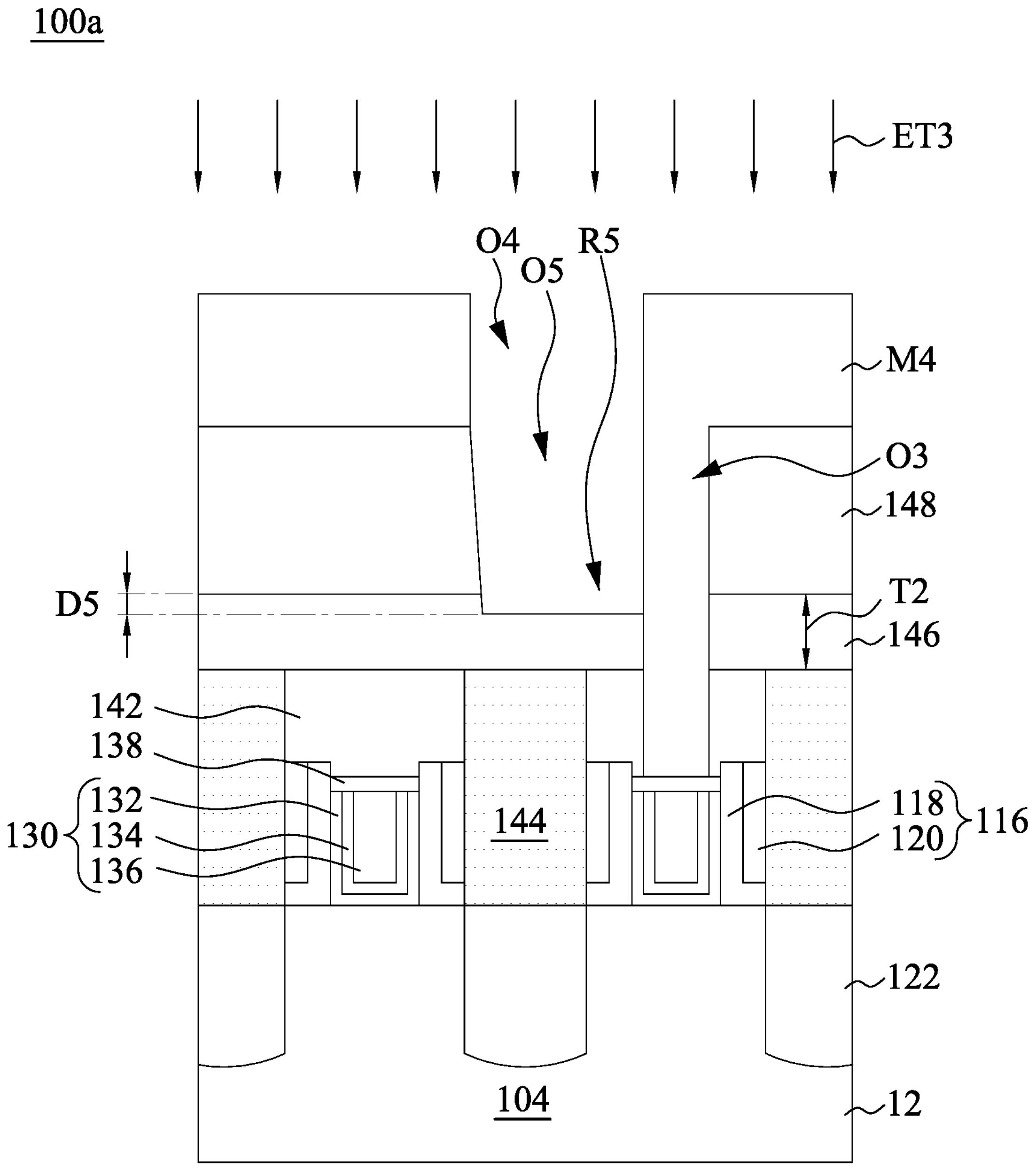

Referring to FIG. 23, with the patterned mask layer M4 in place, a via etching process ET3 is performed to form a via opening O5 extending through the ILD layer 148. The etching duration time of the via etching process ET3 is controlled to remove a portion of the MCESL 146 but not punch through the MCESL 146. As a result of this via etching process ET3, a recess R5 is formed below the via opening O5, extending in the MCESL 146 but not through an entire thickness of the MCESL 146. Formation of the recess R5 allows for oxidizing a sidewall of the MCESL 146 in subsequent processing, which in turn will inhibit or slow down lateral etching in subsequent LRM etching. Process details about the via etching process ET3 are discussed previously with respect to the via etching process ET1, and thus they are not repeated herein for the sake of brevity.

In some embodiments, a ratio of the depth D5 of the recess R5 to the thickness T2 of the MCESL 146 is in a range from about 2:9 to about 7:9, e.g., about 5:9. If the ratio of the recess depth D5 to MCESL thickness T2 is excessively small, oxidized sidewall formed in subsequent treatment may be too small to inhibit lateral etching in the following LRM etching process. If the ratio of the recess depth D5 to MCESL thickness T2 is excessively large, the MCESL 146 and the underlying source/drain contacts 144 may be over-etched.

Figure 24:
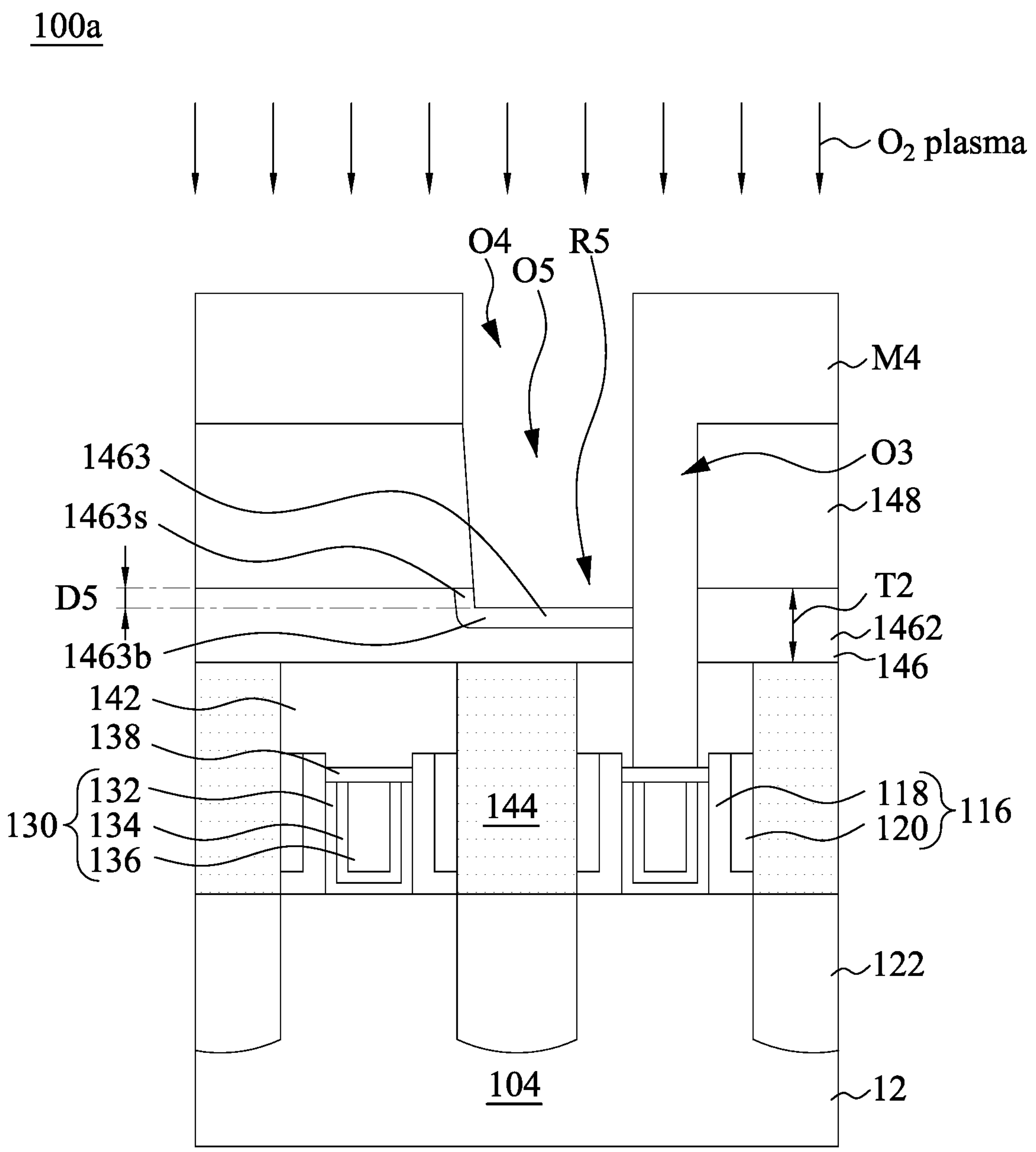

After the via etching process ET3 has been completed, the exposed portions of the MCESL layer 146 is treated in an oxygen-containing environment, so that surface layers of the exposed portions of the MCESL 146 are oxidized to form an oxidized region 1463 in the MCESL layer 146, while leaving a remaining region 1462 of the MCESL layer 146 un-oxidized. The resulting structure is illustrated in FIG. 24. The treatment step may include an $O_2$ plasma treatment, wherein the oxygen-containing gas is conducted into a process chamber, in which the plasma is generated from the oxygen-containing gas. Process details about the $O_2$ plasma treatment are discussed previously with respect to FIG. 16A, and thus they are not repeated herein for the sake of brevity.

As a result of the $O_2$ plasma treatment, oxidation occurs in a bottom surface and a sidewall of recesses R5 in the MCESL 146, thus resulting in the oxidized region 1463 having an oxidized bottom portion 1463*b* and an oxidized sidewall portion 1463*s* extending upwards from the oxidized bottom portion 1463*b*. As illustrated in the cross-sectional view of FIG. 24, the oxidized sidewall portion 1463*s* is on a first side (e.g., left side in the drawing) of the oxidized bottom portion 1463*b* but absent from a second side (e.g., right side in the drawing) of the oxidized bottom portion 1463*b*, because the second side of the oxidized bottom portion 1463*b* abuts the pattered mask layer M4.

In some embodiments, the oxidized bottom portion 1463*b* and the oxidized sidewall portion 1463*s* have same thickness. In some other embodiments, the oxidized sidewall portion 1463*s* has a thicker thickness than the oxidized bottom portion 1463*b*. Thicker oxidized sidewall portion 1463*s* allows for higher etch resistance against the subsequent LRM etching. Thinner oxidized bottom portion 1463*b* allows for shortened LRM etching duration time. In some embodiments, the oxidized sidewall portion 1463*s* has a thickness gradient from bottom to top. For example, the oxidized sidewall portion 1463*s* may be thicker in the top and thinner in the bottom.

In some embodiments, the oxidized region 1463 may have an oxygen concentration gradient due to the plasma treatment. For example, the oxygen atomic percentage in the oxidized region 1463 may decrease as a distance from the recess R5's surface increases. In greater detail, the oxidized sidewall portion 1463*s* has an oxygen atomic percentage decreasing as a distance from a sidewall of the recess R5 increases, and the oxidized bottom portion 1463*b* has an oxygen atomic percentage decreasing as a distance from a bottom surface of the recess R5 increases. In some embodiments where the MCESL 146 is silicon nitride, the oxygen-to-nitrogen atomic ratio in the oxidized region may decrease as a distance from the recess R5's surface increases. In greater detail, the oxidized sidewall portion 1463*s* may have an oxygen-to-nitrogen atomic ratio decreasing as a distance from a sidewall of the recess R5 increases, and the oxidized bottom portion 1463*b* has an oxygen-to-nitrogen atomic ratio decreasing as a distance from a bottom surface of the recess R5 increases.

In some embodiments, the $O_2$ plasma treatment may cause plasma ash on the patterned mask layer M4, which in turn may trim the patterned mask layer M4. As a result, the $O_2$ plasma treatment conditions (e.g., treatment duration time, RF power, pressure, and so on) are controlled to allows for formation of the oxidized region 1463 in the MCESL 146 as well as negligible loss in the patterned mask layer M4. The negligible loss means that a size variation of the opening O4 in the patterned mask layer M4 is less than about 10%.

Figure 25:
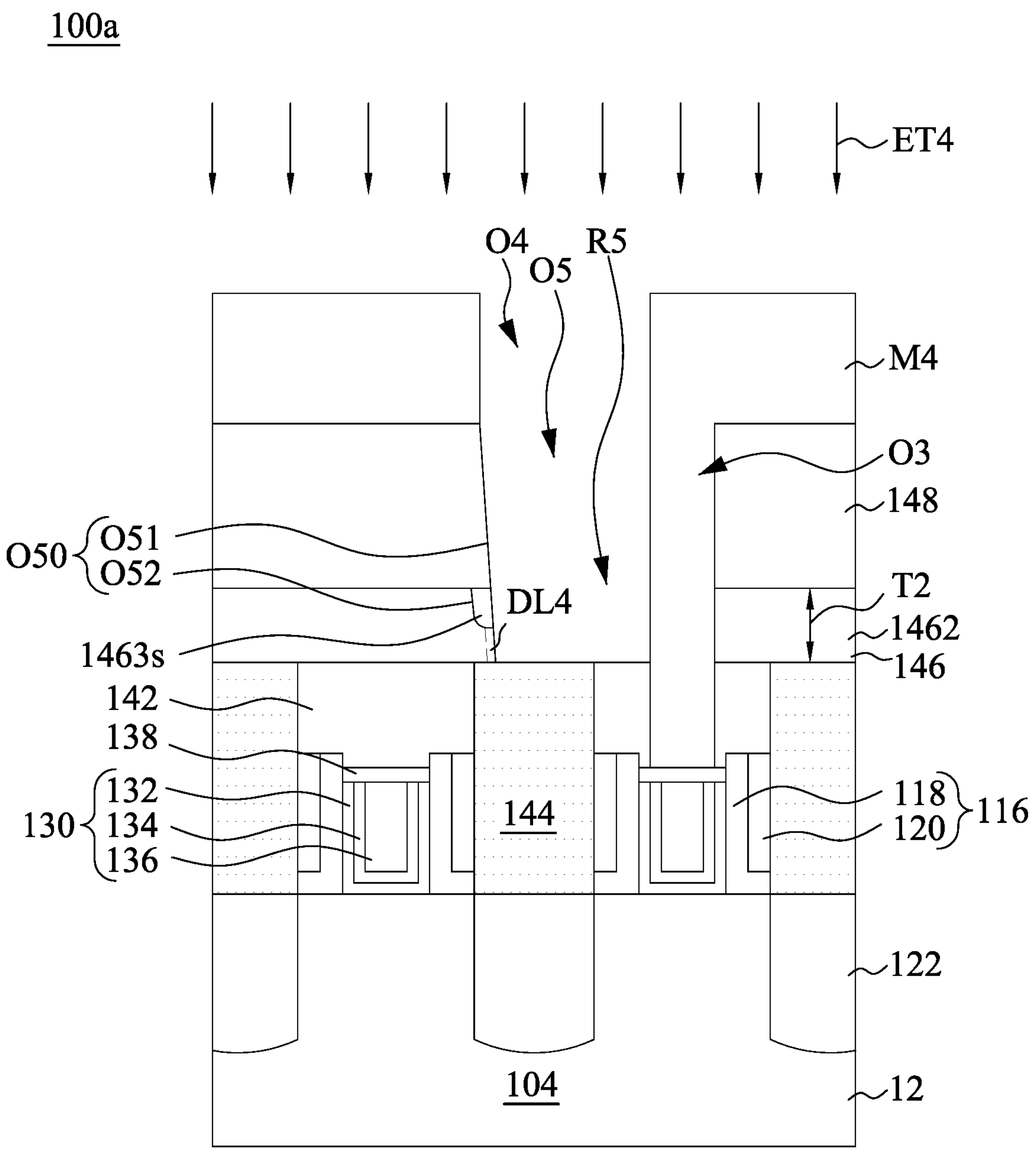

Referring to FIG. 25, an LRM etching process ET4 is performed to break through the MCESL 146, thus deepening the via opening O5 down to the source/drain contact 144 and a portion of the dielectric cap 142 between source/drain contact 144 and the patterned mask layer M4. As a result of the LRM etching process ET4, the source/drain contact 144 and the dielectric cap 142 get exposed at bottoms of the deepened via openings O5. Process details about the LRM etching process ET4 are discussed previously with respect to the LRM etching process ET2, and thus they are not repeated herein for the sake of brevity.

Because the oxidized sidewall portion 1463*s* inhibits or slows down the lateral etching during the LRM etching process ET4, the sidewall O50 of the via opening O5 extends linearly through an entire thickness of the ILD layer 148 and an entire thickness of the MCESL 146, and no or negligible bowing occurs. In greater detail, the ILD layer 148 has a linear sidewall O51 defining an upper part of a via opening O5 and the MCESL 146 also has a linear sidewall O52 defining a lower part of the via opening O5, and the linear sidewalls O51 and O52 are aligned with each other. In some embodiments, the linear sidewall O52 of the MCESL 146 has a sidewall of the oxidized sidewall portion 1463*s* extending downwards from the linear sidewall O51 of the ILD layer 148, and a sidewall of the un-oxidized region 1462 extending downwards from the sidewall of the oxidized sidewall portion 1463*s*. In some embodiments as depicted in FIG. 25, the sidewall of the un-oxidized region 1462 is aligned with the sidewall of the oxidized sidewall portion 1463*s*. However, in some other embodiments, the sidewall of the un-oxidized region 1462 may be slightly laterally set back (as indicated in dash line DL4) from the sidewall of the oxidized sidewall portion 1463*s*, because the LRM etching process ET4 may cause more lateral etching in the un-oxidized region 1462 than in the oxidized sidewall portion 1463*s*. Even in this scenario the via opening O5 still has alleviated bowing defect compared with the case where no oxidized sidewall portion 1463*s* is formed, because the bowing profile is localized to below the oxidized sidewall portion 1463*s*.

Figure 26:
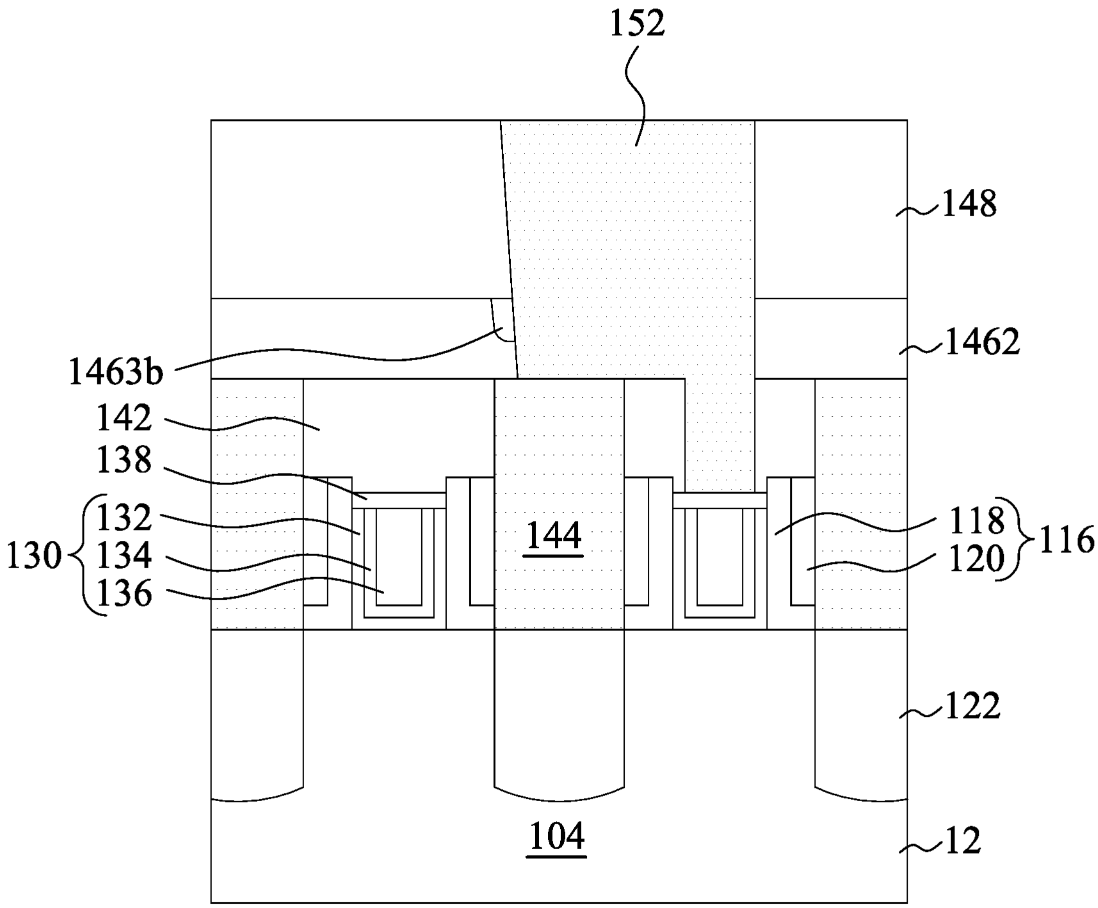

After the LRM etching process ET4 is completed, the patterned mask layer M4 is removed from the gate contact opening O3 by ashing and/or wet stripping, and then a butted contact 152 is formed to fill both the via opening O5 and the gate contact opening O3. The resulting structure is illustrated in FIG. 26. The gate structure 130 is electrically coupled to the source/drain epitaxy structure 122 through the source/drain contact 144, the butted contact 152, and the metal cap 138. Materials and fabrication process details about the butted contact 152 are similar to that about the source/drain vias 150, and thus they are not repeated herein for the sake of brevity.

FIGS. 27 through 45B illustrate perspective views and cross-sectional views of intermediate stages in the formation of an integrated circuit structure 200 in accordance with some embodiments of the present disclosure. The formed transistors may include a p-type transistor (such as a p-type GAA FET) and an n-type transistor (such as an n-type FAA FET) in accordance with some exemplary embodiments. Throughout the various views and illustrative embodiments, like reference numbers are used to designate like elements. It is understood that additional operations can be provided before, during, and after the processes shown by FIGS. 27 through 45B, and some of the operations described below can be replaced or eliminated, for additional embodiments of the method. The order of the operations/processes may be interchangeable.

FIGS. 27, 28, 29, 30A, 31A, 32A, and 33A are perspective views of some embodiments of the integrated circuit structure 200 at intermediate stages during fabrication. FIGS. 30B, 31B, 32B, 33B, 34-36, 37A, 38-45B are cross-sectional views of some embodiments of the integrated circuit structure 200 at intermediate stages during fabrication along a first cut (e.g., cut X-X in FIG. 30A), which is along a lengthwise direction of the channel and perpendicular to a top surface of the substrate. FIG. 37B is a cross-sectional view of some embodiments of the integrated circuit structure 200 at intermediate stages during fabrication along a second cut (e.g., cut Y-Y in FIG. 30A), which is in the gate region and perpendicular to the lengthwise direction of the channel.

Figure 27:
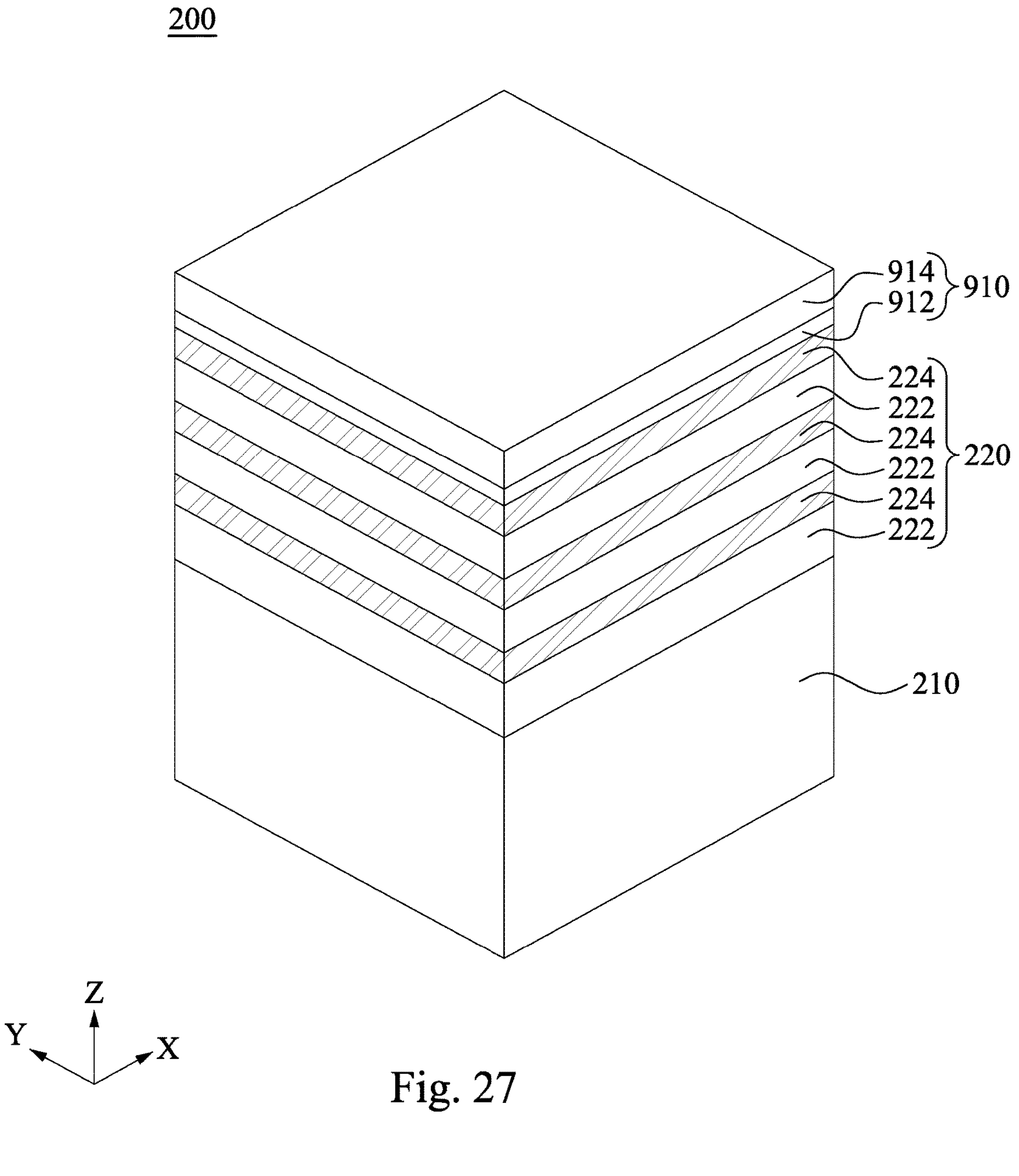
FIGS. 27-45B illustrate perspective views and cross-sectional views of intermediate stages in the formation of an integrated circuit structure in accordance with some embodiments of the present disclosure.

Referring to FIG. 27, an epitaxial stack 220 is formed over the substrate 210. In some embodiments, the substrate 210 may include silicon (Si). Alternatively, the substrate 210 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 220 includes epitaxial layers 222 of a first composition interposed by epitaxial layers 224 of a second composition. The first and second compositions can be different. In some embodiments, the epitaxial layers 222 are SiGe and the epitaxial layers 224 are silicon (Si). However, other embodiments are possible including those that provide for a first composition and a second composition having different oxidation rates and/or etch selectivity. In some embodiments, the epitaxial layers 222 include SiGe and where the epitaxial layers 224 include Si, the Si oxidation rate of the epitaxial layers 224 is less than the SiGe oxidation rate of the epitaxial layers 222.

The epitaxial layers 224 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 224 to define a channel or channels of a device is further discussed below.

It is noted that three layers of the epitaxial layers 222 and three layers of the epitaxial layers 224 are alternately arranged as illustrated in FIG. 27, which is for illustrative purposes only and not intended to be limiting beyond what is specifically recited in the claims. It can be appreciated that any number of epitaxial layers can be formed in the epitaxial stack 220; the number of layers depending on the desired number of channels regions for the transistor. In some embodiments, the number of epitaxial layers 224 is between 2 and 10.

As described in more detail below, the epitaxial layers 224 may serve as channel region(s) for a subsequently-formed multi-gate device and the thickness is chosen based on device performance considerations. The epitaxial layers 222 in channel regions(s) may eventually be removed and serve to define a vertical distance between adjacent channel region(s) for a subsequently-formed multi-gate device and the thickness is chosen based on device performance considerations. Accordingly, the epitaxial layers 222 may also be referred to as sacrificial layers, and epitaxial layers 224 may also be referred to as channel layers.

By way of example, epitaxial growth of the layers of the stack 220 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 224 include the same material as the substrate 210. In some embodiments, the epitaxially grown layers 222 and 224 include a different material than the substrate 210. As stated above, in at least some examples, the epitaxial layers 222 include an epitaxially grown silicon germanium (SiGe) layer and the epitaxial layers 224 include an epitaxially grown silicon (Si) layer. Alternatively, in some embodiments, either of the epitaxial layers 222 and 224 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 222 and 224 may be chosen based on providing differing oxidation and/or etching selectivity properties. In some embodiments, the epitaxial layers 222 and 224 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Figure 28:
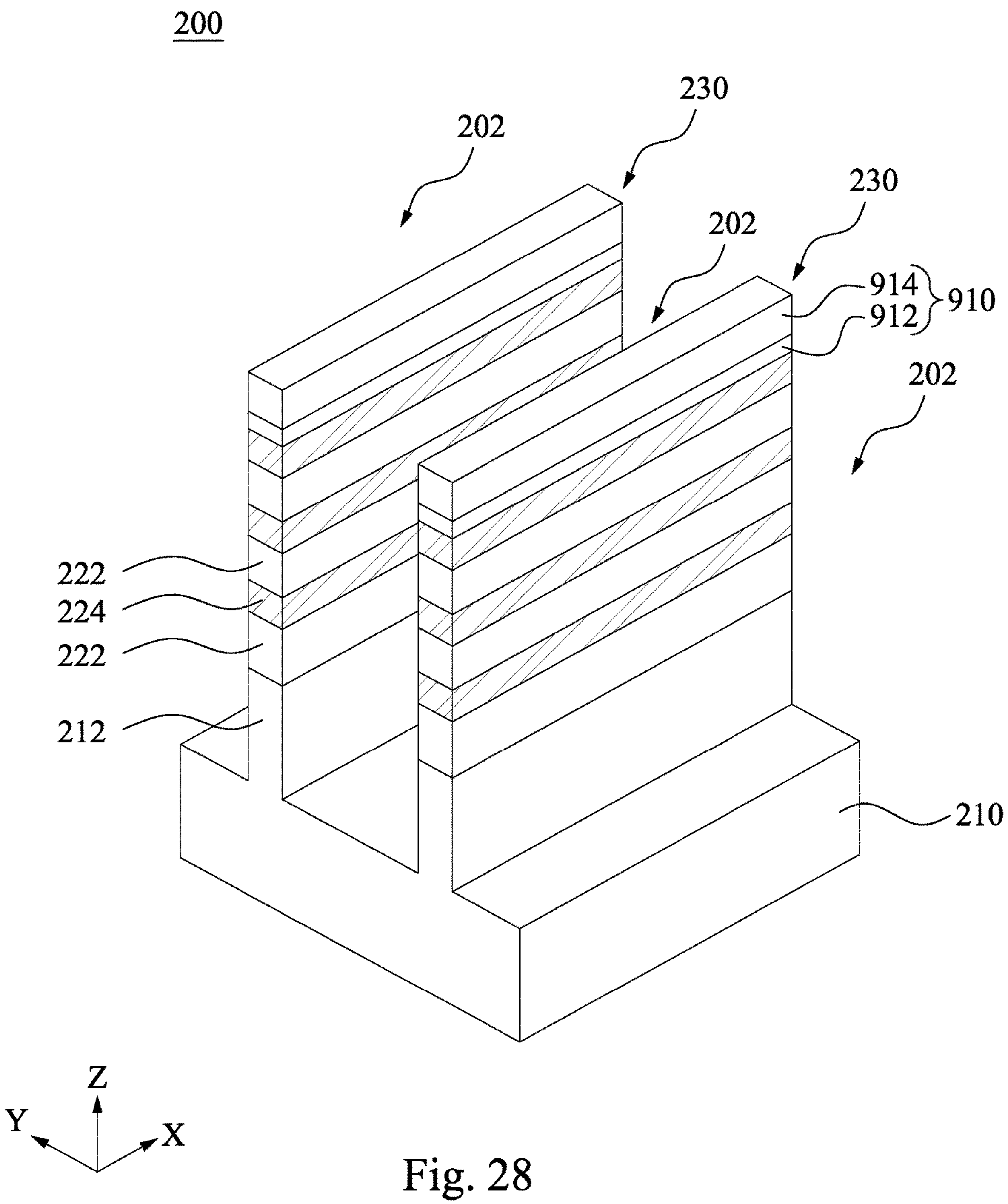

Referring to FIG. 28, a plurality of semiconductor fins 230 extending from the substrate 210 are formed. In various embodiments, each of the fins 230 includes a substrate portion 212 formed from the substrate 210 and portions of each of the epitaxial layers of the epitaxial stack including epitaxial layers 222 and 224. The fins 230 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 230 by etching initial epitaxial stack 220. The etching process can include dry etching, wet etching, reactive ion etching (RIE), and/or other suitable processes.

In the illustrated embodiment as illustrated in FIGS. 27 and 28, a hard mask (HM) layer 910 is formed over the epitaxial stack 220 prior to patterning the fins 230. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 220 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 230 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-200 nm. The patterned mask may then be used to protect regions of the substrate 210, and layers formed thereupon, while an etch process forms trenches 202 in unprotected regions through the HM layer 910, through the epitaxial stack 220, and into the substrate 210, thereby leaving the plurality of extending fins 230. The trenches 202 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 220 in the form of the fins 230.

Figure 29:
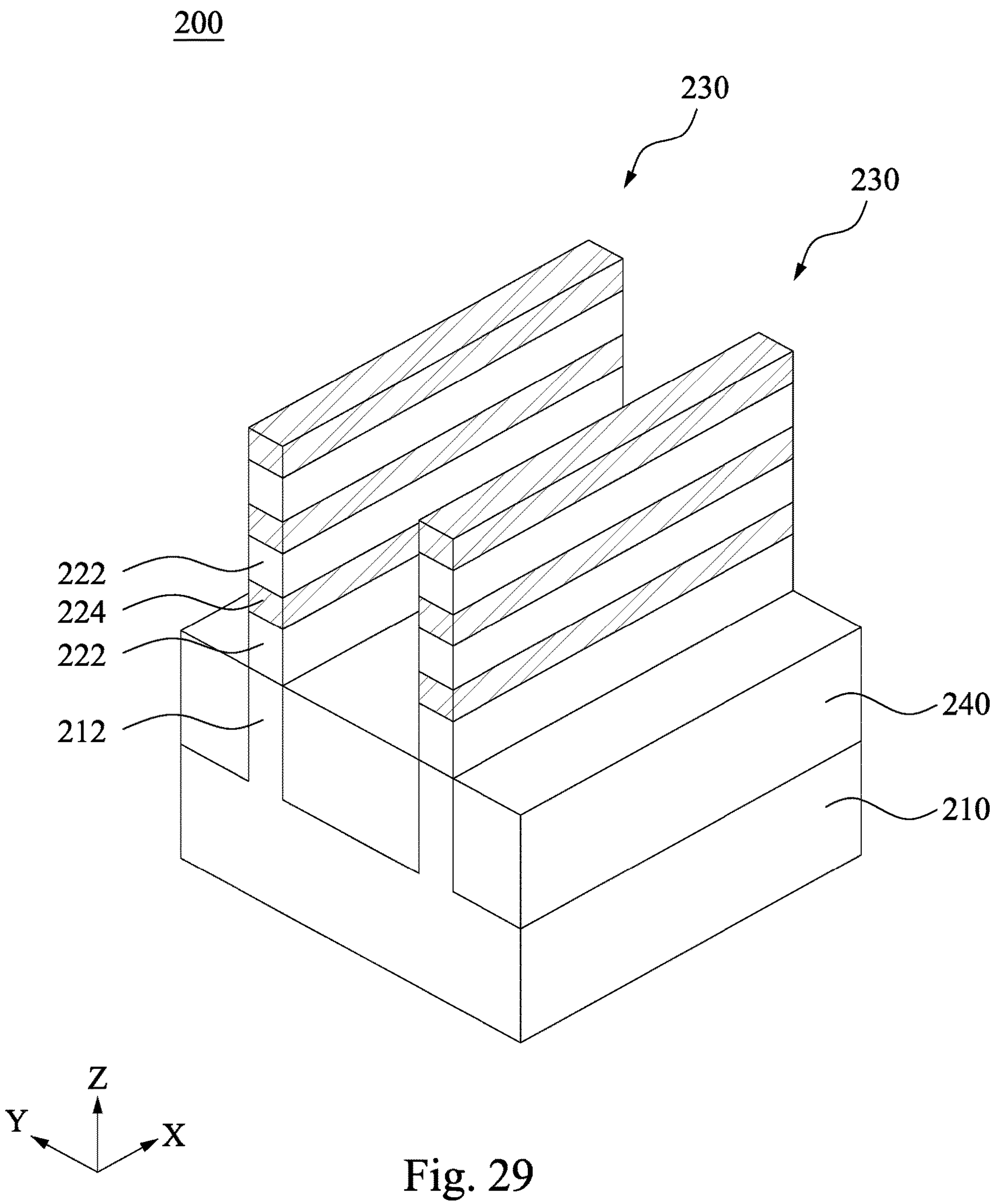

Next, as illustrated in FIG. 29, STI regions 240 are formed interposing the fins 230. Materials and process details about the STI regions 240 are similar to that of the STI regions 14 discussed previous, and thus they are not repeated for the sake of brevity.

Figure 30A:
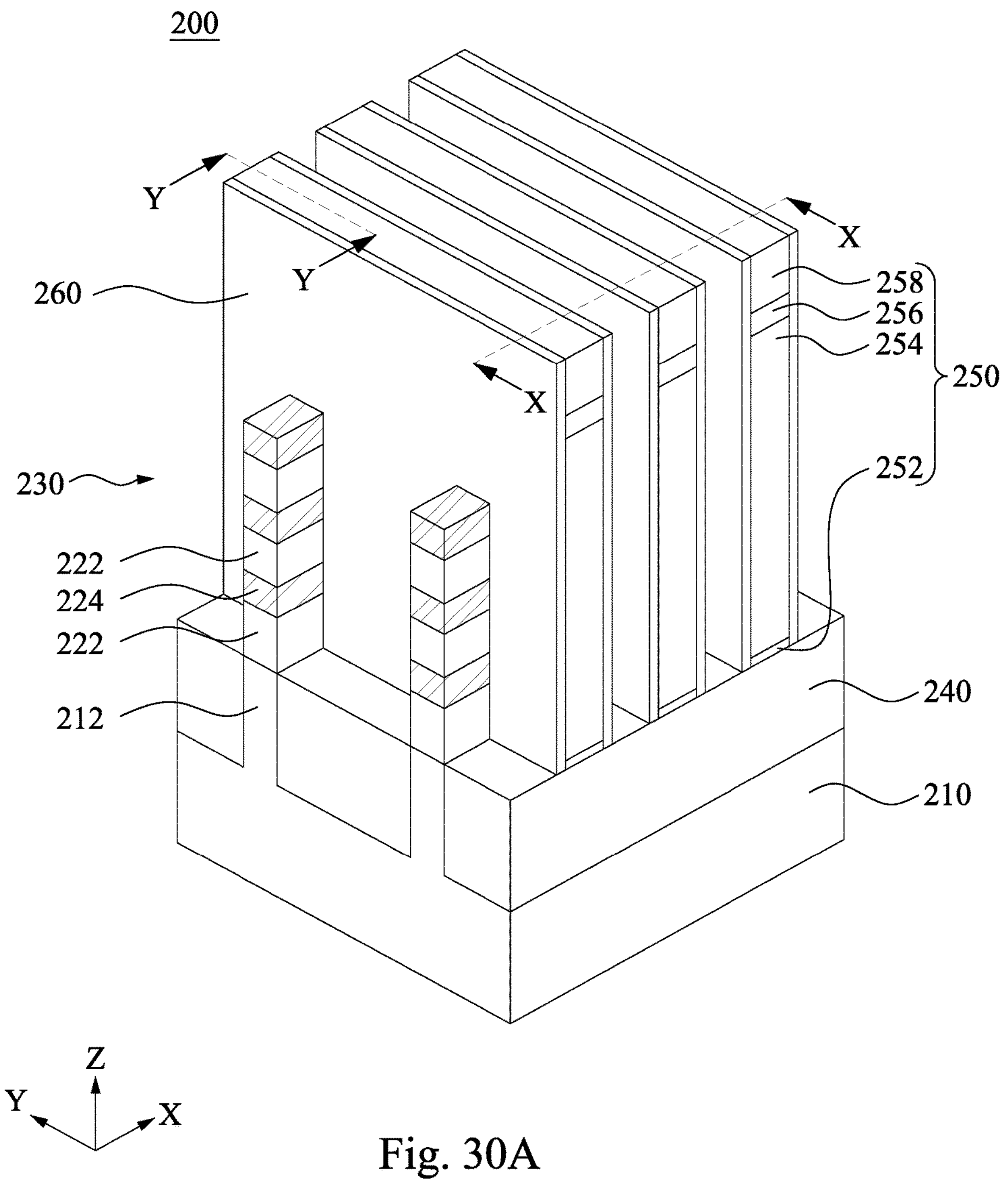
Figure 30B:
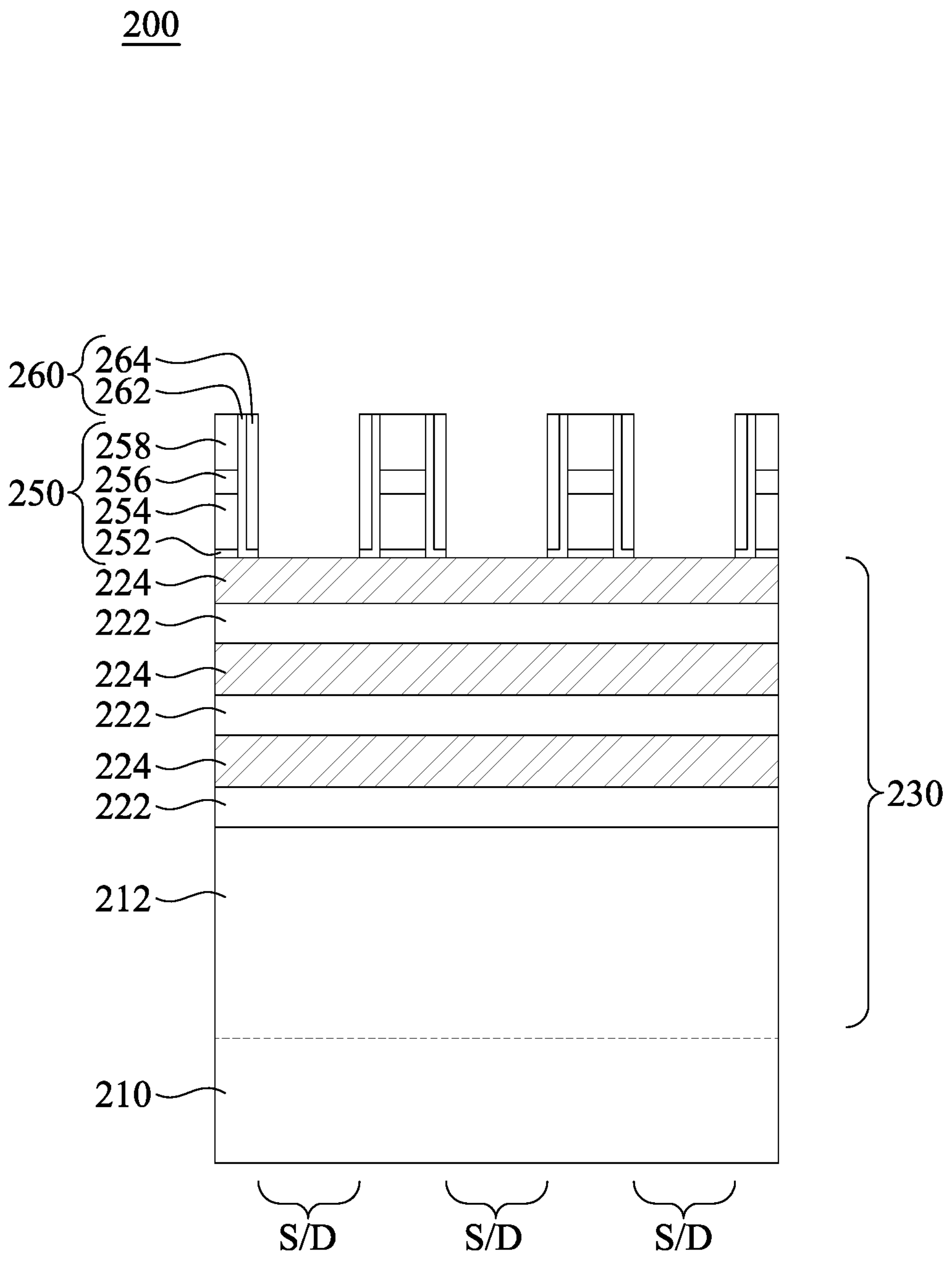

Reference is made to FIGS. 30A and 30B. Dummy gate structures 250 are formed over the substrate 210 and are at least partially disposed over the fins 230. The portions of the fins 230 underlying the dummy gate structures 250 may be referred to as the channel region. The dummy gate structures 250 may also define source/drain (S/D) regions of the fins 230, for example, the regions of the fins 230 adjacent and on opposing sides of the channel regions.

Dummy gate formation step first forms a dummy gate dielectric layer 252 over the fins 230. Subsequently, a dummy gate electrode layer 254 and a hard mask which may include multiple layers 256 and 258 (e.g., an oxide layer 256 and a nitride layer 258) are formed over the dummy gate dielectric layer 252. The hard mask is then patterned, followed by patterning the dummy gate electrode layer 252 by using the patterned hard mask as an etch mask. In some embodiments, after patterning the dummy gate electrode layer 254, the dummy gate dielectric layer 252 is removed from the S/D regions of the fins 230. The etch process may include a wet etch, a dry etch, and/or a combination thereof. The etch process is chosen to selectively etch the dummy gate dielectric layer 252 without substantially etching the fins 230, the dummy gate electrode layer 254, the oxide mask layer 256 and the nitride mask layer 258. Materials of the dummy gate dielectric layer and dummy gate electrode layer are similar to that of the dummy gate dielectric layer 108 and dummy gate electrode layer 110 discussed previously, and thus they are not repeated for the sake of brevity.

After formation of the dummy gate structures 250 is completed, gate spacers 260 are formed on sidewalls of the dummy gate structures 250. For example, a spacer material layer is deposited on the substrate 210. The spacer material layer may be a conformal layer that is subsequently etched back to form gate sidewall spacers. In the illustrated embodiment, a spacer material layer 260 is disposed conformally on top and sidewalls of the dummy gate structures 250. The spacer material layer 260 may include a dielectric material such as silicon oxide, silicon nitride, silicon carbide, silicon oxynitride, SiCN films, silicon oxycarbide, SiOCN films, and/or combinations thereof. In some embodiments, the spacer material layer 260 includes multiple layers, such as a first spacer layer 262 and a second spacer layer 264 (illustrated in FIG. 30B) formed over the first spacer layer 262. By way of example, the spacer material layer 260 may be formed by depositing a dielectric material over the dummy gate structures 250 using suitable deposition processes. An anisotropic etching process is then performed on the deposited spacer material layer 260 to expose portions of the fins 230 not covered by the dummy gate structure 250 (e.g., in source/drain regions of the fins 230). Portions of the spacer material layer directly above the dummy gate structure 250 may be completely removed by this anisotropic etching process. Portions of the spacer material layer on sidewalls of the dummy gate structure 250 may remain, forming gate sidewall spacers, which are denoted as the gate spacers 260, for the sake of simplicity. It is noted that although the gate spacers 260 are multi-layer structures in the cross-sectional view of FIG. 30B, they are illustrated as single-layer structures in the perspective view of FIG. 30A for the sake of simplicity.

Figure 31A:
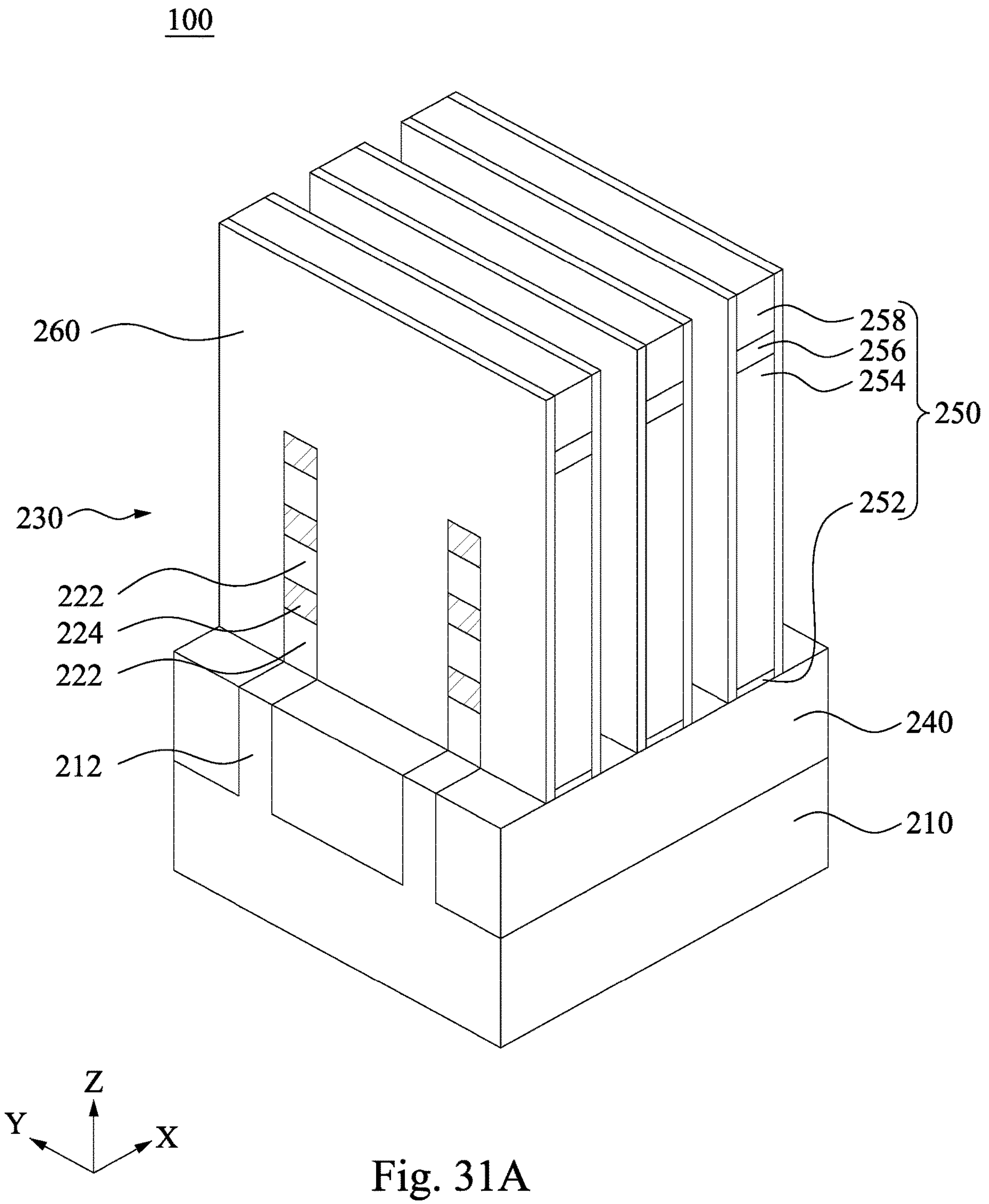
Figure 31B:
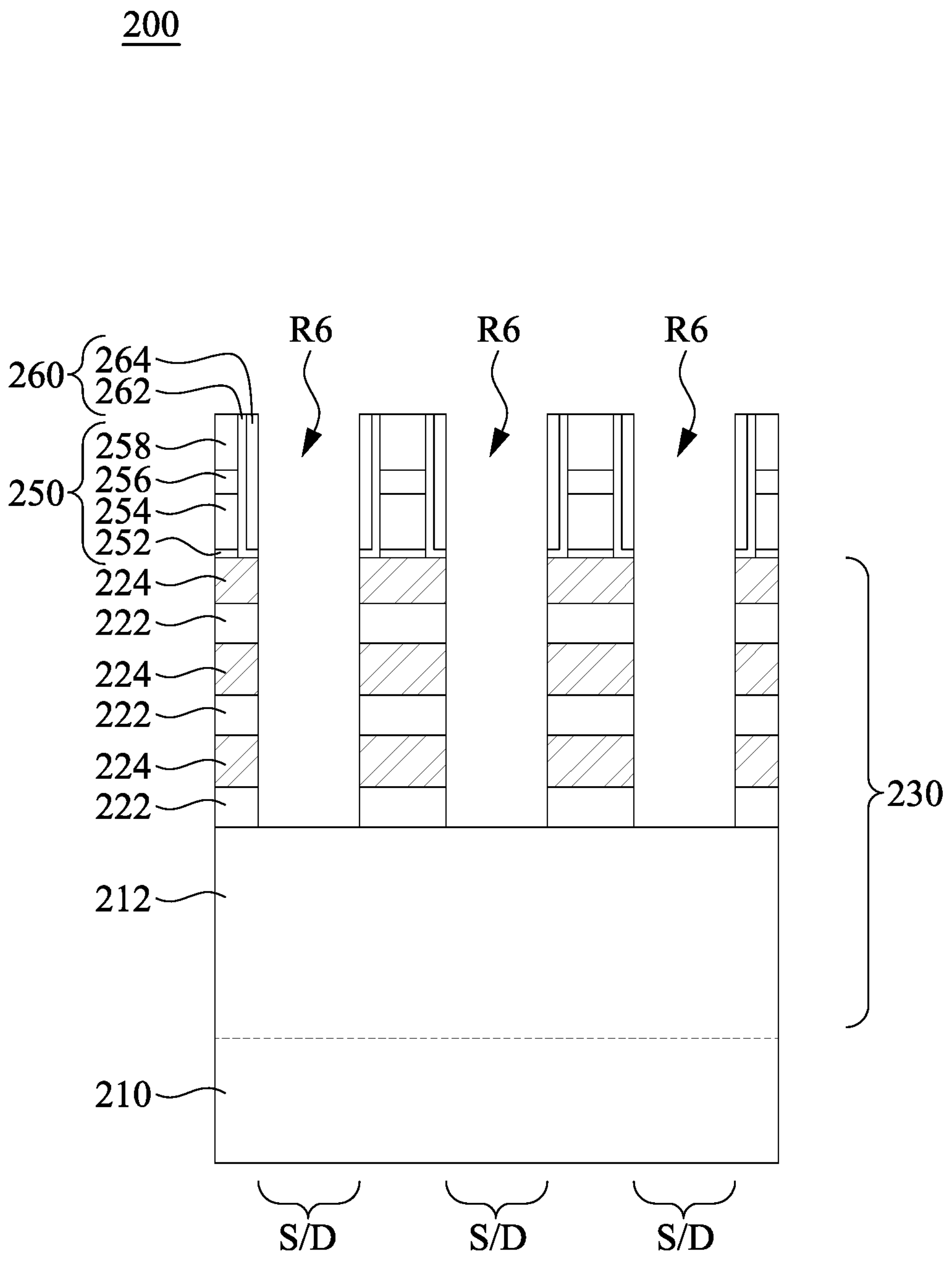

Next, as illustrated in FIGS. 31A and 31B, exposed portions of the semiconductor fins 230 that extend laterally beyond the gate spacers 260 (e.g., in source/drain regions of the fins 230) are etched by using, for example, an anisotropic etching process that uses the dummy gate structure 250 and the gate spacers 260 as an etch mask, resulting in recesses R6 into the semiconductor fins 230 and between corresponding dummy gate structures 250. After the anisotropic etching, end surfaces of the sacrificial layers 222 and channel layers 224 are aligned with respective outermost sidewalls of the gate spacers 260, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 32A:
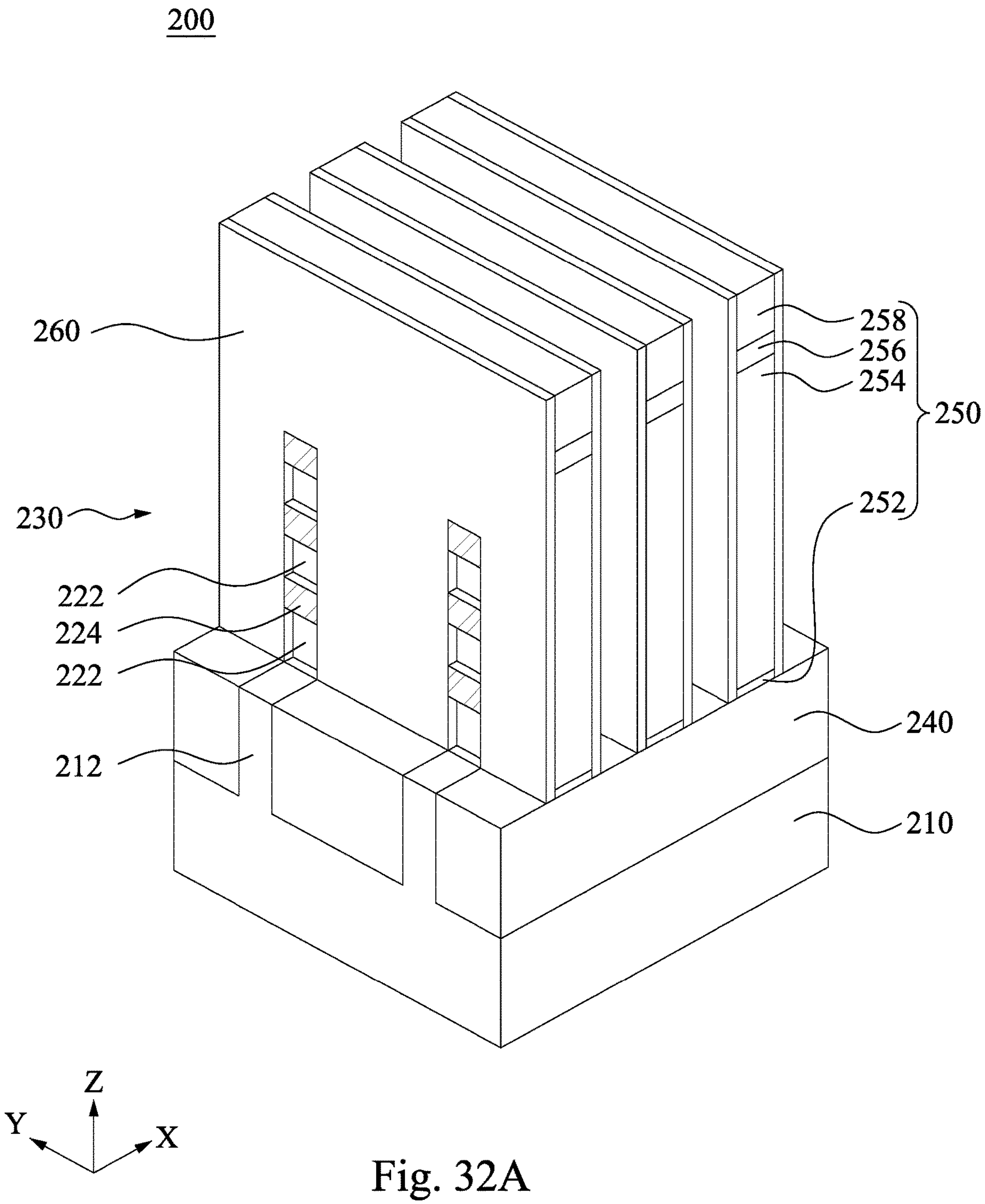
Figure 32B:
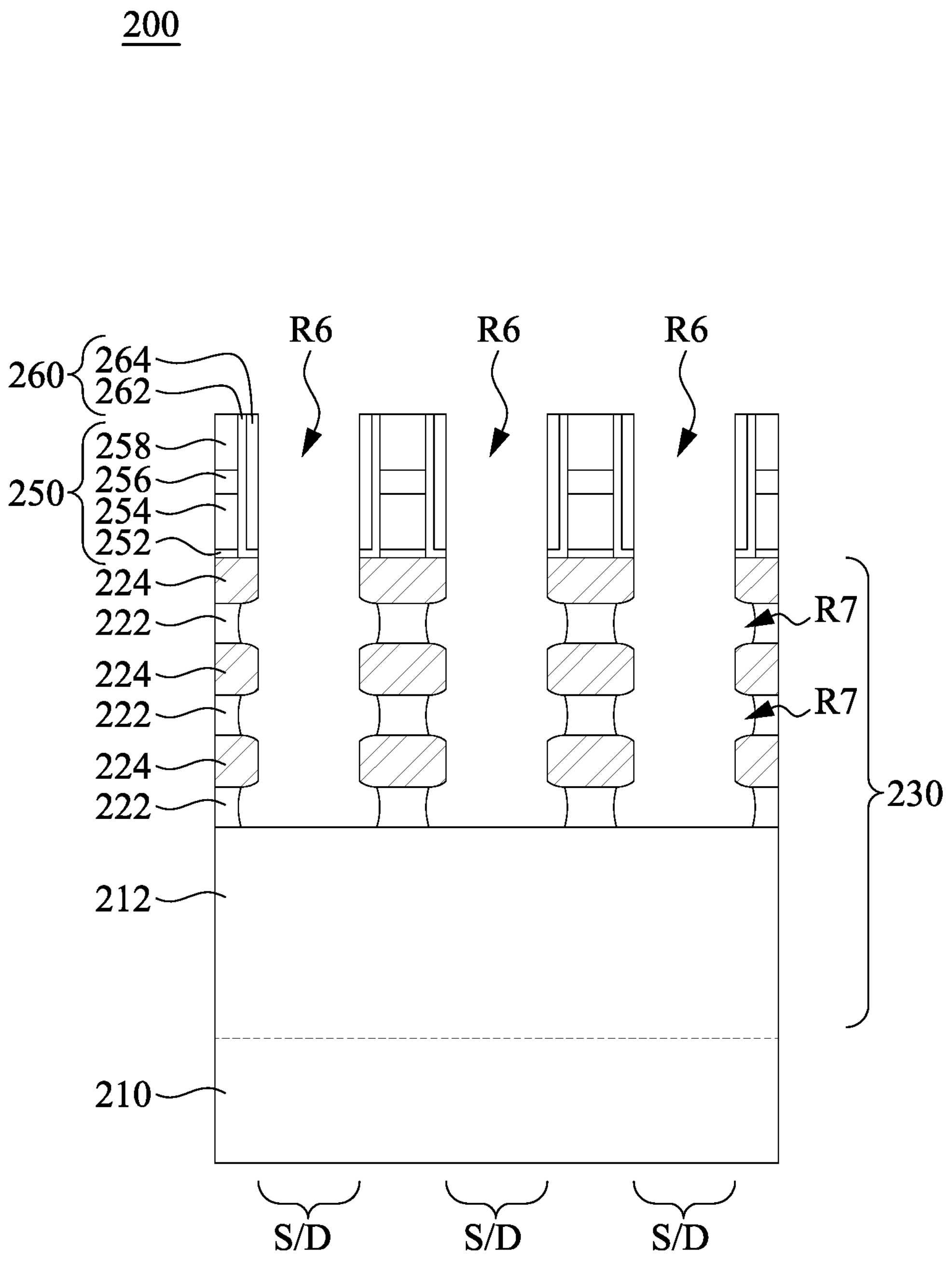

Next, in FIGS. 32A and 32B, the sacrificial layers 222 are laterally or horizontally recessed by using suitable etch techniques, resulting in lateral recesses R7 each vertically between corresponding channel layers 224. This step may be performed by using a selective etching process. By way of example and not limitation, the sacrificial layers 222 are SiGe and the channel layers 224 are silicon allowing for the selective etching of the sacrificial layers 222. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 224 is not significantly etched by the process of laterally recessing the sacrificial layers 222. As a result, the channel layers 224 laterally extend past opposite end surfaces of the sacrificial layers 222.

Figure 33A:
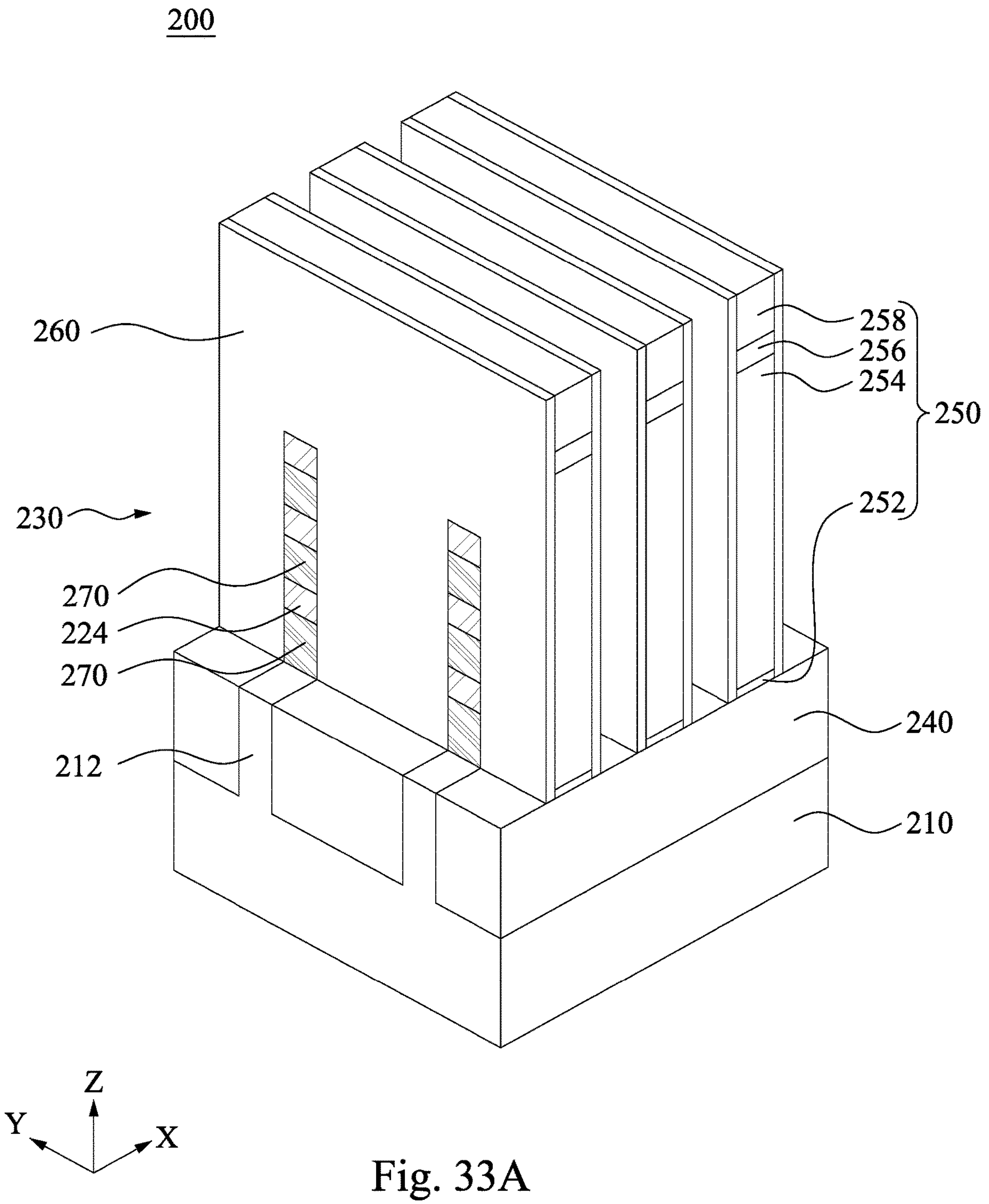
Figure 33B:
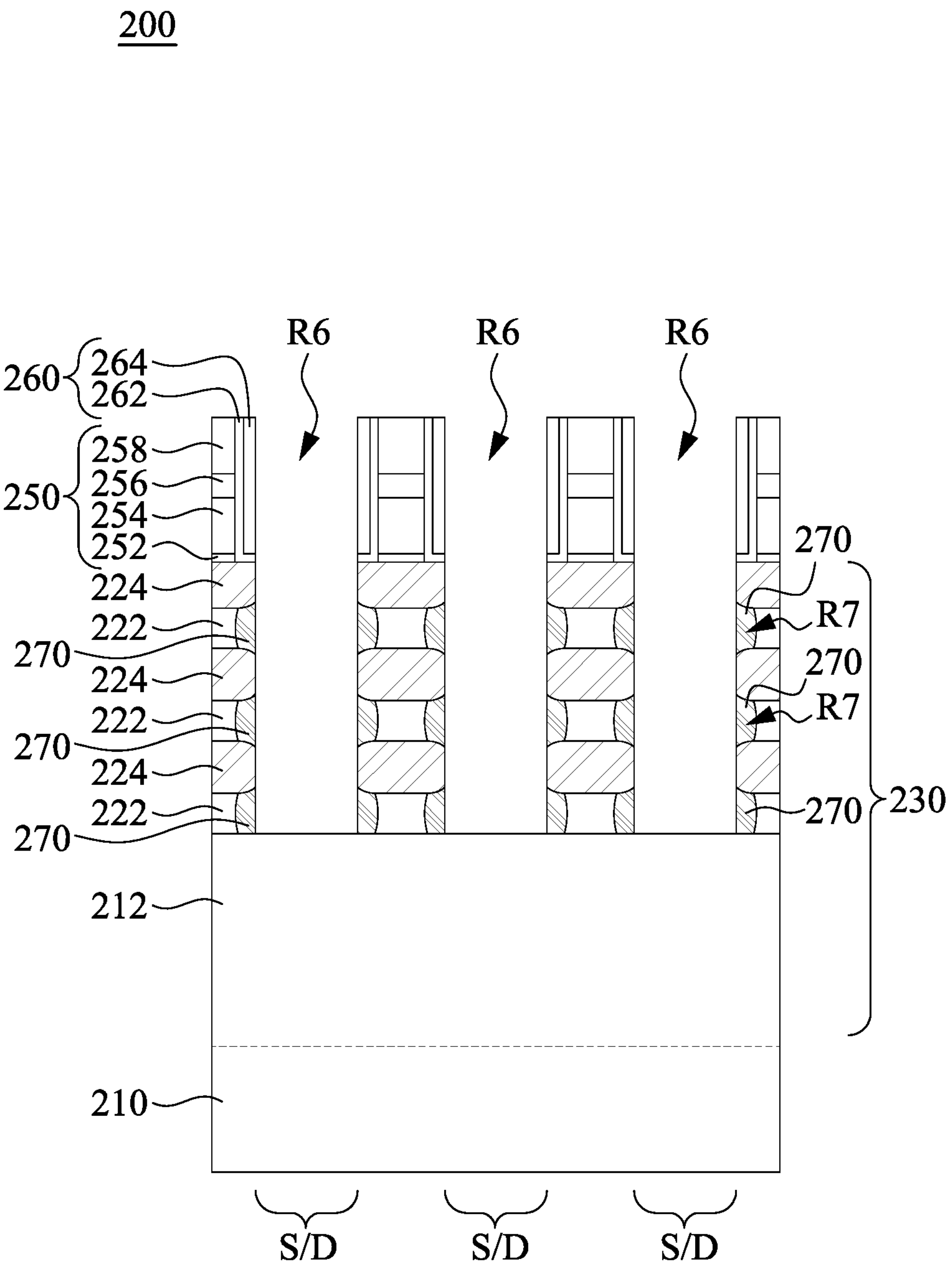

In FIGS. 33A and 33B, an inner spacer material layer 270 is formed to fill the recesses R7 left by the lateral etching of the sacrificial layers 222 discussed above with reference to FIGS. 32A and 32B. The inner spacer material layer 270 may be a low-k dielectric material, such as $SiO_2$, SiN, SiCN, or SiOCN, and may be formed by a suitable deposition method, such as ALD. After the deposition of the inner spacer material layer 270, an anisotropic etching process may be performed to trim the deposited inner spacer material 270, such that only portions of the deposited inner spacer material 270 that fill the recesses R7 left by the lateral etching of the sacrificial layers 222 are left. After the trimming process, the remaining portions of the deposited inner spacer material are denoted as inner spacers 270, for the sake of simplicity. The inner spacers 270 serve to isolate metal gates from source/drain regions formed in subsequent processing. In the example of FIGS. 33A and 33B, sidewalls of the inner spacers 270 are aligned with sidewalls of the channel layers 224.

Figure 34:
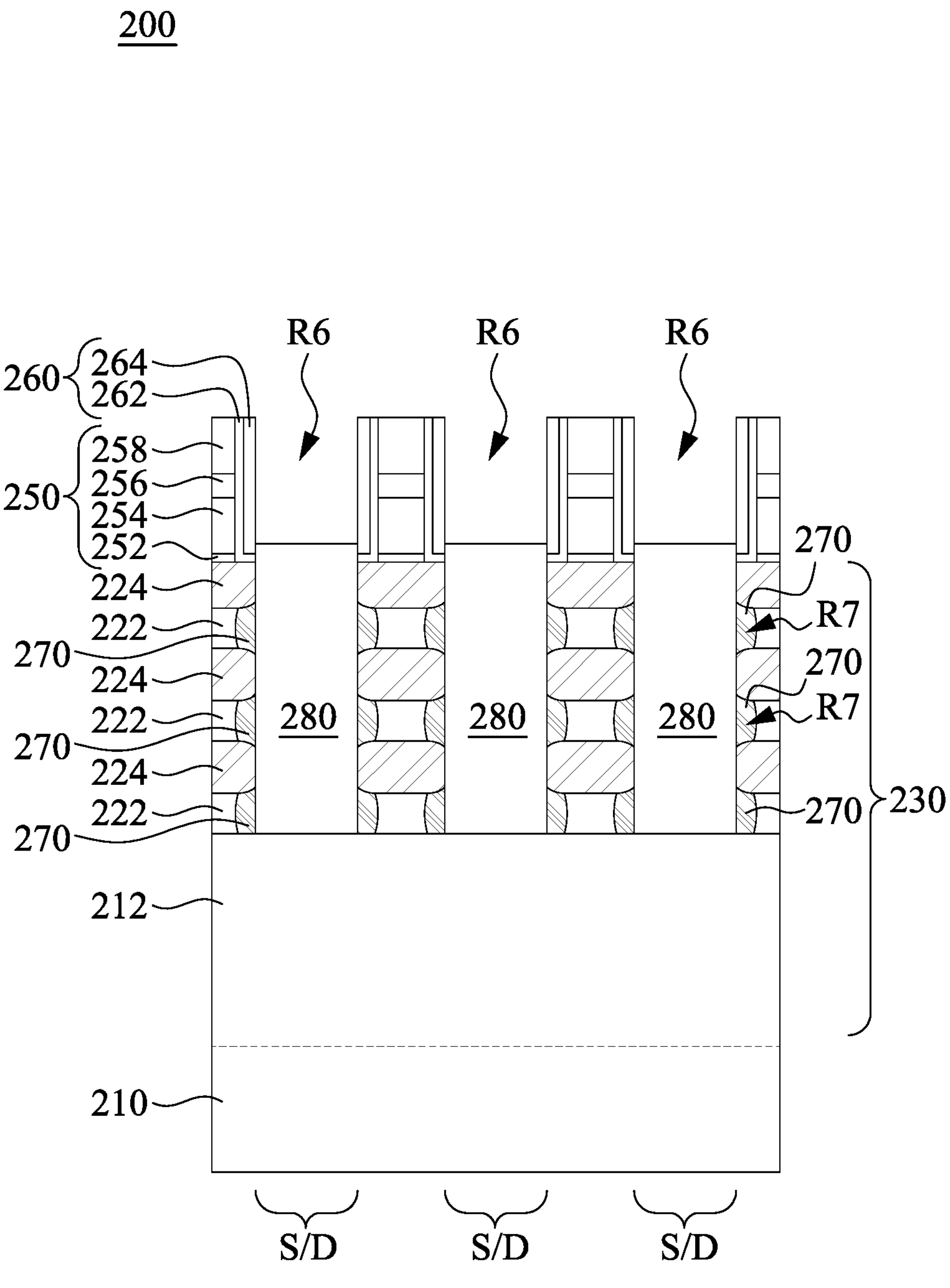

In FIG. 34, source/drain epitaxial structures 280 are formed over the source/drain regions S/D of the semiconductor fins 230. The source/drain epitaxial structures 280 may be formed by performing an epitaxial growth process that provides an epitaxial material on the fins 230. During the epitaxial growth process, the dummy gate structures 250, gate sidewall spacers 260 and the inner spacers 270 limit the source/drain epitaxial structures 280 to the source/drain regions S/D. Materials and process details about the source/drain epitaxy structures 280 of GAA FETs are similar to that of the source/drain epitaxial structures 122 of FinFETs discussed previously, and thus they are not repeated for the sake of brevity.

Figure 35:
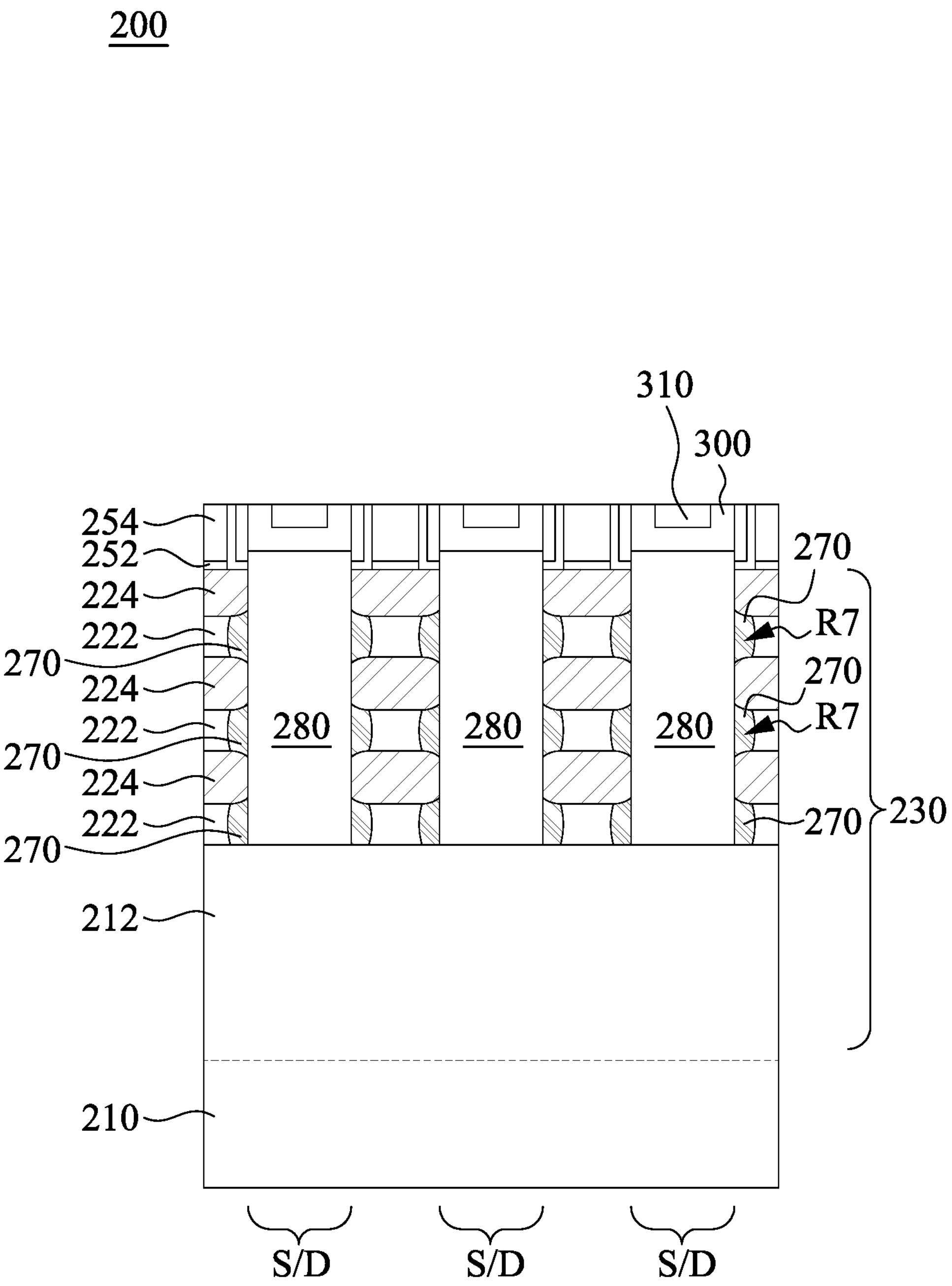
Figure 36:
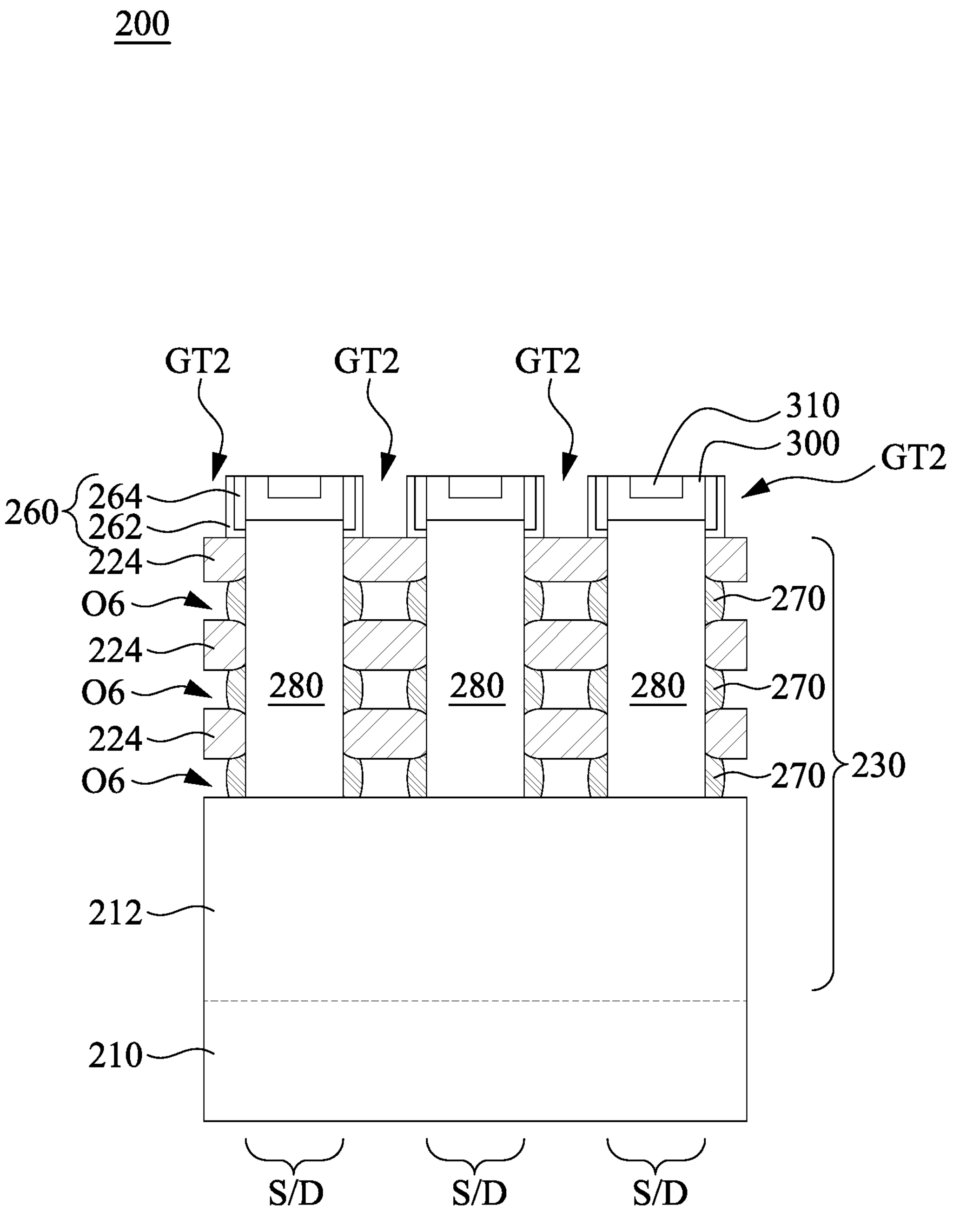

In FIG. 35, an interlayer dielectric (ILD) layer 310 is formed on the substrate 210. In some embodiments, a contact etch stop layer (CESL) 300 is also formed prior to forming the ILD layer 310. Materials and process details about the CESL 300 and the ILD layer 310 is similar to that of the CESL 124 and the ILD layer 126, and thus they are not repeated for the sake of brevity. In some examples, after depositing the ILD layer 310, a planarization process may be performed to remove excessive materials of the ILD layer 310. For example, a planarization process includes a chemical mechanical planarization (CMP) process which removes portions of the ILD layer 310 (and CESL layer, if present) overlying the dummy gate structures 250 and planarizes a top surface of the integrated circuit structure 200. In some embodiments, the CMP process also removes hard mask layers 256, 258 (as shown in FIG. 34) and exposes the dummy gate electrode layer 254.

Thereafter, dummy gate structures 250 (as shown in FIG. 35) are removed first, and then the sacrificial layers 222 are removed. The resulting structure is illustrated in FIG. 36. In some embodiments, the dummy gate structures 250 are removed by using a selective etching process (e.g., selective dry etching, selective wet etching, or a combination thereof) that etches the materials in dummy gate structures 250 at a faster etch rate than it etches other materials (e.g., gate sidewall spacers 260, CESL 300 and/or ILD layer 310), thus resulting in gate trenches GT2 between corresponding gate sidewall spacers 260, with the sacrificial layers 222 exposed in the gate trenches GT2. Subsequently, the sacrificial layers 222 in the gate trenches GT2 are removed by using another selective etching process that etches the sacrificial layers 222 at a faster etch rate than it etches the channel layers 224, thus forming openings O6 between neighboring channel layers 224. In this way, the channel layers 224 become nanosheets suspended over the substrate 210 and between the source/drain epitaxial structures 290S/290D. This step is also called a channel release process. At this interim processing step, the openings O6 between nanosheets 224 may be filled with ambient environment conditions (e.g., air, nitrogen, etc). In some embodiments, the nanosheets 224 can be interchangeably referred to as nanowires, nanoslabs and nanorings, depending on their geometry. For example, in some other embodiments the channel layers 224 may be trimmed to have a substantial rounded shape (i.e., cylindrical) due to the selective etching process for completely removing the sacrificial layers 222. In that case, the resultant channel layers 224 can be called nanowires.

In some embodiments, the sacrificial layers 222 are removed by using a selective wet etching process. In some embodiments, the sacrificial layers 222 are SiGe and the channel layers 224 are silicon allowing for the selective removal of the sacrificial layers 222. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 224 may not be significantly etched by the channel release process. It can be noted that both the channel release step and the previous step of laterally recessing sacrificial layers (the step as shown in FIGS. 32A and 32B) use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Figure 37A:
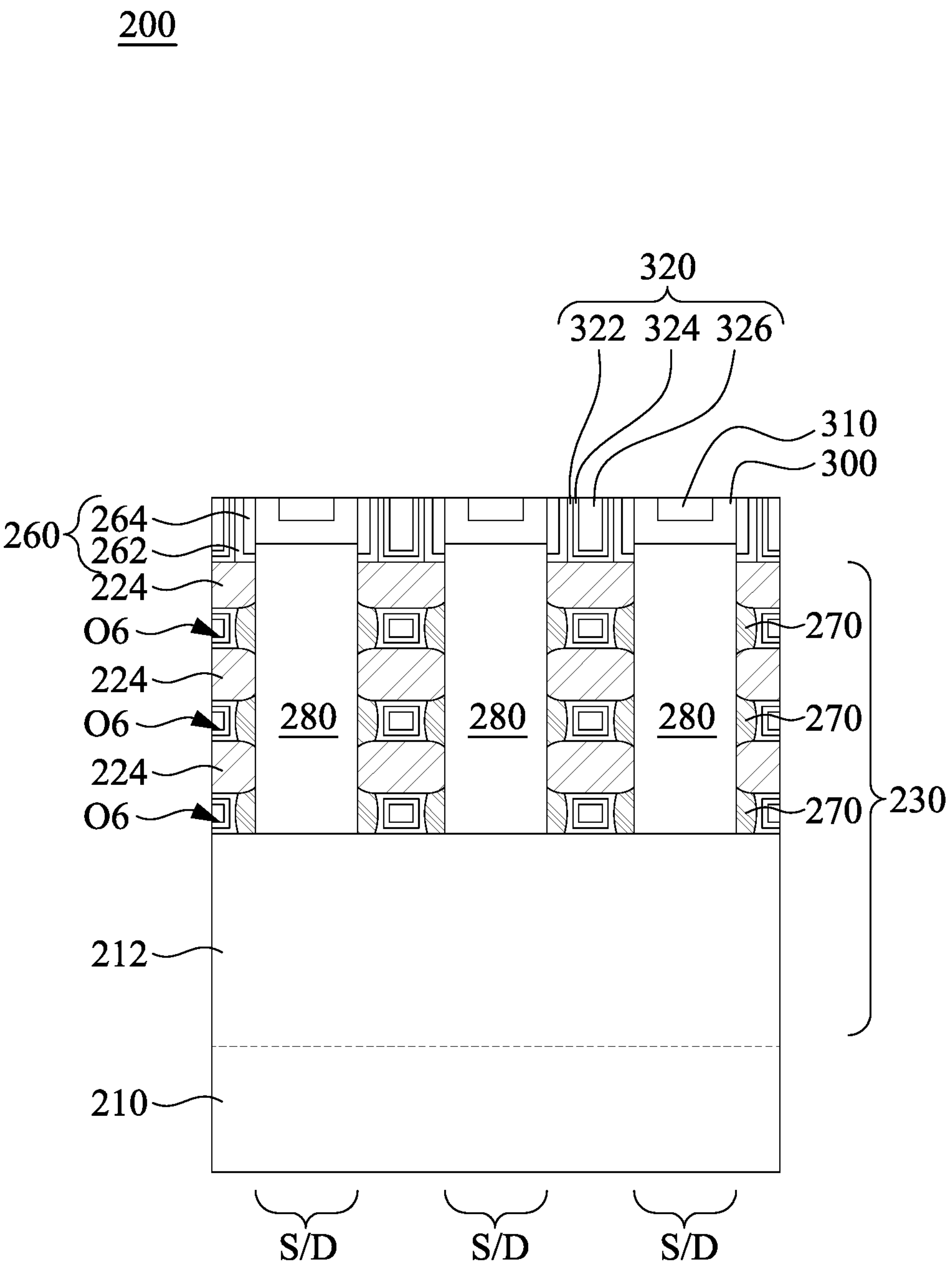
Figure 37B:
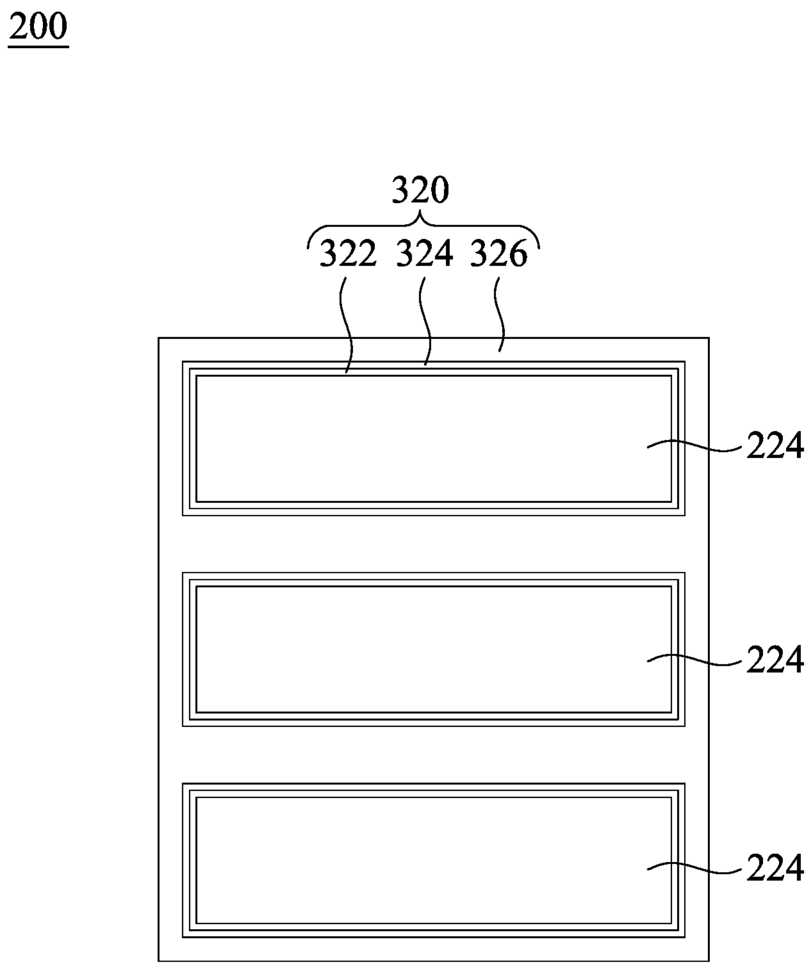

In FIGS. 37A and 37B, replacement gate structures 320 are respectively formed in the gate trenches GT2 to surround each of the nanosheets 224 suspended in the gate trenches GT2. The gate structure 320 may be the final gate of a GAA FET. The final gate structure may be a high-k/metal gate stack, however other compositions are possible. In some embodiments, each of the gate structures 320 forms the gate associated with the multi-channels provided by the plurality of nanosheets 224. For example, high-k/metal gate structures 320 are formed within the openings O6 (as illustrated in FIG. 36) provided by the release of nanosheets 224. In various embodiments, the high-k/metal gate structure 320 includes a gate dielectric layer 322 formed around the nanosheets 224, a work function metal layer 324 formed around the gate dielectric layer 322, and a fill metal 326 formed around the work function metal layer 324 and filling a remainder of gate trenches GT2. The gate dielectric layer 322 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 324 and/or fill metal layer 326 used within high-k/metal gate structures 320 may include a metal, metal alloy, or metal silicide. Formation of the high-k/metal gate structures 320 may include depositions to form various gate materials, one or more liner layers, and one or more CMP processes to remove excessive gate materials. As illustrated in a cross-sectional view of FIG. 37B that is taken along a longitudinal axis of a high-k/metal gate structure 320, the high-k/metal gate structure 320 surrounds each of the nanosheets 224, and thus is referred to as a gate of a GAA FET. Materials and process details about the gate structures 320 of GAA FETs are similar to the gate structures 130 of FinFETs, and thus they are not repeated for the sake of brevity.

Figure 38:
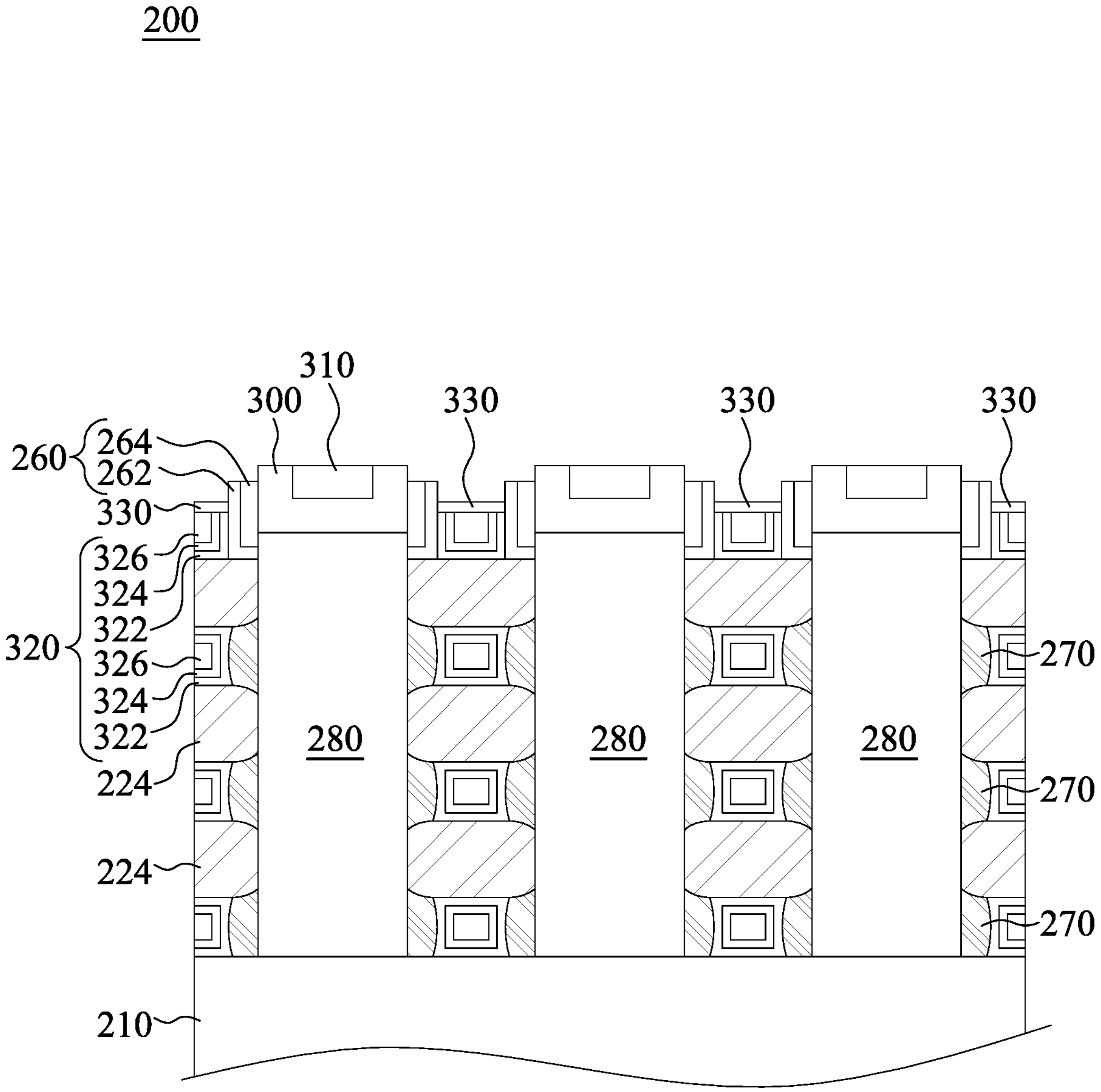

In FIG. 38, an etching back process is performed to etch back the replacement gate structures 320 and the gate spacers 260, resulting in recesses over the etched-back gate structures 320 and the etched-back gate spacers 260. In some embodiments, because the materials of the replacement gate structures 320 have a different etch selectivity than the gate spacers 260, the top surfaces of the replacement gate structures 320 may be at a different level than the top surfaces of the gate spacers 260. For example, in the depicted embodiment as illustrated in FIG. 38, the replacement gate structures 320's top surfaces are lower than the top surfaces of the gate spacers 260. However, in some other embodiments, the top surfaces of the replacement gate structures 320 may be level with or higher than the top surfaces of the gate spacers 260. Moreover, in some embodiments, the CESL 300 may be etched back during etching back the replacement gate structures 320 and/or the gate spacers 260. In that case, the CESL 300 has a lower top end than a top surface of the ILD layer 310.

Then, metal caps 330 are formed respectively atop the replacement gate structures 320 by suitable process, such as CVD or ALD. The metal caps 330 may be, by way of example and not limitation, substantially fluorine-free tungsten (FFW) films having an amount of fluorine contaminants less than 5 atomic percent and an amount of chlorine contaminants greater than 3 atomic percent. Process Detail about FFW formation is discussed previously with respect to the metal caps 138, and thus they are not repeated for the sake of brevity.

Figure 39:
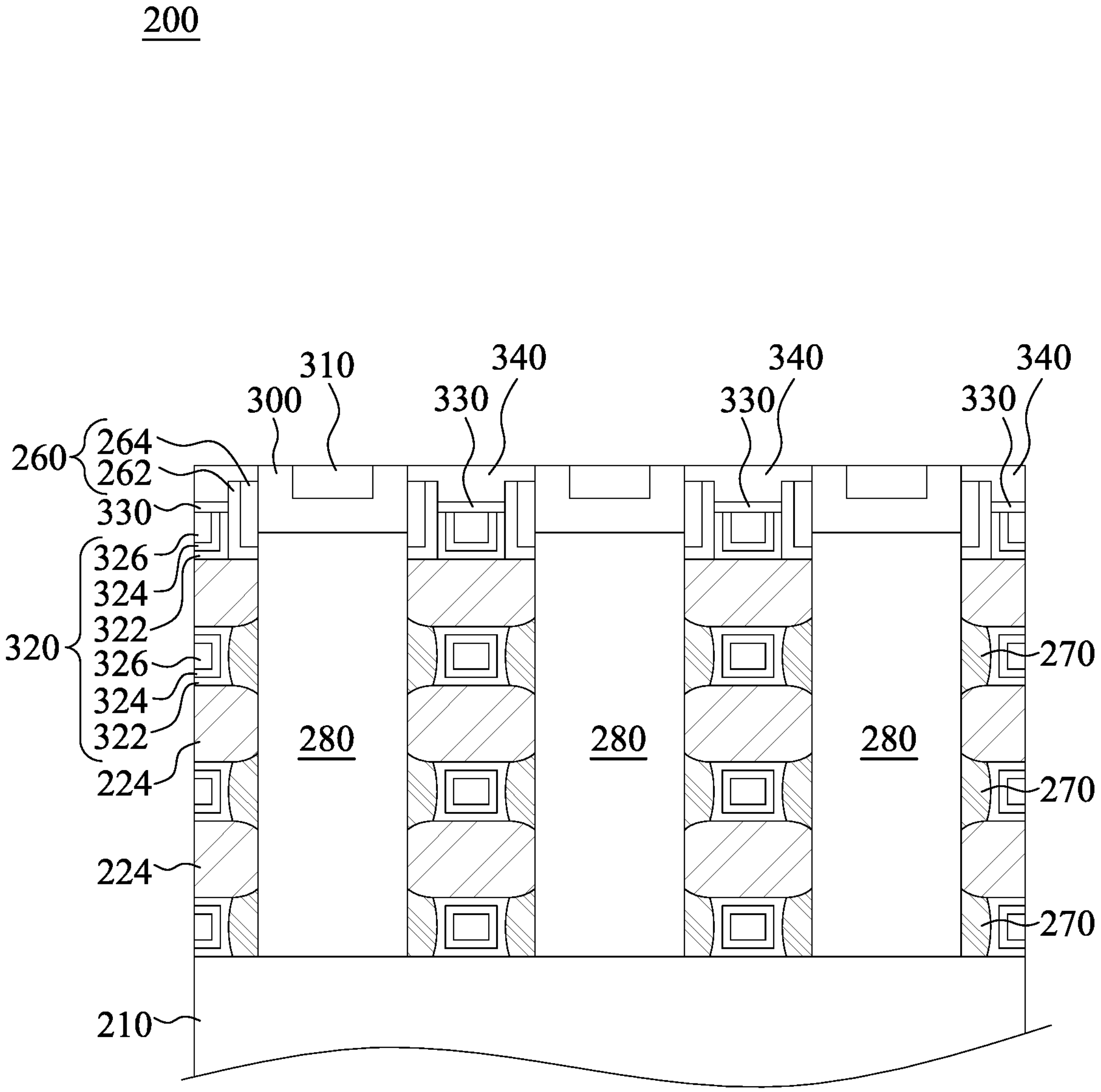

In FIG. 39, gate dielectric caps 340 are formed over the metal caps 330 and the gate spacers 260. Because the metal caps 330 have top surfaces lower than top surfaces of the gate spacers 260, each of the dielectric caps 340 has a stepped bottom surface with a lower step contacting a top surface of a metal cap 330 and an upper step contacting a top surface of the gate spacer 260. Materials and process details about the dielectric caps are similar to that of the dielectric caps 142 discussed previously, and thus they are not repeated for the sake of brevity.

Figure 40:
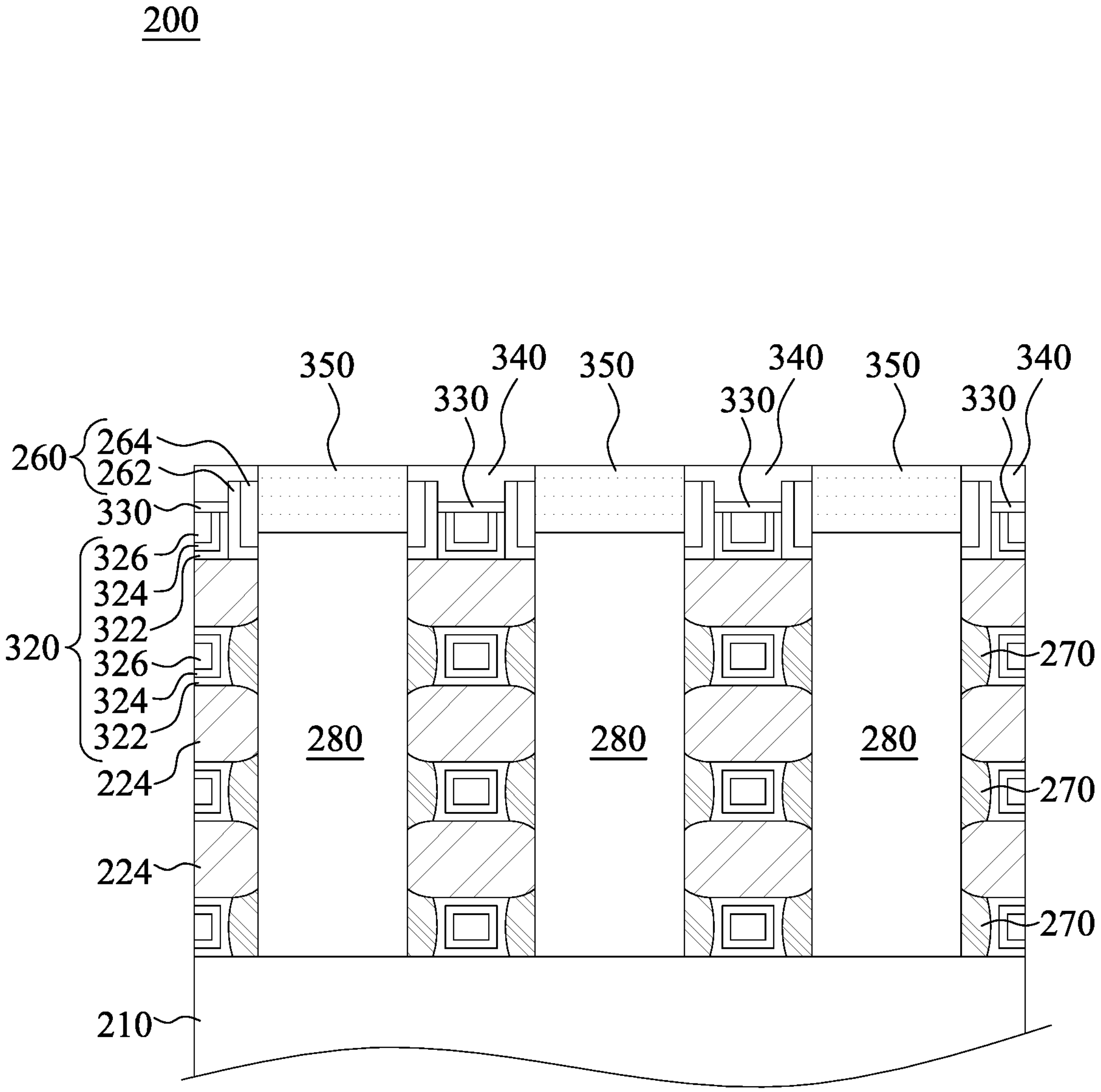

In FIG. 40, source/drain contacts 350 are formed extending through the CESL 300 and the ILD layer 310. Formation of the source/drain contacts 350 includes, by way of example and not limitation, performing one or more etching processes to form contact openings extending through the ILD layer 310 and the CESL 300 to expose the source/drain epitaxy structures 280, depositing one or more metal materials overfilling the contact openings, and then performing a CMP process to remove excessive metal materials outside the contact openings. In some embodiments, the one or more etching processes are selective etching that etches the ILD layer 310 and the CESL 300 at a faster etch rate than etching the dielectric caps 340 and the gate spacers 260. As a result, the selective etching is performed using the dielectric caps 340 and the gate spacers 260 as an etch mask, such that the contact openings and hence source/drain contacts 350 are formed self-aligned to the source/drain epitaxy structures 280 without using an additional photolithography process. In that case, dielectric caps 340 allowing for forming the self-aligned contacts 350 can be called SAC caps 340.

Figure 41:
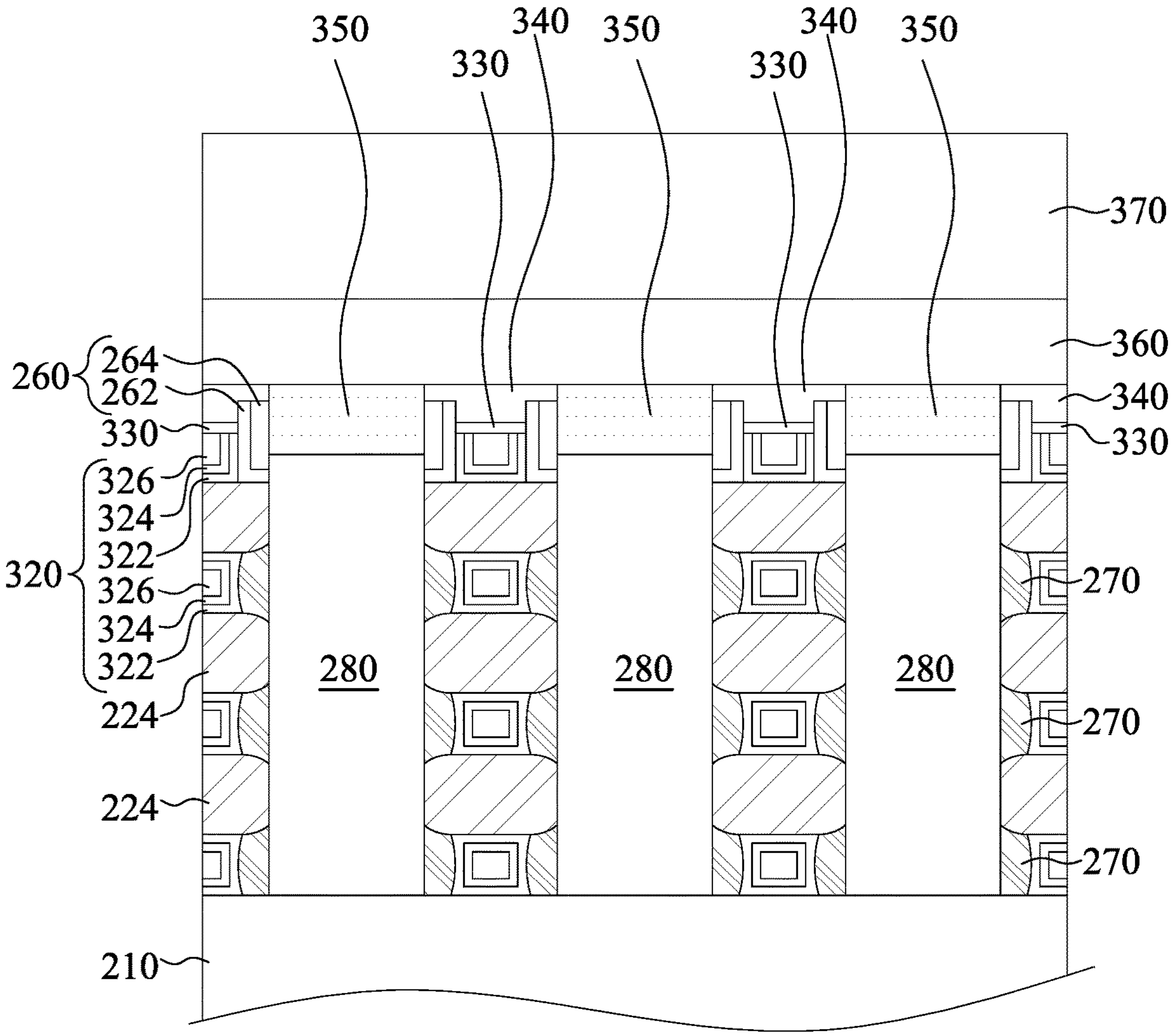

In FIG. 41, after the self-aligned source/drain contacts 350 have been formed, a middle contact etch stop layer (MCESL) 360 is then deposited over the source/drain contacts 350 and the SAC caps 340. Subsequently, another ILD layer 370 is deposited over the MCESL 146. In some embodiments, the MCESL 360 is silicon nitride, and the ILD layer 370 is silicon oxide ($SiO_x$).

Figure 42:
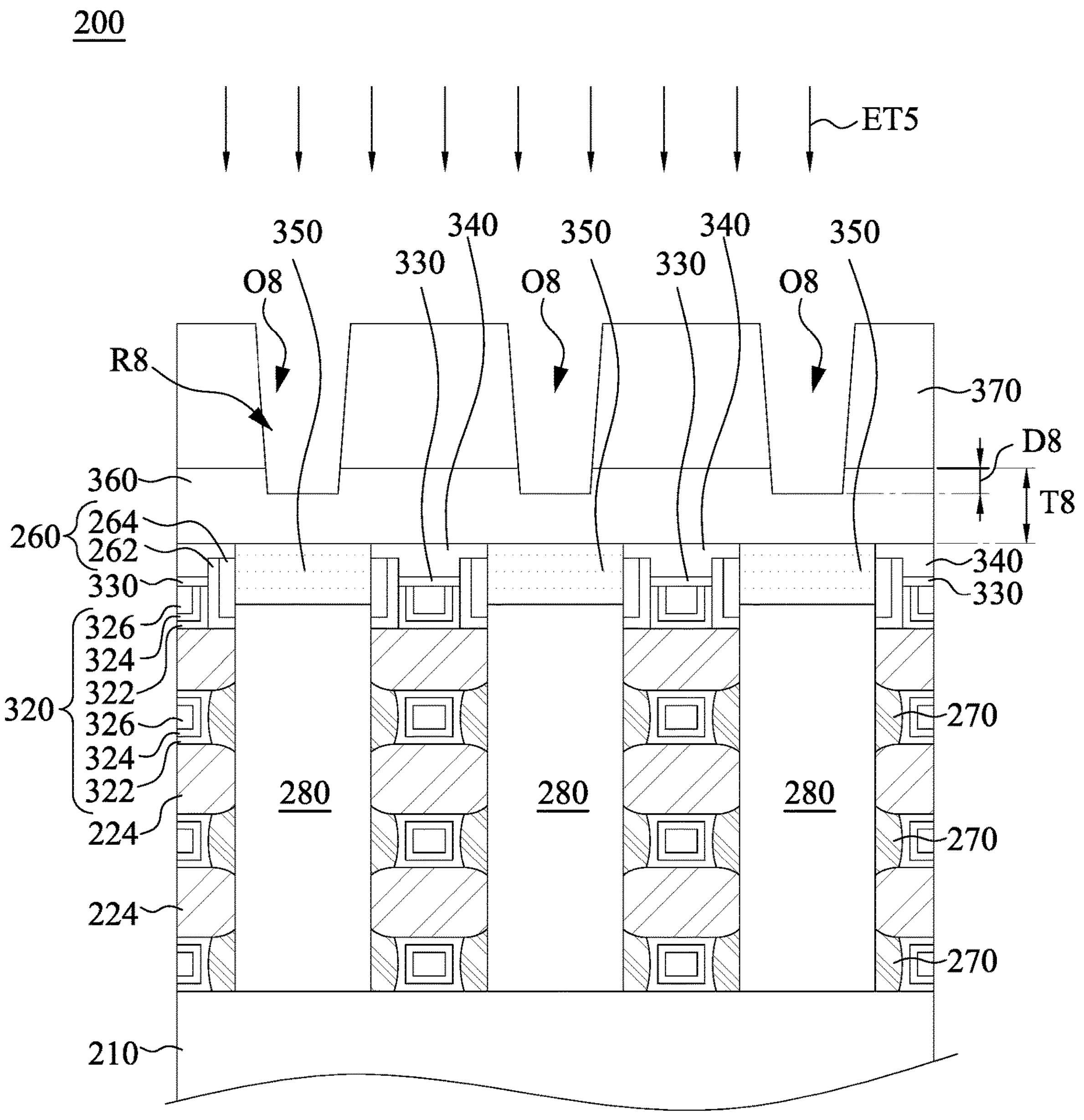

Referring to FIG. 42, the ILD layer 370 is patterned to form via openings O8 extending through the ILD layer 370 by using a first etching process (also called via etching process) ET5. The etching duration time of the via etching process ET5 is controlled to remove portions of the MCESL 360 but not punch through the MCESL 360. As a result of this via etching process ET5, recesses R8 are formed below corresponding via openings O8, extending in the MCESL 360 but not through an entire thickness of the MCESL 360. Formation of recesses R8 allows for oxidizing sidewalls of the MCESL 360 in subsequent processing. In some embodiments, a ratio of the depth D8 of the recess R8 to the thickness T8 of the MCESL 360 is in a range from about 2:9 to about 7:9, e.g., about 5:9. If the ratio of the recess depth D8 to MCESL thickness T8 is excessively small, oxidized sidewalls formed in subsequent treatment may be too small to inhibit lateral etching in the following LRM etching process. If the ratio of the recess depth D8 to MCESL thickness T8 is excessively large, the MCESL 360 and the underlying source/drain contacts 350 may be over-etched. Process details about the via etching process ET5 is similar to that of the via etching process ET1 discussed previously, and thus they are not repeated for the sake of brevity.

Figure 43:
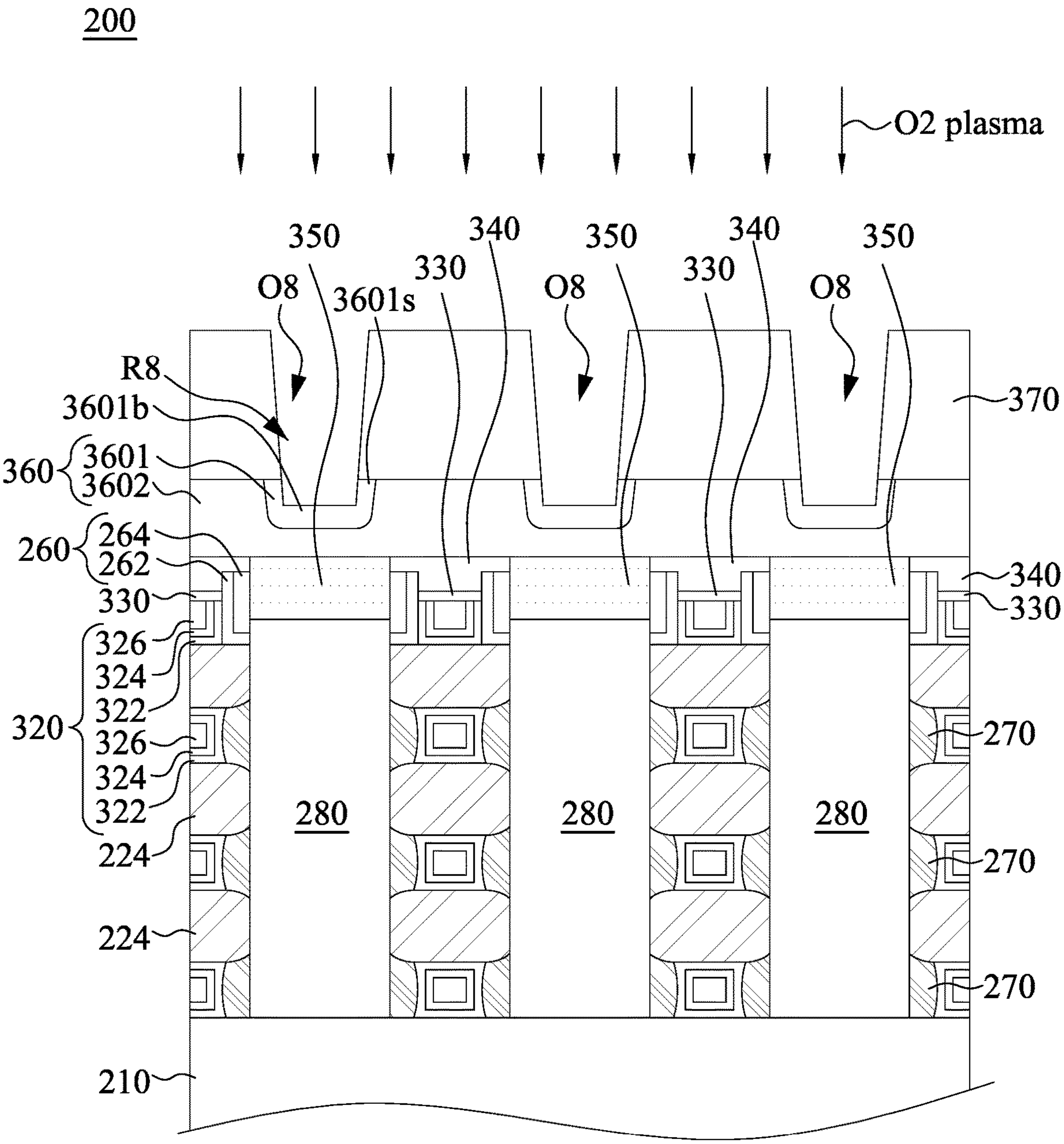

In FIG. 43, after the via etching process ET5 has been completed, the exposed portions of the MCESL layer 360 is treated in an oxygen-containing environment, so that surface layers of the exposed portions of the MCESL 360 are oxidized to form an oxidized region 3601 in the MCESL layer 360, while leaving a remaining region 3602 of the MCESL layer 360 un-oxidized. The treatment step may include an $O_2$ plasma treatment, wherein the oxygen-containing gas is conducted into a process chamber, in which the plasma is generated from the oxygen-containing gas. Process details about the $O_2$ plasma treatment are discussed previously with respect to FIG. 16A, and thus they are not repeated for the sake of brevity.

As a result of the $O_2$ plasma treatment, oxidation occurs in bottom surfaces and sidewalls of recesses R8 in the MCESL 360, thus resulting in the oxidized region 3601 having an oxidized bottom portion 3601*b* and an oxidized sidewall portion 3601*s* extending upwards from the oxidized bottom portion 3601*b* and laterally surrounding the oxidized bottom portion 3601*b*.

In some embodiments, the oxidized bottom portion 3601*b* and the oxidized sidewall portion 3601*s* have same thickness (e.g., in a range from about 1 nm to about 3 nm). In some other embodiments, the oxidized sidewall portion 3601*s* has a thicker thickness than the oxidized bottom portion 3601*b*. For example, a thickness ratio of the oxidized sidewall portion 3601*s* to the oxidized bottom portion 3601*b* can be greater than about 1:1, 2:1, 3:1, 4:1 or 5:1. Thicker oxidized sidewall portion 3601*s* allows for higher etch resistance against the subsequent LRM etching. Thinner oxidized bottom portion 3601*b* allows for shortened LRM etching duration time because the oxidized bottom portion 3601*b* is to be removed in the LRM etching. In some embodiments, the oxidized sidewall portion 3601*s* has a thickness gradient from bottom to top. For example, the oxidized sidewall portion 3601*s* may be thicker in the top and thinner in the bottom.

In some embodiments where the MCESL 360 is made of SiN, the $O_2$ plasma treatment results in oxidized nitride regions (silicon oxynitride ($SiO_xN_y$)) 3601 in the MCESL 360 and below the via openings O8 and an un-oxidized nitride region 3602 cupping undersides of the oxidized nitride regions 3601. In some embodiments, the oxidized region 3601 may have an oxygen concentration gradient due to the plasma treatment. For example, the oxygen atomic percentage in the oxidized region 3601 may decrease as a distance from the recess R8's surface increases. In greater detail, the oxidized sidewall portion 3601*s* has an oxygen atomic percentage decreasing as a distance from a sidewall of the recess R8 increases, and the oxidized bottom portion 3601*b* has an oxygen atomic percentage decreasing as a distance from a bottom surface of the recess R8 increases. In some embodiments where the MCESL 360 is silicon nitride, the oxygen-to-nitrogen atomic ratio in the oxidized region may decrease as a distance from the recess R8's surface increases. In greater detail, the oxidized sidewall portion 3601*s* may have an oxygen-to-nitrogen atomic ratio decreasing as a distance from a sidewall of the recess R8 increases, and the oxidized bottom portion 3601*b* has an oxygen-to-nitrogen atomic ratio decreasing as a distance from a bottom surface of the recess R8 increases.

Figure 44A:
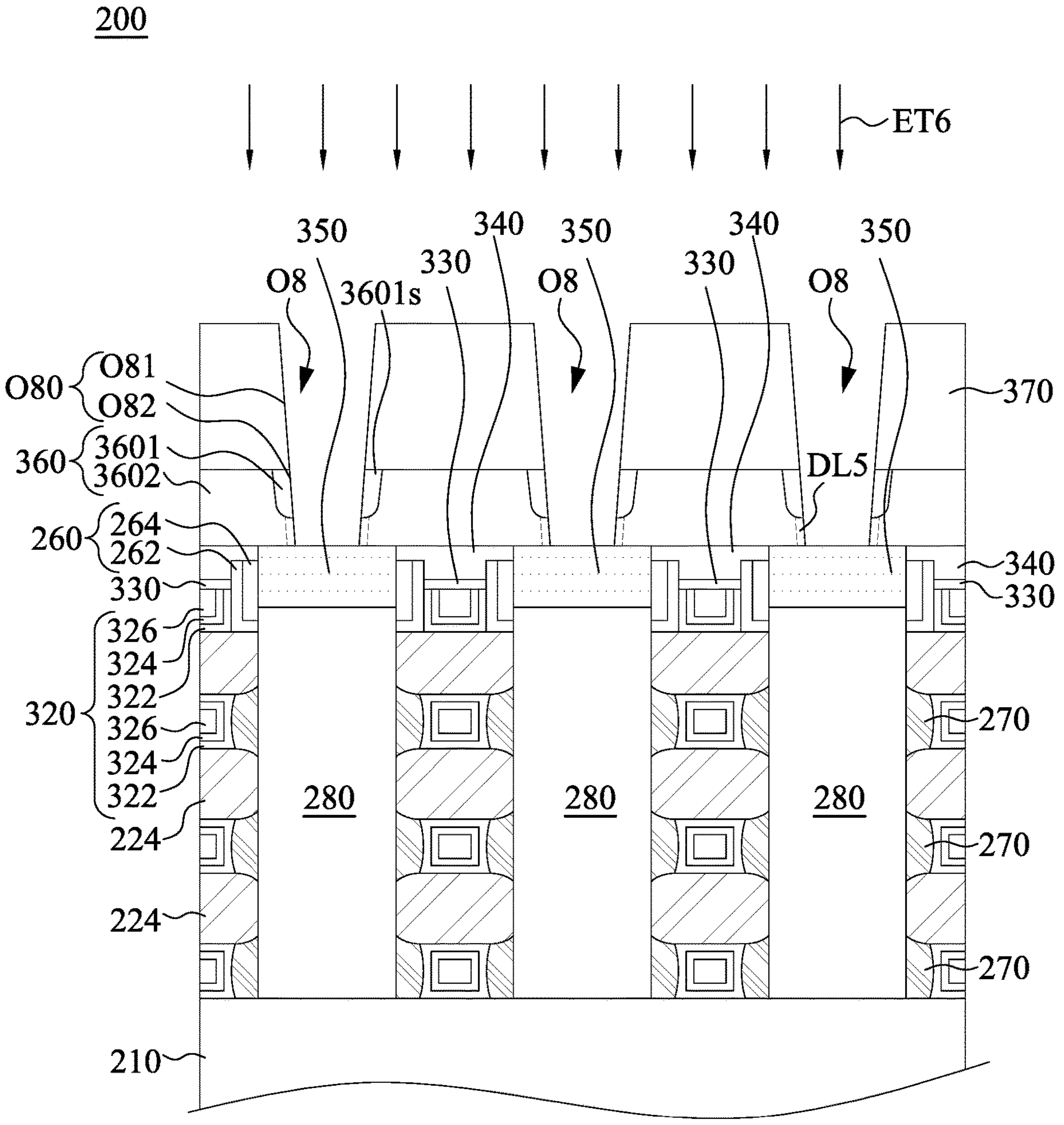

Referring to FIG. 44A, an LRM etching process ET6 is performed to break through the MCESL 360, thus deepening the via opening O8 down to the source/drain contact 350. As a result of the LRM etching process ET6, the source/drain contact 350 gets exposed at bottoms of the deepened via openings O8. Process details about the LRM etching process ET6 are discussed previously with respect to the LRM etching process ET2, and thus they are not repeated herein for the sake of brevity.

Because the oxidized sidewall portion 3601*s* inhibits or slows down the lateral etching during the LRM etching process ET6, the sidewall O80 of the via opening O8 extends linearly through an entire thickness of the ILD layer 370 and an entire thickness of the MCESL 360, and no or negligible bowing occurs. In greater detail, the ILD layer 370 has a linear sidewall O81 defining an upper part of a via opening O8 and the MCESL 360 has a linear sidewall O82 defining a lower part of the via opening O8, and the linear sidewalls O81 and O82 are aligned with each other. In some embodiments, the linear sidewall O82 of the MCESL 360 has a sidewall of the oxidized sidewall portion 3601*s* extending downwards from the linear sidewall O81 of the ILD layer 370, and a sidewall of the un-oxidized region 3602 extending downwards from the sidewall of the oxidized sidewall portion 3601*s*. In some embodiments as depicted in FIG. 44A, the sidewall of the un-oxidized region 3602 is aligned with the sidewall of the oxidized sidewall portion 3601*s*. However, in some other embodiments, the sidewall of the un-oxidized region 3602 may be slightly laterally set back (as indicated in dash line DL5) from the sidewall of the oxidized sidewall portion 3601*s*, because the LRM etching ET6 may cause more lateral etching in the un-oxidized region 3602 than in the oxidized sidewall portion 3601*s*. Even in this scenario the via openings O8 still have alleviated bowing defect compared with the case where no oxidized sidewall portion 3601*s* is formed, because the bowing profile is localized to the un-oxidized region 3602 below the oxidized sidewall portion 3601*s*.

Figure 44B:
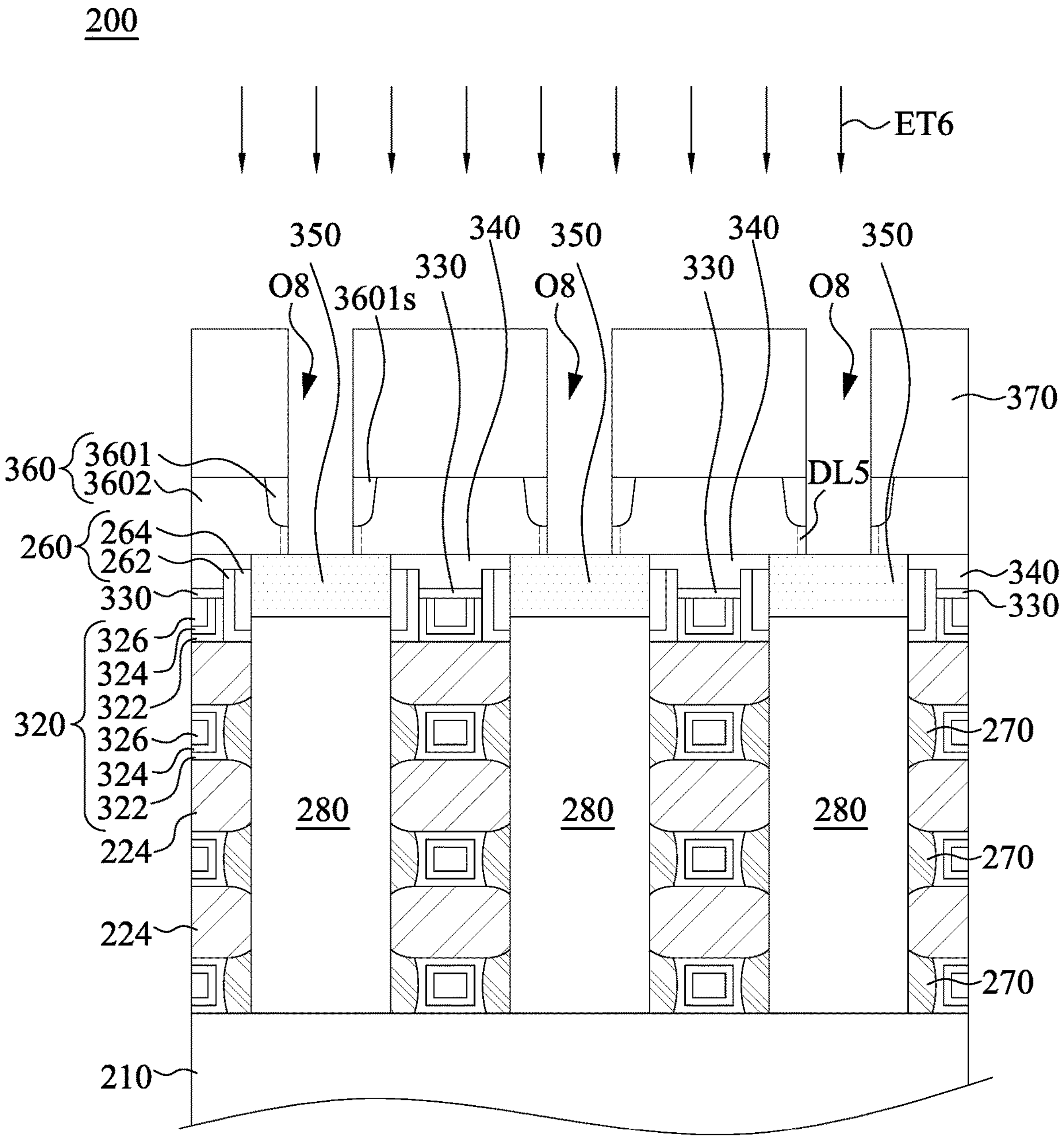

In some embodiments as depicted in FIG. 44A, the via openings O8 have tapered sidewall profile due to the nature of anisotropic etching of the LRM etching process ET6. However, in some other embodiments, the etching conditions of the LRM etching process ET6 and/or the previous via etching process ET5 may be fine-tuned to allow the via openings O8 having vertical sidewall profile, as illustrated in FIG. 44B.

Figure 45A:
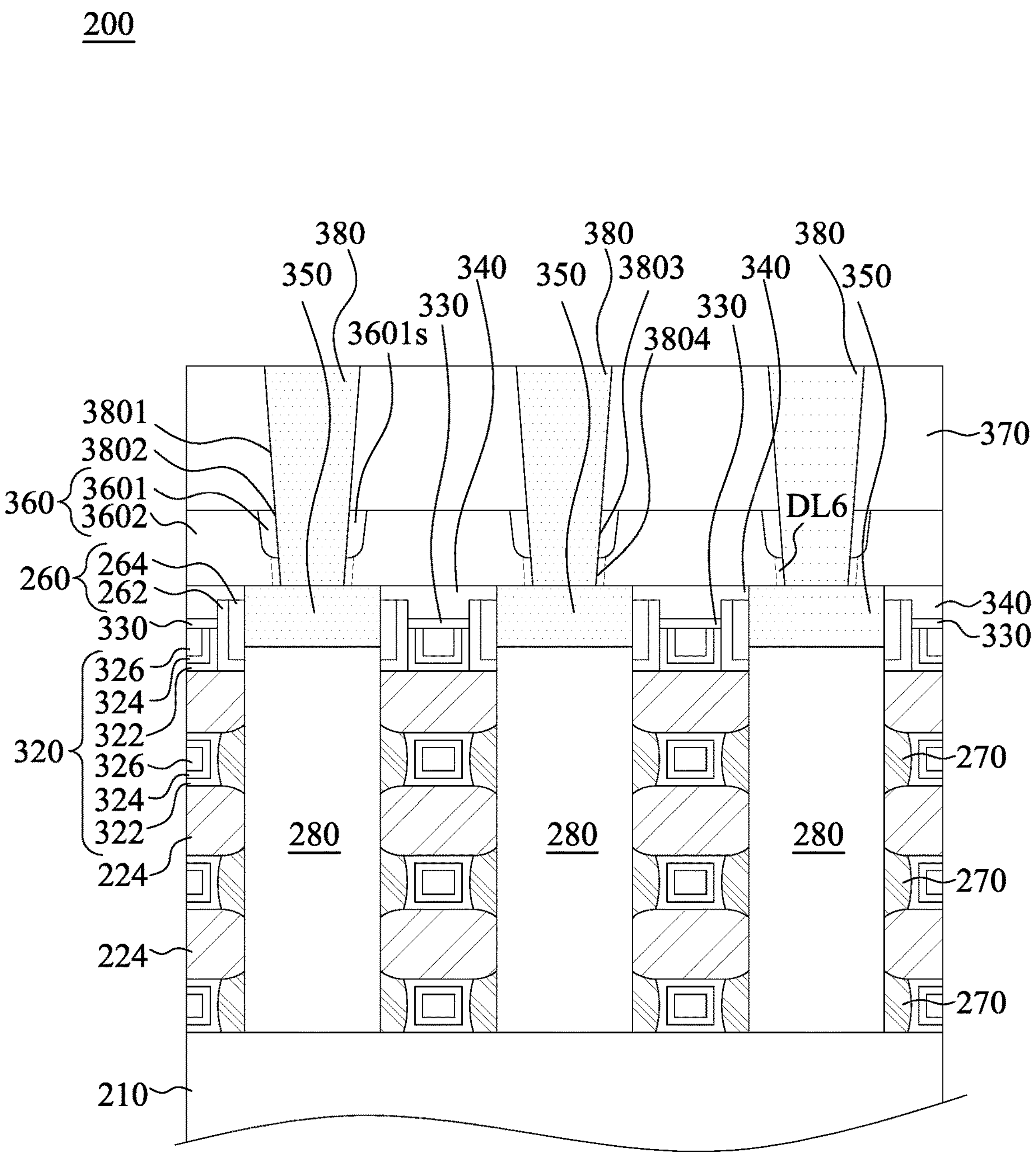

Next, in FIG. 45A, source/drain vias 380 are then formed in the via openings O8 to make physical and electrical connection to the source/drain contacts 350. Materials and process details about the source/drain vias 380 are similar to that of the source/drain vias 150 discussed previously, and thus they are not repeated for the sake of brevity.

The source/drain vias 380 inherit the geometry of the substantially bowing-free via openings O8, and thus the source/drain vias 380 are also substantially bowing-free. Stated differently, sidewalls of the source/drain vias 380 extend linearly through an entire thickness of the ILD layer 370 and an entire thickness of the MCESL 360, and no or negligible bowing exists. In greater detail, a source/drain via 380 forms a first linear interface 3801 with the ILD layer 370, and a second liner interface 3802 with the MCESL 360. The second linear interface 3802 extends downwards from the first linear interface 3801, and the linear interfaces 3801 and 3802 are aligned with each other. In some embodiments, the second interface 3802 includes an upper interface 3803 formed between the source/drain via 380 and the oxidized sidewall portion 3601*s*, and a lower interface 3804 formed between the source/drain via 380 and the un-oxidized region 3602. The lower interface 3804 extends downwards from the upper interface 3803. In some embodiments as depicted in FIG. 45A, lower interface 3804 is aligned with the upper interface 3803. However, in some other embodiments, lower interface 3804 may be slightly laterally set back (as indicated in dash line DL6) from the upper interface 3803, because in the previous processing the LRM etching ET6 may cause more lateral etching in the un-oxidized region 3602 than in the oxidized sidewall portion 3601*s*. Even in this scenario the source/drain vias 380 still have alleviated bowing defect compared with the case where no oxidized sidewall portion 3601*s* is formed, because the bowing profile is localized to the lower interface 3804 between the source/drain via 380 and the un-oxidized region 3602.

Figure 45B:
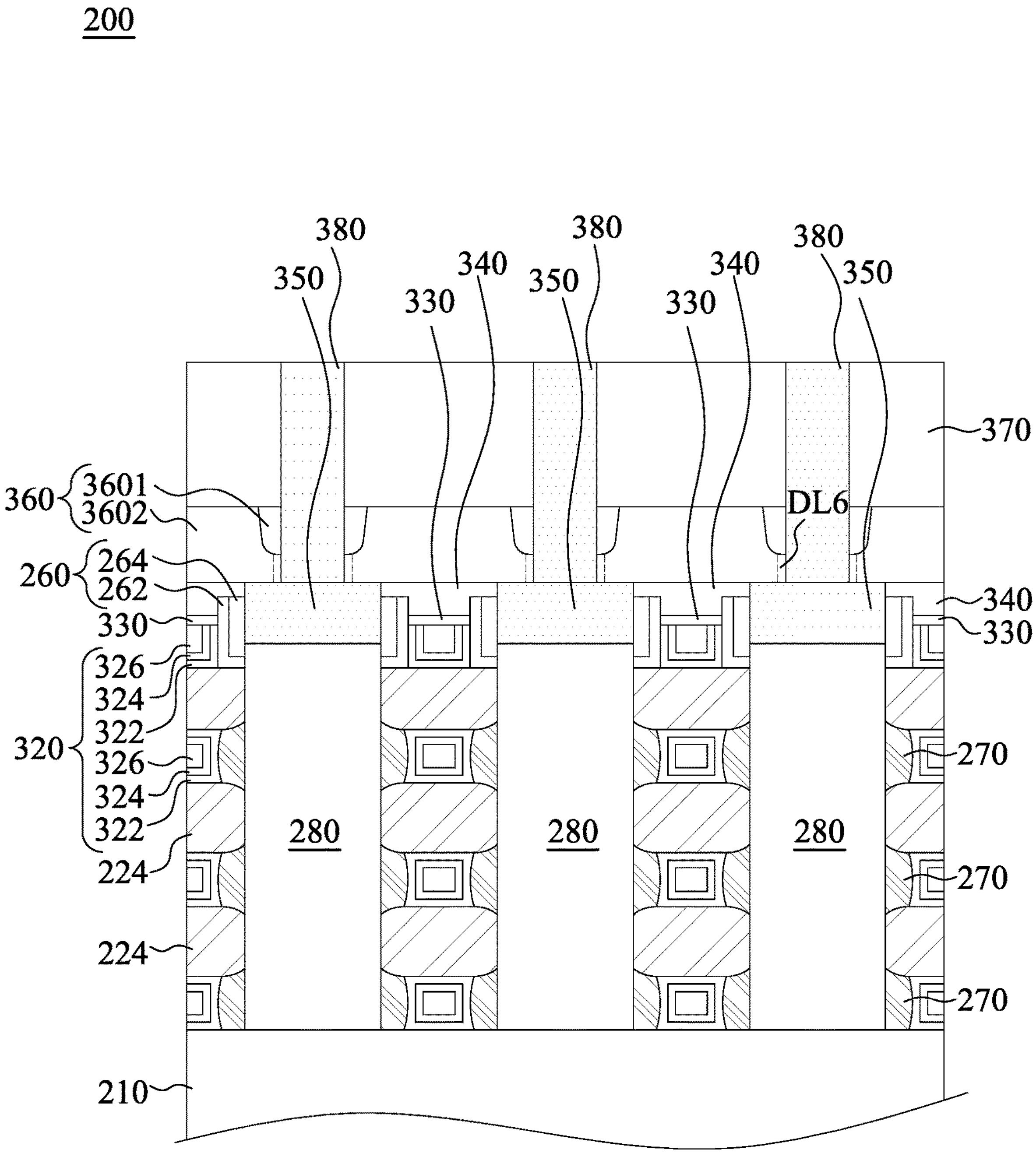

In some embodiments as depicted in FIG. 45A, the source/drain vias 380 have tapered sidewall profile due to the nature of anisotropic etching of the LRM etching process ET6. However, in some other embodiments, the etching conditions of the LRM etching process ET6 may be fine-tuned to allow the via openings O8 and hence the source/drain vias 380 with vertical sidewall profile, as illustrated in FIG. 45B.

FIGS. 46-51 illustrate exemplary cross sectional views of various stages for manufacturing an integrated circuit structure 200*a* according to some other embodiments of the present disclosure. It is understood that additional operations can be provided before, during, and after processes shown by FIGS. 46-51, and some of the operations described below can be replaced or eliminated, for additional embodiments of the method. The order of the operations/processes may be interchangeable. The same or similar configurations, materials, processes and/or operation as described with FIGS. 27-45B may be employed in the following embodiments, and the detailed explanation may be omitted.

Figure 46:
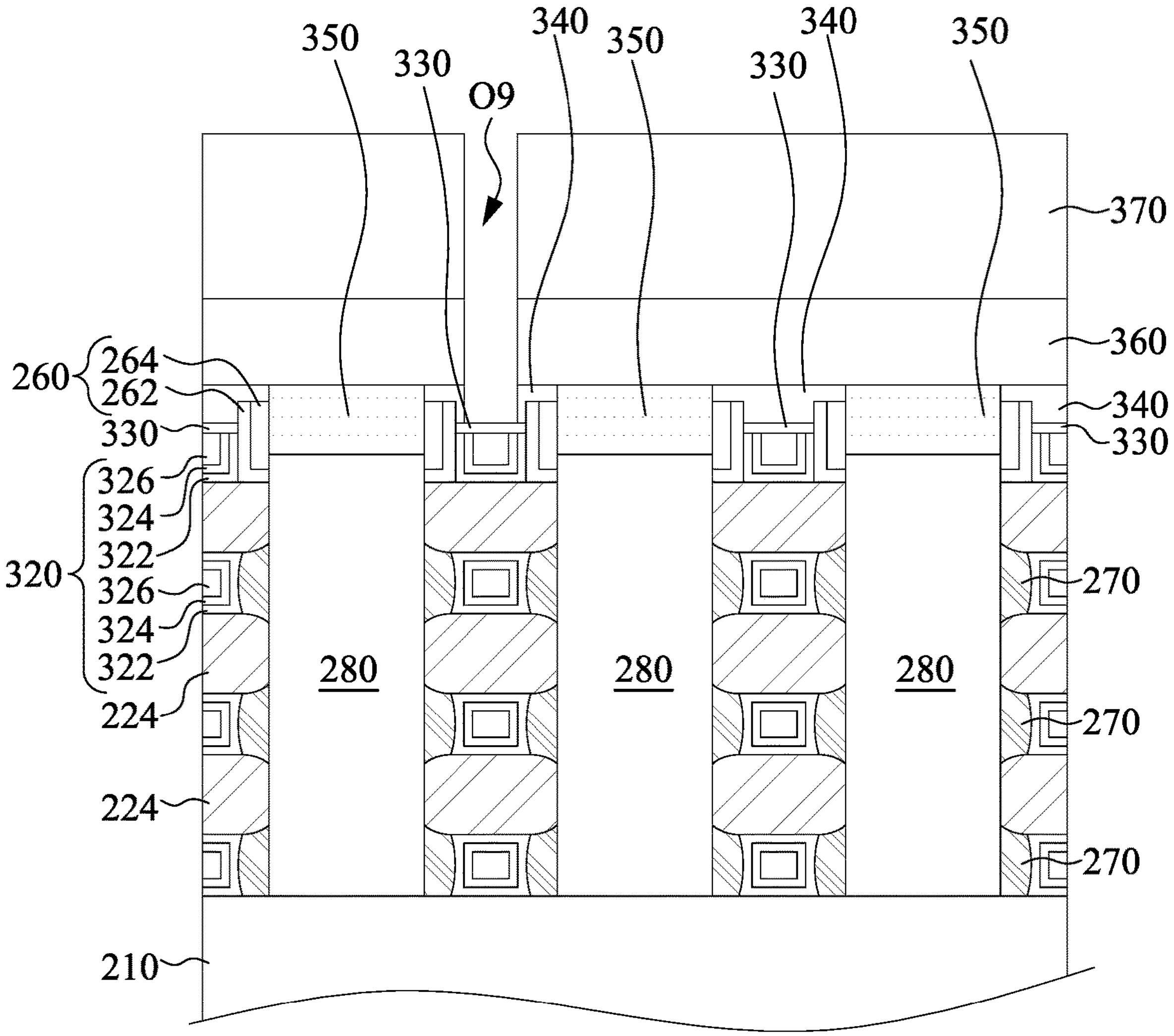
FIGS. 46-51 illustrate exemplary cross sectional views of various stages for manufacturing an integrated circuit structure according to some other embodiments of the present disclosure.

After the structure as shown in FIG. 41 is formed, the ILD layer 370 is patterned to form a gate contact opening O9 extending downward through the ILD layer 370, the MCESL 360 and the dielectric cap 340 to the metal cap 330. The resulting structure is illustrated in FIG. 46. The ILD layer 370 can be patterned by using suitable photolithography and etching techniques.

Figure 47:
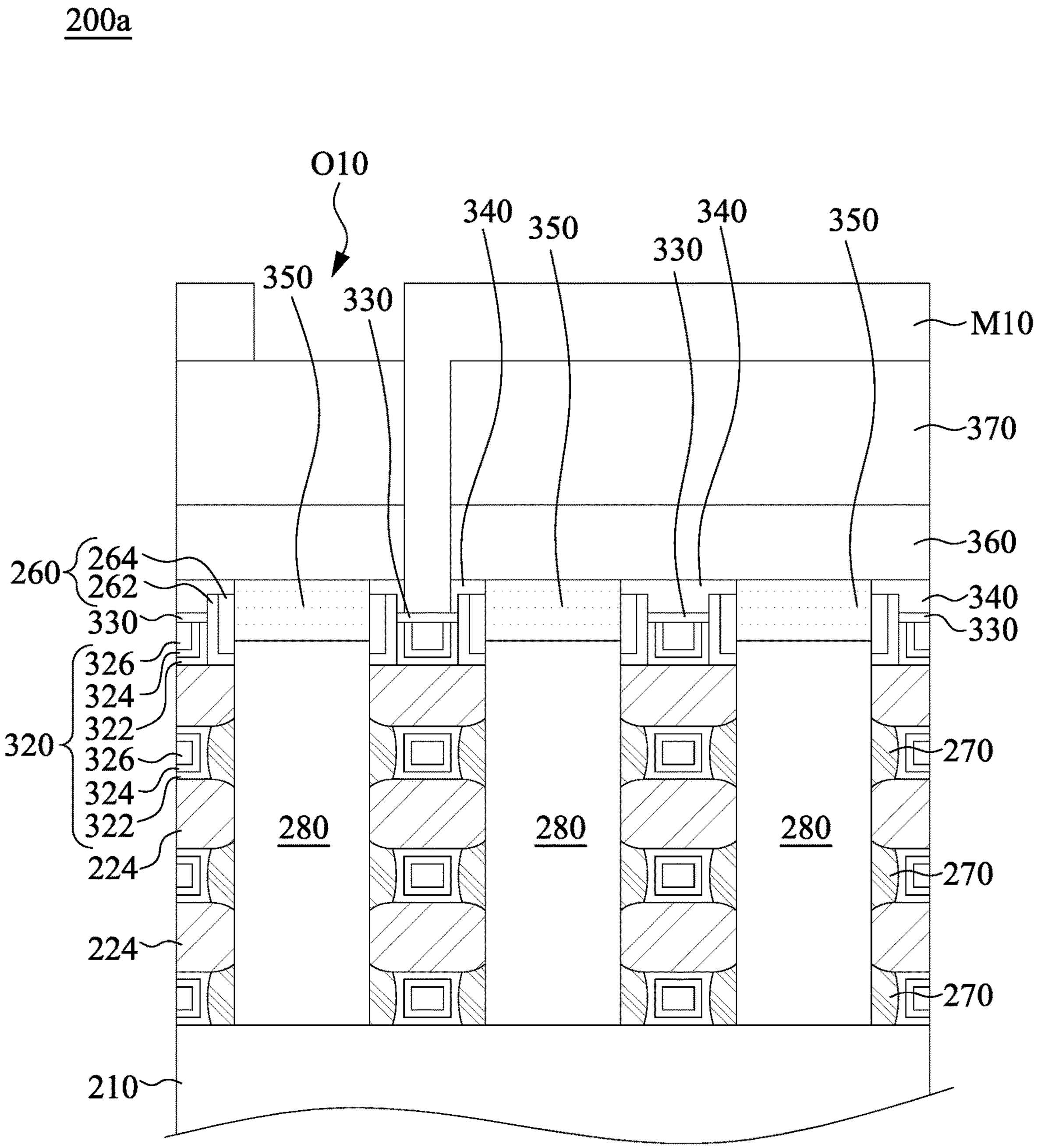

Next, as illustrated in FIG. 47, a patterned mask layer M10 is formed over the substrate 12 to fill the gate contact opening O9. The patterned mask layer M10 has an opening O10 directly above a source/drain contact 350. In some embodiments, the patterned mask layer M10 may be a photoresist mask formed by suitable photolithography process. For example, the photolithography process may include spin-on coating a photoresist layer over the structure as illustrated in FIG. 46, performing post-exposure bake processes, and developing the photoresist layer to form the patterned mask layer M10.

Figure 48:
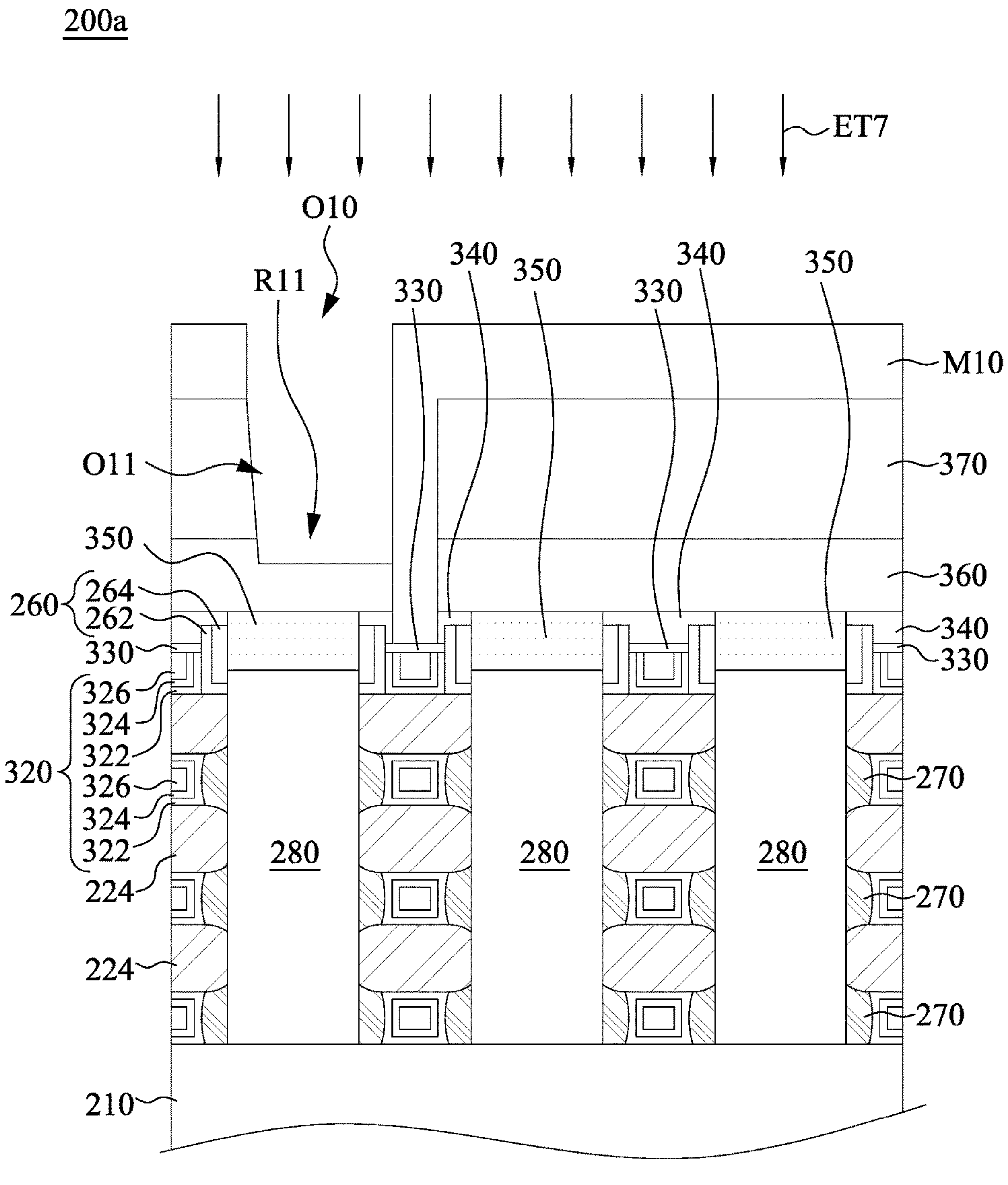

In FIG. 48, a via etching process ET7 is performed to form a via opening O11 extending through the ILD layer 370. The etching duration time of the via etching process ET7 is controlled to remove a portion of the MCESL 360 but not punch through the MCESL 360. As a result of this via etching process ET7, a recess R11 is formed below the via opening O11, extending in the MCESL 360 but not through an entire thickness of the MCESL 360. Formation of the recess R11 allows for oxidizing a sidewall of the MCESL 360 in subsequent processing. Process details about the via etching process ET7 are discussed previously with respect to the via etching process ET1, and thus they are not repeated herein for the sake of brevity. A ratio of the recess depth to the MCESL thickness is similar to that discussed previously with respect to FIG. 23, and thus it is not repeated for the sake of brevity.

Figure 49:
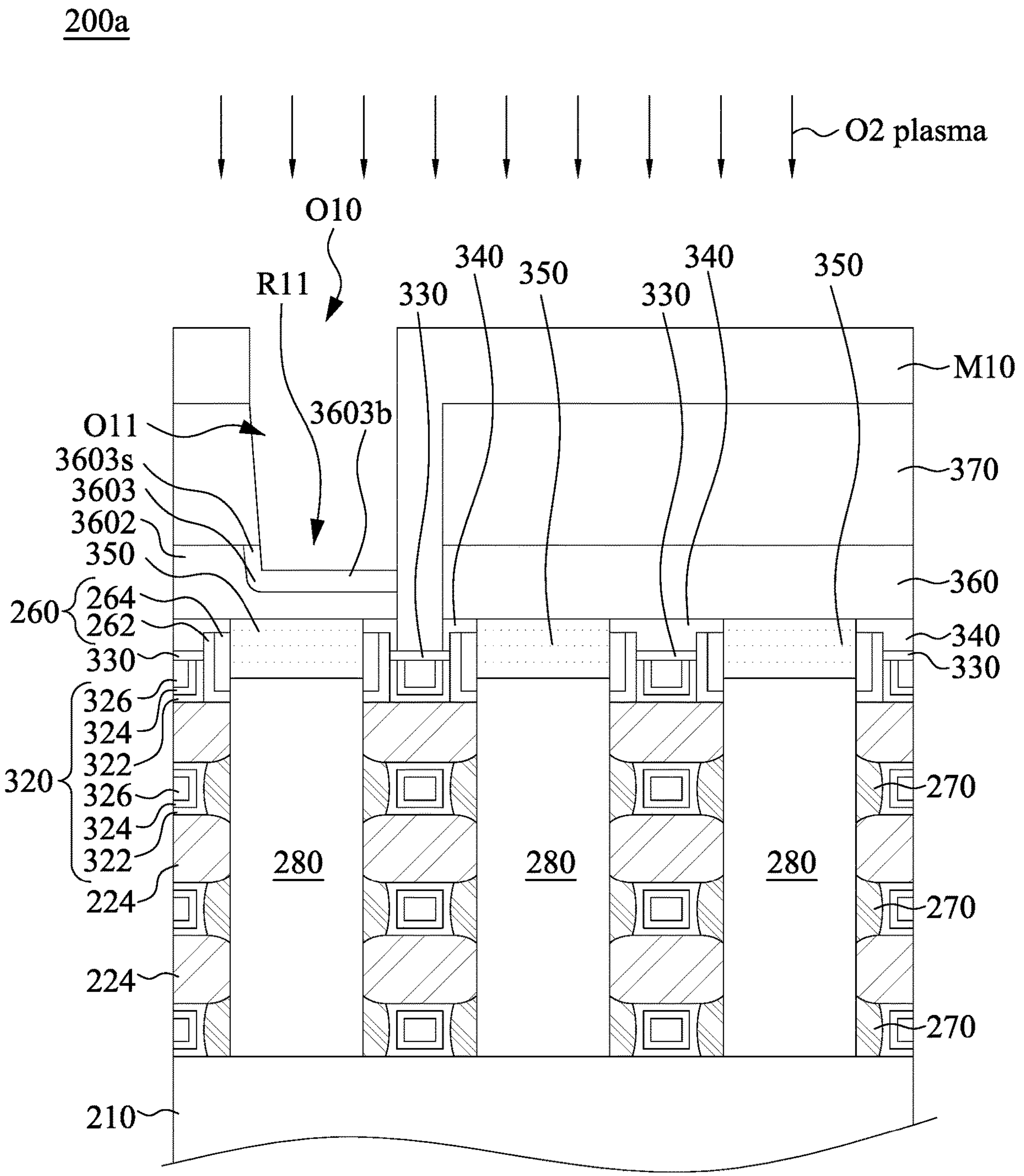

In FIG. 49, after the via etching process ET7 has been completed, the exposed portions of the MCESL layer 360 is treated in an oxygen-containing environment, so that surface layers of the exposed portions of the MCESL 360 are oxidized to form an oxidized region 3603 in the MCESL layer 360, while leaving a remaining region 3602 of the MCESL layer 360 un-oxidized. The treatment step may include an $O_2$ plasma treatment, wherein the oxygen-containing gas is conducted into a process chamber, in which the plasma is generated from the oxygen-containing gas. Process details about the $O_2$ plasma treatment are discussed previously with respect to FIG. 16A, and thus they are not repeated herein for the sake of brevity.

As a result of the $O_2$ plasma treatment, oxidation occurs in bottom surfaces and sidewalls of recesses R11 in the MCESL 360, thus resulting in the oxidized region 3603 having an oxidized bottom portion 3603*b* and an oxidized sidewall portion 3603*s* extending upwards from the oxidized bottom portion 3603*b*. As illustrated in the cross-sectional view of FIG. 49, the oxidized sidewall portion 3603*s* is on a first side (e.g., left side in the drawing) of the oxidized bottom portion 3603*b* but absent from a second side (e.g., right side in the drawing) of the oxidized bottom portion 3603*b*.

In some embodiments, the oxidized bottom portion 3603*b* and the oxidized sidewall portion 3603*s* have same thickness (e.g., in a range from about 1 nm to about 3 nm). In some other embodiments, the oxidized sidewall portion 3603*s* has a thicker thickness than the oxidized bottom portion 3603*b*. Thicker oxidized sidewall portion 3603*s* allows for higher etch resistance against the subsequent LRM etching. Thinner oxidized bottom portion 3603*b* allows for shortened LRM etching duration time. In some embodiments, the oxidized sidewall portion 3603*s* has a thickness gradient from bottom to top. For example, the oxidized sidewall portion 3603*s* may be thicker in the top and thinner in the bottom.

In some embodiments, the oxidized region 3603 may have an oxygen concentration gradient due to the plasma treatment. For example, the oxygen atomic percentage in the oxidized region 3603 may decrease as a distance from the recess R11's surface increases. In greater detail, the oxidized sidewall portion 3603*s* has an oxygen atomic percentage decreasing as a distance from a sidewall of the recess R11 increases, and the oxidized bottom portion 3603*b* has an oxygen atomic percentage decreasing as a distance from a bottom surface of the recess R11 increases. In some embodiments where the MCESL 360 is silicon nitride, the oxygen-to-nitrogen atomic ratio in the oxidized region may decrease as a distance from the recess R11's surface increases. In greater detail, the oxidized sidewall portion 3603*s* may have an oxygen-to-nitrogen atomic ratio decreasing as a distance from a sidewall of the recess R11 increases, and the oxidized bottom portion 3603*b* has an oxygen-to-nitrogen atomic ratio decreasing as a distance from a bottom surface of the recess R11 increases.

In some embodiments, the $O_2$ plasma treatment may cause plasma ash on the patterned mask layer M10, which in turn may trim the patterned mask layer M10. As a result, the $O_2$ plasma treatment conditions (e.g., treatment duration time, RF power, pressure, and so on) are controlled to result in formation of the oxidized region 3603 in the MCESL 360 as well as negligible loss in the patterned mask layer M10. The negligible loss means that a size variation of the opening O10 in the patterned mask layer M10 is less than about 10%.

Figure 50:
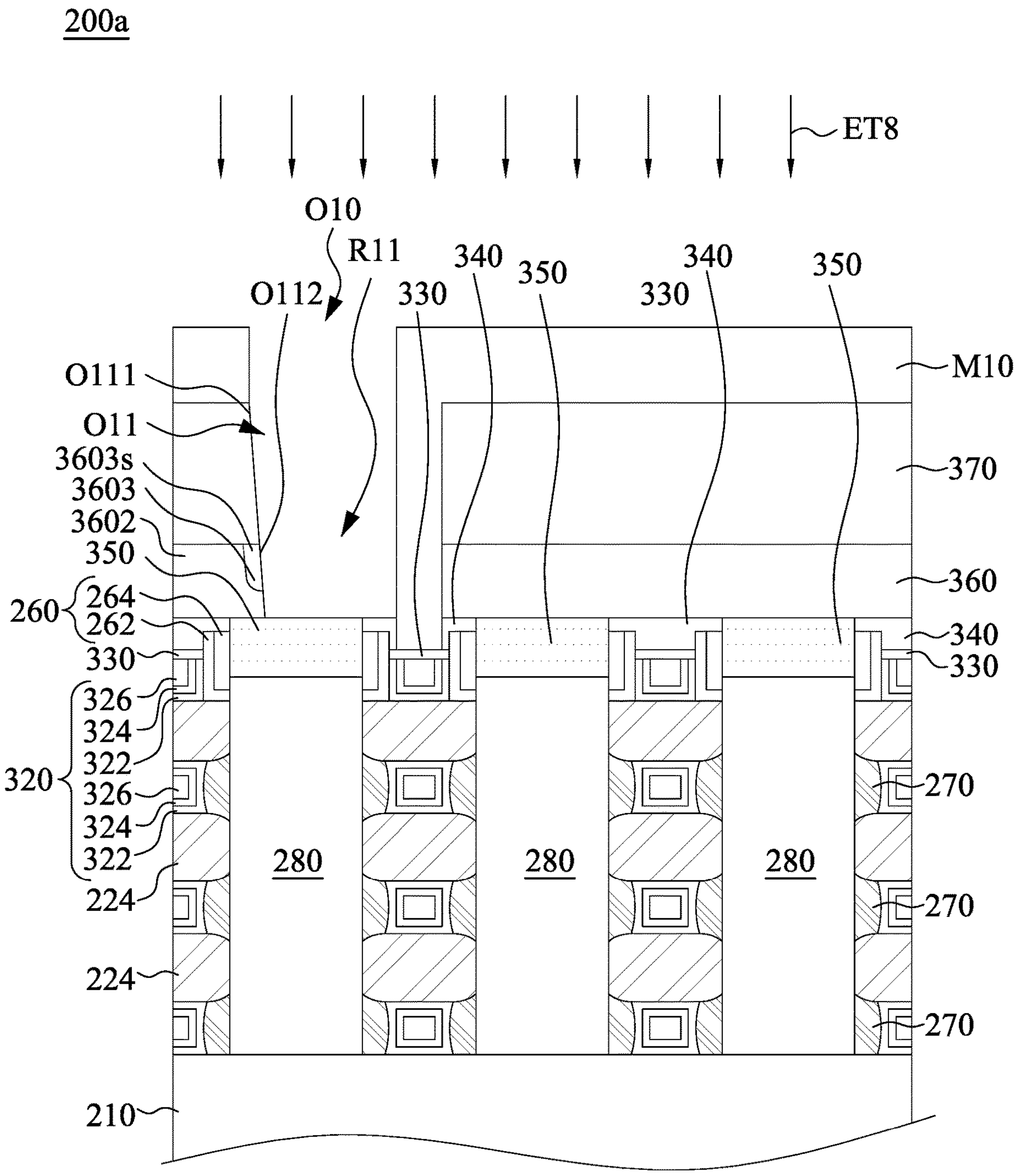

In FIG. 50, an LRM etching process ET8 is performed to break through the MCESL 360, thus deepening the via opening O11 down to the source/drain contact 350 and a portion of the dielectric cap 340 between source/drain contact 350 and the patterned mask layer M10. As a result of the LRM etching process ET8, the source/drain contact 350 and the dielectric cap 340 get exposed at bottoms of the deepened via openings O11. Process details about the LRM etching process ET8 are discussed previously with respect to the LRM etching process ET2, and thus they are not repeated herein for the sake of brevity.

Because the oxidized sidewall portion 3603*s* inhibits or slows down the lateral etching during the LRM etching process ET8, the sidewall of the via opening O11 extends linearly through an entire thickness of the ILD layer 370 and an entire thickness of the MCESL 360, and no or negligible bowing occurs. In greater detail, the ILD layer 370 has a linear sidewall O111 defining an upper part of a via opening O11 and the MCESL 360 also has a linear sidewall O112 defining a lower part of the via opening O11, and the linear sidewalls O111 and O112 are aligned with each other. In some embodiments, the linear sidewall O112 of the MCESL 360 has a sidewall of the oxidized sidewall portion 3603*s* extending downwards from the linear sidewall O111 of the ILD layer 370, and a sidewall of the un-oxidized region 3602 extending downwards from the sidewall of the oxidized sidewall portion 3603*s*. In some embodiments as depicted in FIG. 50, the sidewall of the un-oxidized region 3602 is aligned with the sidewall of the oxidized sidewall portion 3603*s*. However, in some other embodiments, the sidewall of the un-oxidized region 3602 may be slightly laterally set back from the sidewall of the oxidized sidewall portion 3603*s*, because the LRM etching ET8 may cause more lateral etching in the un-oxidized region 3602 than in oxidized sidewall portion 3603*s*. Even in this scenario the via opening O11 still has alleviated bowing defect compared with the case where no oxidized sidewall portion 3603*s* is formed, because the bowing profile is localized to the un-oxidized region 3602.

Figure 51:
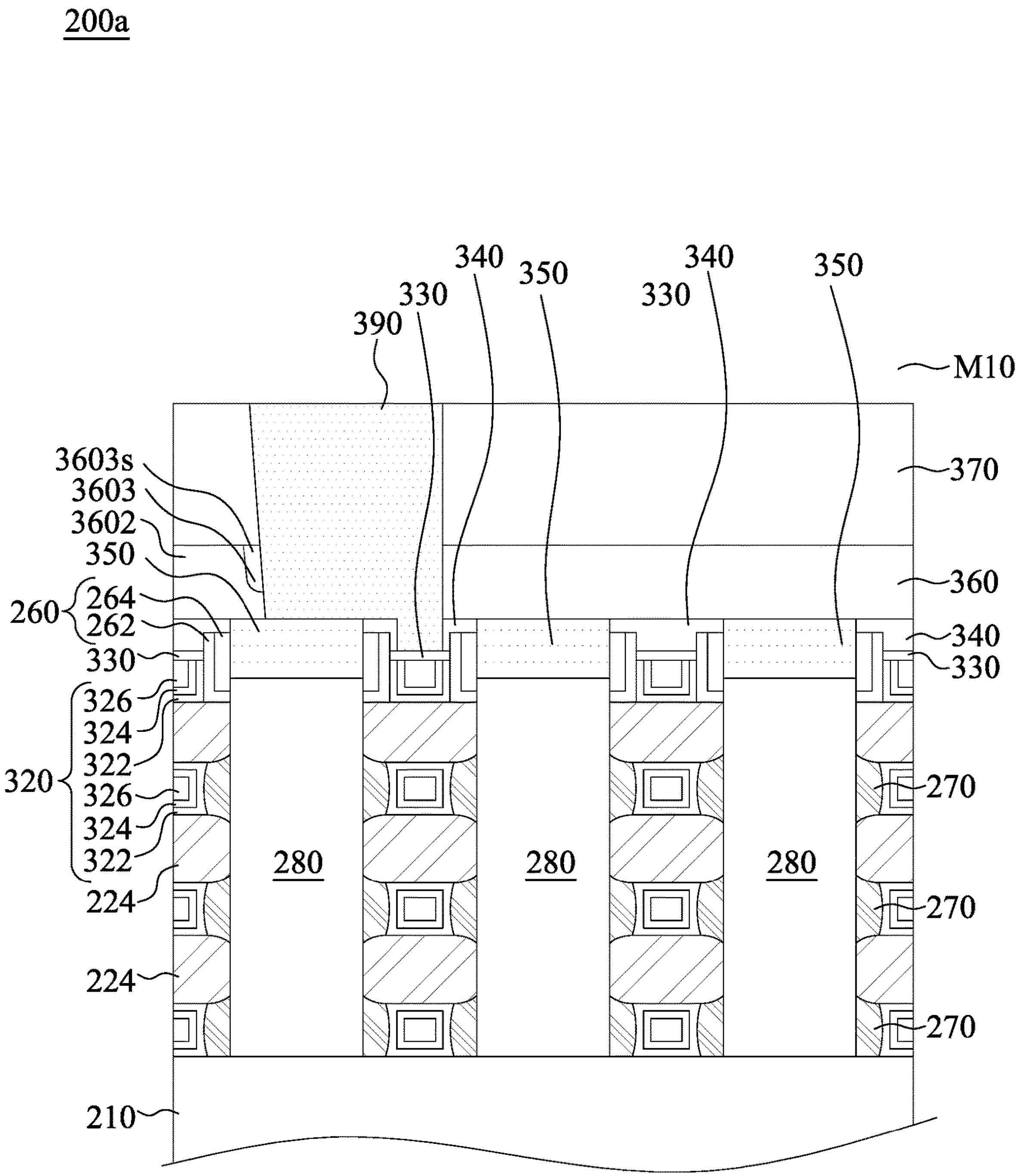

After the LRM etching process ET8 is completed, the patterned mask layer M10 is removed from the gate contact opening O9 by ashing and/or wet stripping, and then a butted contact 390 is formed to fill both the via opening O11 and the gate contact opening O9. The resulting structure is illustrated in FIG. 51. The gate structure 320 is electrically coupled to the source/drain epitaxy structure 280 through the source/drain contact 350, the butted contact 390, and the metal cap 330. Materials and fabrication process details about the butted contact 390 are similar to that about the source/drain vias 150, and thus they are not repeated herein for the sake of brevity.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the bowing profile of the via opening in the MCESL can be alleviated because of the additional oxygen plasma treatment. Another advantage is that the risk of leakage current (e.g., leakage current from source/drain via to gate contact and/or gate structure) can be reduced. Yet another advantage is that the resistance capacitance (RC) delay can be improved, because a distance from a bowing-free source/drain via to a gate contact is larger than a bowing source/drain via to a gate contact.

In some embodiments, a method comprises forming a source/drain contact over a source/drain region; forming an etch stop layer over the source/drain contact and an interlayer dielectric (ILD) layer over the etch stop layer; performing a first etching process to form a via opening extending through the ILD layer and a recess in the etch stop layer; oxidizing a sidewall of the recess in the etch stop layer; after oxidizing the sidewall of the recess in the etch stop layer, performing a second etching process to extend the via opening down to the source/drain contact; and after performing the second etching process, forming a source/drain via in the via opening. In some embodiments, the sidewall of the recess in the etch stop layer is oxidized using an oxygen plasma. In some embodiments, the oxygen plasma is generated from an $O_2$ gas. In some embodiments, the oxygen plasma is generated from a gaseous mixture of an $O_2$ gas and one or more of an Ar gas, a He gas, a Ne gas, a Kr gas, a $N_2$ gas, a CO gas, a $CO_2$ gas, a $C_xH_yF_z$ gas, an $NF_3$ gas, a Carbonyl sulfide (COS) gas, and an $SO_2$ gas, wherein x, y and z are greater than zero. In some embodiments, the second etching process uses a different etchant than that used in the first etching process. In some embodiments, the first etching process is a plasma etching process using a plasma generated from a hydrogen-free gaseous mixture. In some embodiments, the second etching process is a plasma etching process using a plasma generated from a hydrogen-containing gaseous mixture. In some embodiments, the hydrogen-containing gaseous mixture is a mixture of a fluorine-containing gas and a hydrogen gas. In some embodiments, the fluorine-containing gas is a $CHF_3$ gas, a $CF_4$ gas, or a combination thereof. In some embodiments, the second etching process results in less lateral etching on the oxidized sidewall of the etch stop layer than on an un-oxidized portion of the etch stop layer.

In some embodiments, a method comprises forming a source/drain contact over an epitaxy structure; depositing in sequence an etch stop layer and an interlayer dielectric (ILD) layer over the source/drain contact; performing a first etching process on the ILD layer until the etch stop layer has a recess; after performing the first etching process, treating the etch stop layer such that the etch stop layer has a treated region cupping an underside of the recess and an un-treated region below the treated region; after treating the etch stop layer, performing a second etching process to break through the etch stop layer, wherein the second etching process etches the treated region of the etch stop layer at a slower etch rate than etching the un-treated region; and after performing the second etching process, forming a source/drain via extending through the etch stop layer. In some embodiments, the etch stop layer is treated using an oxygen plasma. In some embodiments, the treated region has a higher oxygen atomic percentage than the un-treated region. In some embodiments, the treated region has an oxygen concentration gradient. In some embodiments, the treated region has an oxygen atomic percentage decreasing as a distance from a surface of the recess increases. In some embodiments, the second etching process uses a gas mixture with a hydrogen gas, and the first etching process is free of the hydrogen gas.

In some embodiments, a device comprises a source/drain contact over a source/drain region of a transistor; an etch stop layer above the source/drain contact; an interlayer dielectric (ILD) layer above the etch stop layer; and a source/drain via extending through the ILD layer and the etch stop layer to the source/drain contact, wherein the etch stop layer has an oxidized region in contact with the source/drain via and separated from the source/drain contact. In some embodiments, the un-oxidized region of the etch stop layer is in contact with the source/drain contact. In some embodiments, the source/drain via forms a first interface with the oxidized region and a second interface with the un-oxidized region, and the second interface is aligned with the first interface. In some embodiments, the source/drain via forms a first interface with the oxidized region and a second interface with the un-oxidized region, and the second interface is laterally set back from the first interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a source/drain contact over a source/drain region of a transistor;

an etch stop layer over the source/drain contact;

an interlayer dielectric (ILD) layer over the etch stop layer;

a source/drain via extending through the ILD layer and the etch stop layer to the source/drain contact, wherein the etch stop layer has an oxidized region in contact with the source/drain via and an un-oxidized region separating the oxidized region from the source/drain contact; and a gate structure over a channel region of the transistor, wherein the oxidized region non-overlaps the gate structure.

2. The device of claim 1, wherein the un-oxidized region of the etch stop layer is in contact with the source/drain contact.

3. The device of claim 1, wherein the source/drain via forms a first interface with the oxidized region and a second interface with the un-oxidized region, and the second interface is aligned with the first interface.

4. The device of claim 1, wherein the source/drain via has a linear sidewall in contact with the oxidized region and the un-oxidized region of the etch stop layer.

5. The device of claim 4, wherein the linear sidewall of the source/drain via has a top segment above the oxidized region and the un-oxidized region of the etch stop layer.

6. The device of claim 1, further comprising:

a fluorine-free tungsten structure atop the gate structure.

7. A device, comprising:

a gate structure over a substrate;

source/drain regions at opposite sides of the gate structure;

source/drain contacts over the source/drain regions, respectively;

a gate dielectric cap over the gate structure and having opposite sidewalls interfacing the source/drain contacts;

an etch stop layer over the source/drain contacts and the gate dielectric cap; and a source/drain via extending through the etch stop layer to one of the source/drain contacts, wherein the etch stop layer has an oxidized region interfacing opposite sidewalls of the source/drain via, wherein the oxidized region non-overlaps the gate structure.

8. The device of claim 7, wherein an interface formed by the oxidized region of the etch stop layer and the source/drain via is slant.

9. The device of claim 7, wherein an interface formed by the oxidized region of the etch stop layer and the source/drain via is vertical.

10. The device of claim 7, wherein the oxidized region of the etch stop layer is separated from the gate dielectric cap.

11. The device of claim 7, further comprising:

a metal cap between the gate dielectric cap and the gate structure.

12. The device of claim 11, wherein the metal cap is fluorine-free tungsten.

13. The device of claim 7, wherein the etch stop layer includes silicon nitride.

14. The device of claim 7, wherein the gate dielectric cap includes silicon nitride.

15. The device of claim 7, wherein the device is a fin field-effect transistor (FinFET) or a gate-all-around (GAA) transistor.

16. The device of claim 7, further comprising:

a fluorine-free tungsten structure atop the gate structure.

17. A device, comprising:

a source region and a drain region over a substrate;

a channel region between the source region and the drain region;

a source contact over the source region;

a gate structure over the channel region;

a dielectric cap over the gate structure;

a nitride-based etch stop layer over the dielectric cap, the nitride-based etch stop layer having a first oxidized region over the source contact; and a first via extending through the first oxidized region of the nitride-based etch stop layer to the source contact, wherein the first oxidized region non-overlaps the gate structure.

18. The device of claim 17, further comprising:

a drain contact over the drain region, the nitride-based etch stop layer having a second oxide region over the drain contact; and a second via extending through the second oxide region of the nitride-based etch stop layer to the drain contact.

19. The device of claim 18, wherein the second oxide region is spaced apart from the first oxidized region.

20. The device of claim 17, wherein the first oxidized region is spaced apart from the source contact.

* * * * *